United States Patent
Federici et al.

(10) Patent No.: US 10,116,000 B1
(45) Date of Patent: Oct. 30, 2018

(54) FABRICATION OF FLEXIBLE CONDUCTIVE ITEMS AND BATTERIES USING MODIFIED INKS

(71) Applicant: New Jersey Institute of Technology, Newark, NJ (US)

(72) Inventors: John Francis Federici, Westfield, NJ (US); Yuan Gu, Kearny, NJ (US); Aide Wu, Kearny, NJ (US)

(73) Assignee: New Jersey Institute of Technology, Newark, NJ (US)

( * ) Notice: Subject to any disclaimer, the term of this patent is extended or adjusted under 35 U.S.C. 154(b) by 0 days.

(21) Appl. No.: 15/299,148

(22) Filed: Oct. 20, 2016

Related U.S. Application Data

(60) Provisional application No. 62/285,147, filed on Oct. 20, 2015, provisional application No. 62/339,235, filed on May 20, 2016.

(51) Int. Cl.
  *H01M 4/505* (2010.01)
  *H01M 10/0525* (2010.01)
  (Continued)

(52) U.S. Cl.
  CPC ..... *H01M 10/0525* (2013.01); *H01M 2/0275* (2013.01); *H01M 4/485* (2013.01);
  (Continued)

(58) Field of Classification Search
  USPC ......................................... 427/115, 123, 126
  See application file for complete search history.

(56) References Cited

U.S. PATENT DOCUMENTS 6,416,679 B1  7/2002  Silverbrook
8,722,418 B1  5/2014  Zunino, III et al.
(Continued)

OTHER PUBLICATIONS

Akamastsu et al., "Controlling interparticle spacing among metal nanoparticles through metal-catalyzed decomposition of surrounding polymer matrix", Journal of the American Chemical Society, Jun. 2005, vol. 127(22), Pgjs. 7980-1.
(Continued)

*Primary Examiner* — Brian K Talbot
(74) *Attorney, Agent, or Firm* — Lerner, David, Littenberg, Krumholz & Mentlik, LLP

(57) ABSTRACT

A chemical process to formulate conductive ink with low sintering temperature for inkjet printing is described and shown. The application of fabricated flexible conductive film on lithium ion batteries is also described. This chemical method and composition can remove the oxidation on metallic nanoparticle surface during ink fabrication and sintering processes. Etched metallic ions in the conductive ink are reduced and particles bridged while annealing printed patterns to achieve low temperature sintering at about 350° C. The chemical process can be applied on nickel materials that are excellent current collectors for lithium ion batteries due to high chemical stability especially at high charging-discharging potential of less than 3 Volts. Thermal decomposition and chemical reduction of silver salts are two methods disclosed for particle-free silver ink. Surfactant additive further make silver film more uniform and easier to be sintered.

12 Claims, 45 Drawing Sheets
(45 of 45 Drawing Sheet(s) Filed in Color)

(51) Int. Cl.

| | |
|---|---|
| *H01M 10/0585* | (2010.01) |
| *H01M 2/02* | (2006.01) |
| *H01M 10/0569* | (2010.01) |
| *H01M 10/0568* | (2010.01) |
| *H01M 4/525* | (2010.01) |
| *H01M 4/485* | (2010.01) |

(52) U.S. Cl.
CPC .......... *H01M 4/505* (2013.01); *H01M 4/525* (2013.01); *H01M 10/0568* (2013.01); *H01M 10/0569* (2013.01); *H01M 10/0585* (2013.01); *H01M 2300/0037* (2013.01)

(56) References Cited

U.S. PATENT DOCUMENTS

| | | | | |
|---|---|---|---|---|
| 8,968,824 | B2* | 3/2015 | Mastropietro | ........... B05D 5/12 |
| | | | | 427/123 |
| 9,150,736 | B2* | 10/2015 | Daughenbaugh | ...... C25D 13/16 |
| 2012/0070725 | A1* | 3/2012 | Venkatachalam | ... H01M 4/1397 |
| | | | | 429/188 |
| 2015/0325856 | A1 | 11/2015 | Federici et al. | |
| 2016/0061741 | A1 | 3/2016 | Wu et al. | |

OTHER PUBLICATIONS

Akamastsu et al., "Site-selective direct silver metallization on surface-modified polyimide layers", Langmuir, Oct. 2003, vol. 19(24), pp. 10366-10371.

Akamastsu et al.,"Direct patterning of copper on polyimide using ion exchangeable surface templates generated by site-selective surface modification", Journal of the American chemical society, Sep. 2004, vol. 126(35), pp. 10822-10823.

Akamastsu et al.,"Fabrication and structural characterization of nanocomposites consisting of Ni nanoparticles dispersed in polyimide films", The European Physical Journal D-Atomic, Molecular, Optical and Plasma Physics, Jun. 2003, vol. 24(1), pp. 377-380.

Beecher et al., "Ink-jet printing of carbon nanotube thin film transistors", Journal of Applied Physics, Aug. 2007, vol. 102, Issue 4, id. 043710-043710-7.

Blake et al., "Graphene-based liquid crystal device", Nano letters, Apr. 2008, vol. 8, No. 6, pp. 1704-1708.

Brückner et al., "Oxidation behaviour of Cu-Ni (Mn)(constantan) films", Thin Solid Films, Mar. 1995, vol. 258, Issues 1-2, Pgjs. 252-9.

Calvert, "Inkjet printing for materials and devices", Chemistry of materials, Oct. 2001, vol. 13(10), pp. 3299-3305.

Chen et al., "Silver conductive features on flexible substrates from a thermally accelerated chain reaction at low sintering temperatures", ACS applied materials & interfaces, Dec. 2012, vol. 4(12), pp. 7064-7068.

Chew et al., "Flexible free-standing carbon nanotube films for model lithium-ion batteries", Carbon, Nov. 2009, vol. 47, Issue 13, pp. 2976-2983.

Crone et al., "Design and fabrication of organic complementary circuits", Journal of Applied Physics, May 2001, vol. 89, Issue 9, pp. 5125-5132.

Daniel et al.., "Gold nanoparticles: assembly, supramolecular chemistry, quantum-size-related properties, and applications toward biology, catalysis, and nanotechnology", Chemical reviews, Jan. 2004, vol. 104, Issue 1, pp. 293-346.

Dearden et al., "A Low Curing Temperature Silver Ink for Use in Ink?Jet Printing and Subsequent Production of Conductive Tracks", Macromolecular Rapid Communications, Feb. 2005, vol. 26(4), pp. 315-318.

Dong et al., "Facile synthesis of high silver content MOD ink by using silver oxalate precursor for inkjet printing applications", Thin Solid Films, Aug. 2015,vol. 589, pp. 381-387.

Ederth et al., "Electrical and optical properties of thin films consisting of tin-doped indium oxide nanoparticles", Physical Review B, Oct. 2003, vol. 68, Issue 15, id. 155410.

Fan et al., "Fabrication and characterization of multi-walled carbon nanotubes-based ink", Journal of materials science, Sep. 2005, vol. 40, Issue 18, pp. 5075-5077.

Fjelstad, "Flexible circuit materials", Circuit World, Nov. 2008, vol. 34 Issue: 4, pp. 19-24.

Fuller et al., "Ink-jet printed nanoparticle microelectromechanical systems", Journal of Microelectromechanical systems, Feb. 2002, vol. 11, No. 1, pp. 54-60.

Grande et al., "Graphene for energy harvesting/storage devices and printed electronics", Particuology, Feb. 2012, vol. 10, Issue 1, pp. 1-8.

Greer et al., "Thermal cure effects on electrical performance of nanoparticle silver inks", Acta Materialia, Oct. 2007, vol. 55(18), pp. 6345-6349.

Grouchko et al., "Formation of air-stable copper-silver core-shell nanoparticles for inkjet printing", Journal of Materials Chemistry, Feb. 2009, vol. 19(19), pp. 3057-3062.

Hermann et al., "Nanoparticle films as sensitive strain gauges", Applied Physics Letters, Oct. 2007, vol. 91, Issue 18, id. 183105.

Heusing et al., "Wet chemical deposited ITO coatings on flexible substrates for organic photodiodes", Thin Solid Films, Dec. 2009, vol. 518, Issue 4, pp. 1164-1169.

Hu et al., "Thin, flexible secondary Li-ion paper batteries", ACS nano, Oct. 2010, vol. 4, No. 10, pp. 5843-5848.

Jahn et al., "Inkjet printing of conductive silver patterns by using the first aqueous particle-free MOD ink without additional stabilizing ligands", Chemistry of materials, Apr. 2010, vol. 22(10), pp. 3067-3071.

Jang et al., "Sintering of inkjet printed copper nanoparticles for flexible electronics", Scripta Materialia, Mar. 2010, vol. 62, Issue 5, pp. 258-261.

Kaempgen et al., "Printable thin film supercapacitors using single-walled carbon nanotubes", Nano letters, Apr. 6, 2009, vol. 9, No. 5, pp. 1872-1876.

Kim et al.,"Use of copper ink for fabricating conductive electrodes and RFID antenna tags by screen printing", Current Applied Physics. Mar. 2012, vol. 12(2), pp. 473-478.

Kim et al., "Organic thin film transistor using silver electrodes by the ink-jet printing technology", Thin Solid Films. Jul. 2007, vol. 515(19), pp. 7692-7696.

Krebs, All solution roll-to-roll processed polymer solar cells free from indium-tin-oxide and vacuum coating steps, Organic Electronics, Aug. 2009, vol. 10, Issue 5, pp. 761-768.

Krebs, "Polymer solar cell modules prepared using roll-to-roll methods: knife-over-edge coating, slot-die coating and screen printing", Solar Energy Materials and Solar Cells, Apr. 2009, vol. 93, Issue 4, pp. 465-475.

Krebs, "Roll-to-roll fabrication of monolithic large-area polymer solar cells free from indium-tin-oxide", Solar Energy Materials and Solar Cells, Sep. 2009, vol. 93, Issue 9, pp. 1636-1641.

Lee et al., "A low-cure-temperature copper nano ink for highly conductive printed electrodes", Current Applied Physics. Mar. 2009, vol. 9(2), pp. e157-e160.

Lee et al., "Inkjet printing of nanosized silver colloids", Nanotechnology, Sep. 2005, vol. 16(10), p. 2436.

Lee et al., "Nearly carbon-free printable CIGS thin films for solar cell applications", Solar Energy Materials and Solar Cells. Oct. 2011, vol. 95, Issue 10, pp. 2928-2932.

Lemme et al., "A graphene field-effect device", IEEE Electron Device Letters. Mar. 2007, vol. 28, Issue 4, pp. 282-284.

Leung et al., "Geometric and Compaction Dependence of Printed Polymer-Based RFID Tag Antenna Performance", IEEE Transactions on Electronics Packaging Manufacturing, Apr. 2008, vol. 31, No. 2, pp. 120-125.

Li et al., "Conductive copper and nickel lines via reactive inkjet printing", Journal of Materials Chemistry, 2009, published Jan. 2010, vol. 19, pp. 3719-3724.

(56) References Cited

OTHER PUBLICATIONS

Li et al., "Facile Synthesis of Silver Nanoparticles Useful for Fabrication of High-Conductivity Elements for Printed Electronics", Journal of the American Chemical Society, Mar. 2005, vol. 127(10), pp. 3266-3267.

Li et al., "Preparation of surface bound silver nanoparticles on polyimide by surface modification method and its application on electroless metal deposition", Applied Surface Science, Jun. 2004, vol. 233, Issues 1-4, pp. 299-306.

Magdassi et al., "Silver Nanoparticles as Pigments for Water-Based Ink-Jet Inks", Chemistry of Materials, Apr. 2003, vol. 15, pp. 2208-2217.

Mei et al., "A hole-conductor-free, fully printable mesoscopic perovskite solar cell with high stability", Science, Jul. 2014, vol. 345, Issue. 6194, pp. 295-298.

Ng et al., "A direct?writing approach to the micro?patterning of copper onto polyimide", Circuit World, May 2009, vol. 35, Issue 2, pp. 3-17.

Nie et al., "Inkjet printing of silver citrate conductive ink on PET substrate", Applied Surface Science, Nov. 2012, vol. 261, pp. 554-560.

Norita et al., "Inkjet-printed copper electrodes using photonic sintering and their application to organic thin-film transistors", Organic Electronics, Oct. 2015, vol. 25, pp. 131-134.

Patterson, "The Scherrer Formula for X-Ray Particle Size Determination", Physical Review, Nov. 1939, vol. 56, pp. 978-982.

Perelaer et al., "Ink jet Printing and Microwave Sintering of Conductive Silver Tracks", Advanced Materials, Aug. 2006, vol. 18, Issue 16, pp. 2101-2104.

Pikul et al., "High-power lithium ion microbatteries from interdigitated three-dimensional bicontinuous nanoporous electrodes", Nat Commun, Jan. 2013, vol. 4, id. 1732.

Pudas et al., "Gravure offset printing of polymer inks for conductors", Progress in Organic Coatings, May 2004, vol. 19, Issue 4, pp. 324-335.

Redinger et al., "An ink-jet-deposited passive component process for RFID", IEEE Transactions on Electron Devices, Dec. 2004, vol. 51, No. 12, pp. 1978-1983.

Sangoi et al., "Printing Radio Frequency Identification (RFID) Tag Antennas Using Inks Containing Silver Dispersions", Journal of Dispersion Science and Technology, Feb. 2004, vol. 25, No. 4, pp. 513-521.

Schmidt et al., "Efficient semitransparent inverted organic solar cells with indium tin oxide top electrode", Applied Physics Letters, Jun. 2009, vol. 94, Issue 24, id. 243302.

Shipway et al., "Nanoparticle Arrays on Surfaces for Electronic", Optical, and Sensor Applications, ChemPhysChem, Aug. 2000, vol. 1, Issue 1, pp. 18-52.

Subramanian et al., "Progress toward development of all-printed RFID tags: Materials, processes, and devices", Proceedings of the IEEE, Jul. 2005, vol. 93, No. 7, pp. 1330-1338.

Sun et al., "3D Printing of Interdigitated Li?Ion Microbattery Architectures", Advanced Materials, Jun. 2013, vol. 25, pp. 4539-4543.

Szczech et al., "Fine-line conductor manufacturing using drop-on demand PZT printing technology", IEEE Transactions on Electronics Packaging Manufacturing, Jan. 2002, vol. 25, No. 1, pp. 26-33.

Taillades et al., "Silver: high performance anode for thin film lithium ion batteries", Journal of Power Sources, Jan. 2004, vol. 125, Issue 2, pp. 199-205.

Tan et al., "Measurement of Scattering Rate and Minimum Conductivity in Graphene", Physical Review Letters, Dec. 2007, vol. 99, Issue 24, id. 246803.

Tang et al., "A simple way of preparing high-concentration and high-purity nano copper colloid for conductive ink in inkjet printing technology", Colloids and Surfaces A: Physicochemical and Engineering Aspects, May 2010, vol. 360, Issues 1-3, pp. 99-104.

Vaillancourt et al., "All ink-jet-printed carbon nanotube thin-film transistor on a polyimide substrate with an ultrahigh operating frequency of over 5 GHz", Applied Physics Letters, Dec. 2008, vol. 93, Issue 24, id. 243301.

Van Osch et al., "Inkjet printing of narrow conductive tracks on untreated polymeric substrates", Advanced Materials, Jan. 2008, vol. 20, Issue 2, pp. 343-345.

Volkman et al., "Ink jetted silver/copper conductors for printed RFID applications", MRS Proceedings, Cambridge Univ Press, 2004, pp. I7. 8.

Wang et al., "Preparation of nanometer nickel powder from spent electroless nickel plating baths by using thiourea dioxide as a green reductant", Journal of Cleaner Production, Dec. 2014, vol. 84, pp. 701-706.

Wee et al., "Printable photo-supercapacitor using single-walled carbon nanotubes", Energy & Environmental Science, 2011, Accepted Oct. 2010, vol. 4, pp. 413-416.

Wu et al., "A simple and efficient approach to a printable silver conductor for printed electronics", Journal of the American Chemical Society, Jan. 2007, vol. 129(7), pp. 1862-1863.

Wu et al., "Conductive silver patterns via ethylene glycol vapor reduction of ink-jet printed silver nitrate tracks on a polyimide substrate", Thin Solid Films, Aug. 2009, vol. 517, Issue 20, pp. 5913-5917.

Wu et al., "Inkjet Printing of Low-Temperature Cured Silver Patterns by Using AgNO3/1-Dimethylamino-2-propanol Inks on Polymer Substrates", The Journal of Physical Chemistry C, May 2011, vol. 115(22), pp. 10940-10945.

Wu et al., "Printed silver ohmic contacts for high-mobility organic thin-film transistors", Journal of the American Chemical Society, Mar. 2006, vol. 128(13), pp. 4202-4203.

Wu et al., "Reduction-assisted sintering of micron-sized copper powders at low temperature by ethanol vapor", RSC Advances, Jun. 2015, vol. 5, pp. 53275-53279.

Wu et al., "Reversible chromatic sensor fabricated by inkjet printing TCDA-ZnO on a paper substrate", Sensors and Actuators B: Chemical, Mar. 2014, vol. 193, pp. 10-18.

Wunscher et a.., "Towards single-pass plasma sintering: temperature influence of atmospheric pressure plasma sintering of silver nanoparticle ink", Journal of Materials Chemistry C, 2014, Accepted Dec. 18, 2013, vol. 2, pp. 1642-1649.

Xiao et al., "Conductive ink for through hole application", IEEE Transactions on Components and Packaging Technologies, Sep. 2001, Vo. 24, No. 3, pp. 445-449.

Ku et al., "Screen-Printable Thin Film Supercapacitor Device Utilizing Graphene/Polyaniline Inks", Advanced Energy Materials, Aug. 2013, vol. 3, No. 8, pp. 1035-1040.

Zhang et al., "Design optimized membrane-based flexible paper accelerometer with silver nano ink", Applied Physics Letters, 103 (2013) 073304.

* cited by examiner

FIG. 7A-7D-Prior Art
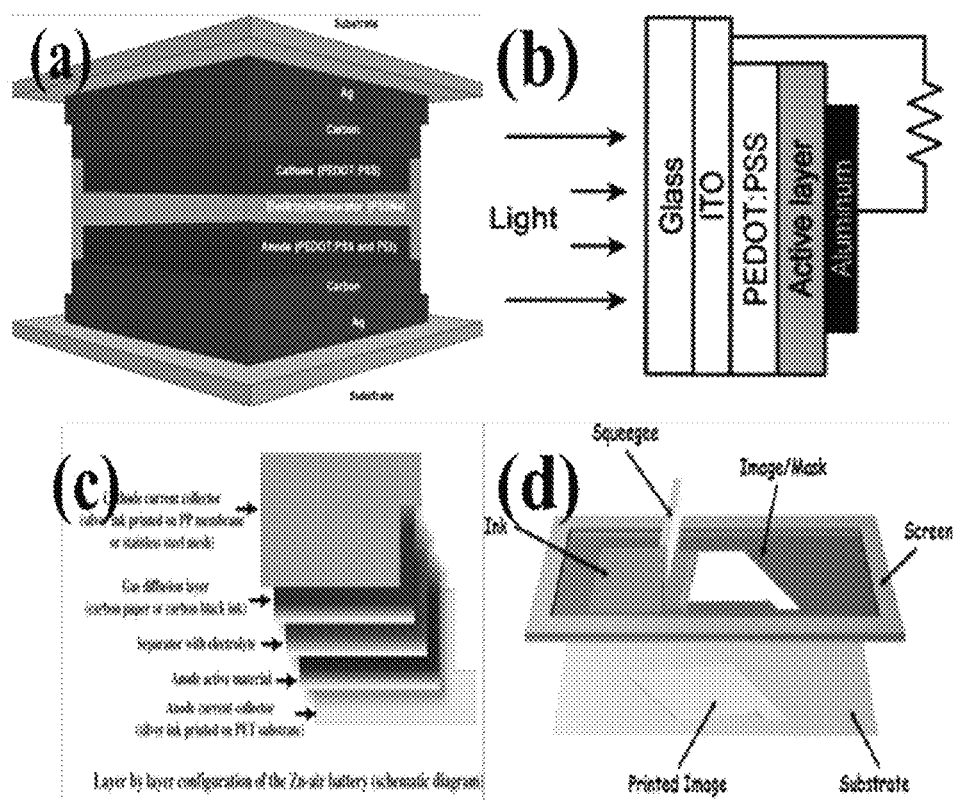
FIG. 8
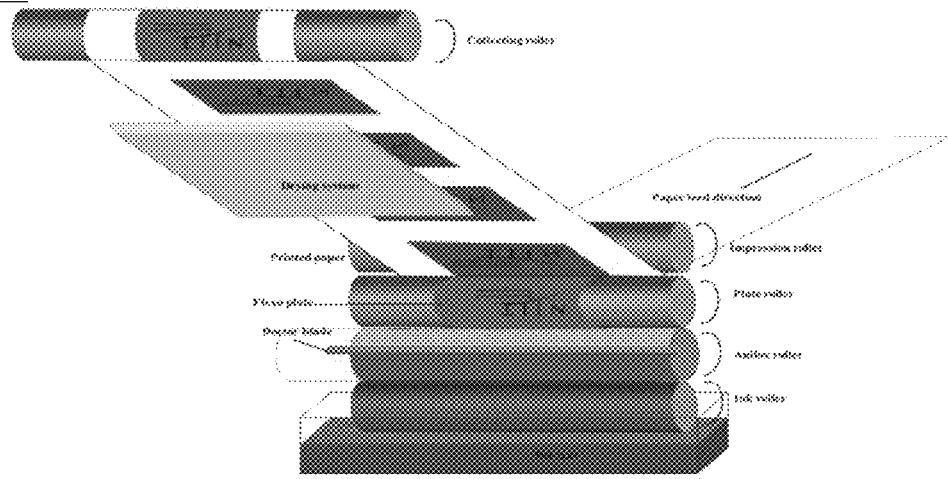

FIG. 10A-10C-Prior Art

FIG. 11
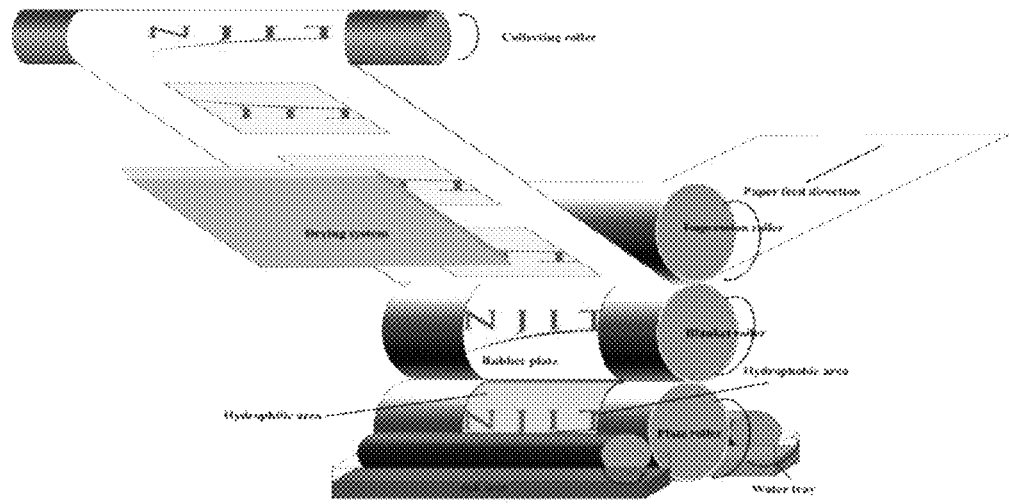
FIG. 12A-12B
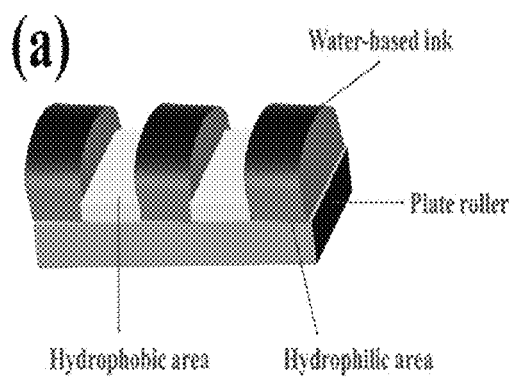
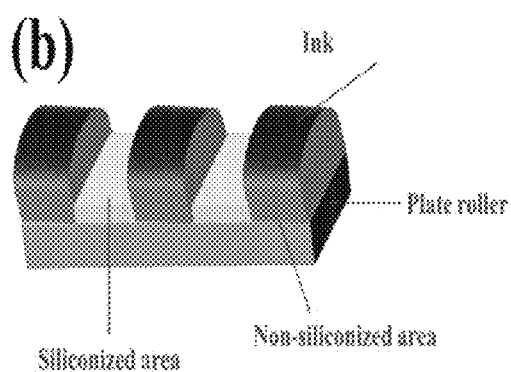

FIG. 13-13D-Prior Art
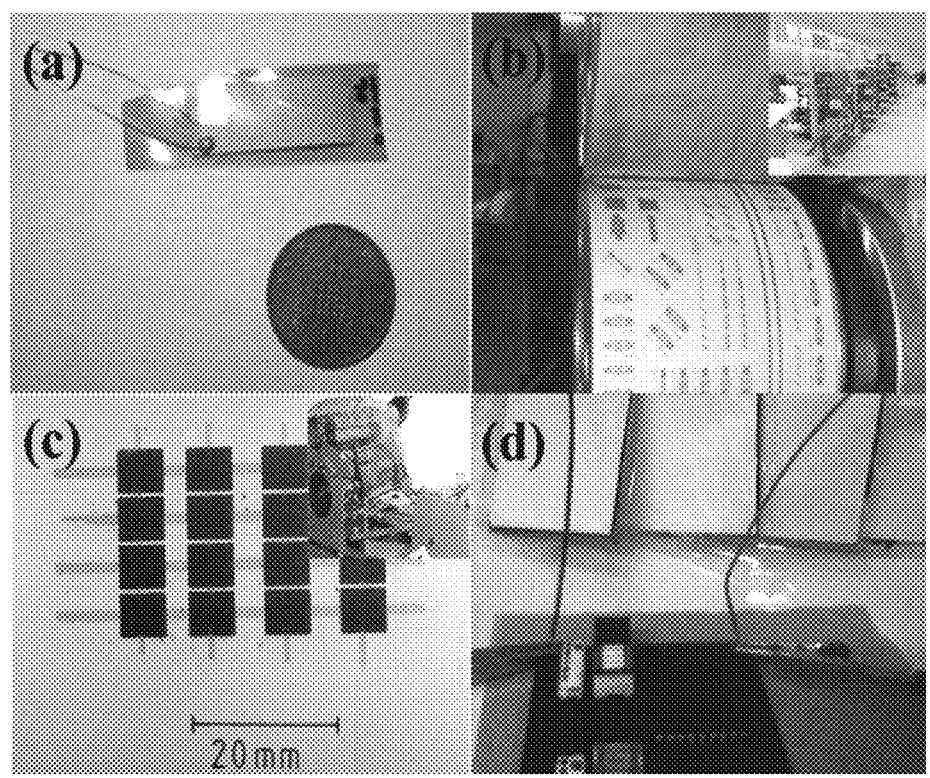

FIG. 14A-14B-Prior Art
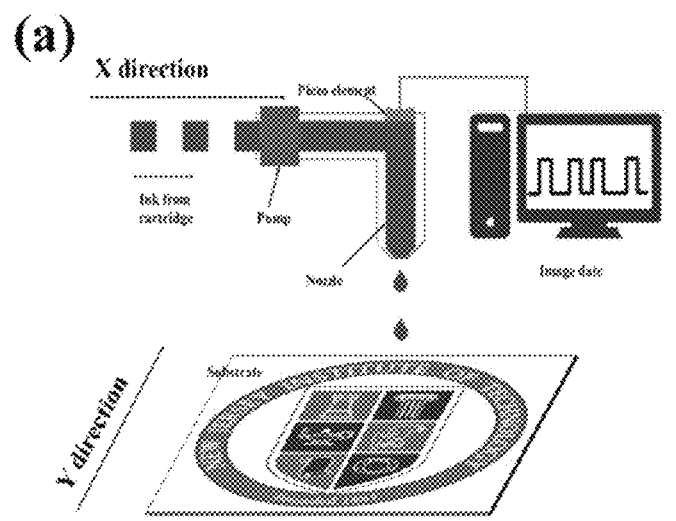
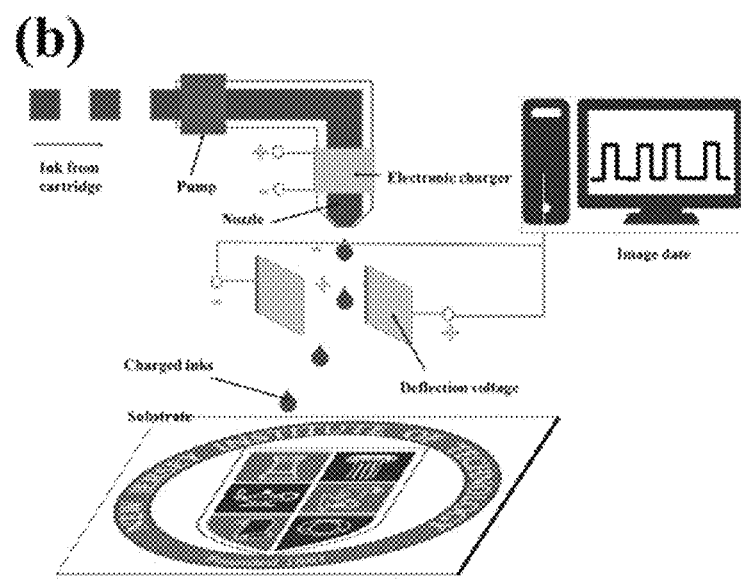

FIG. 15A-15D-Prior Art
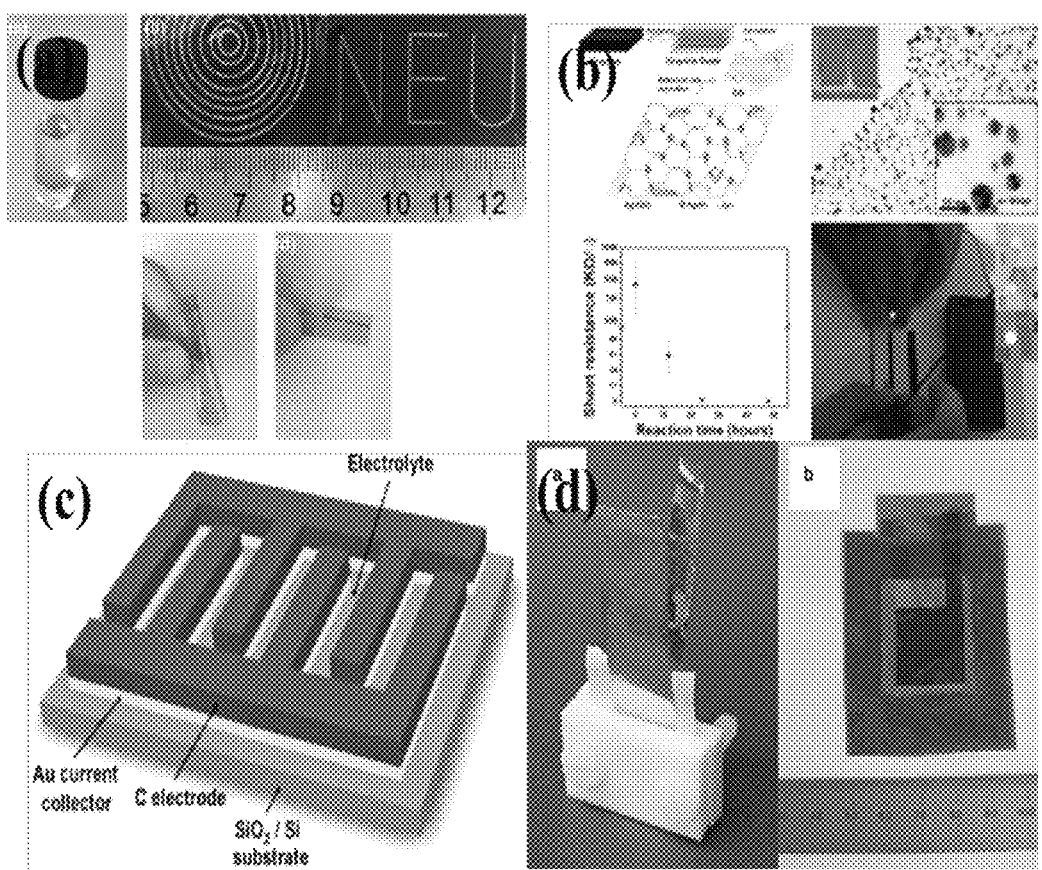

FIG. 28A-28B-Prior Art
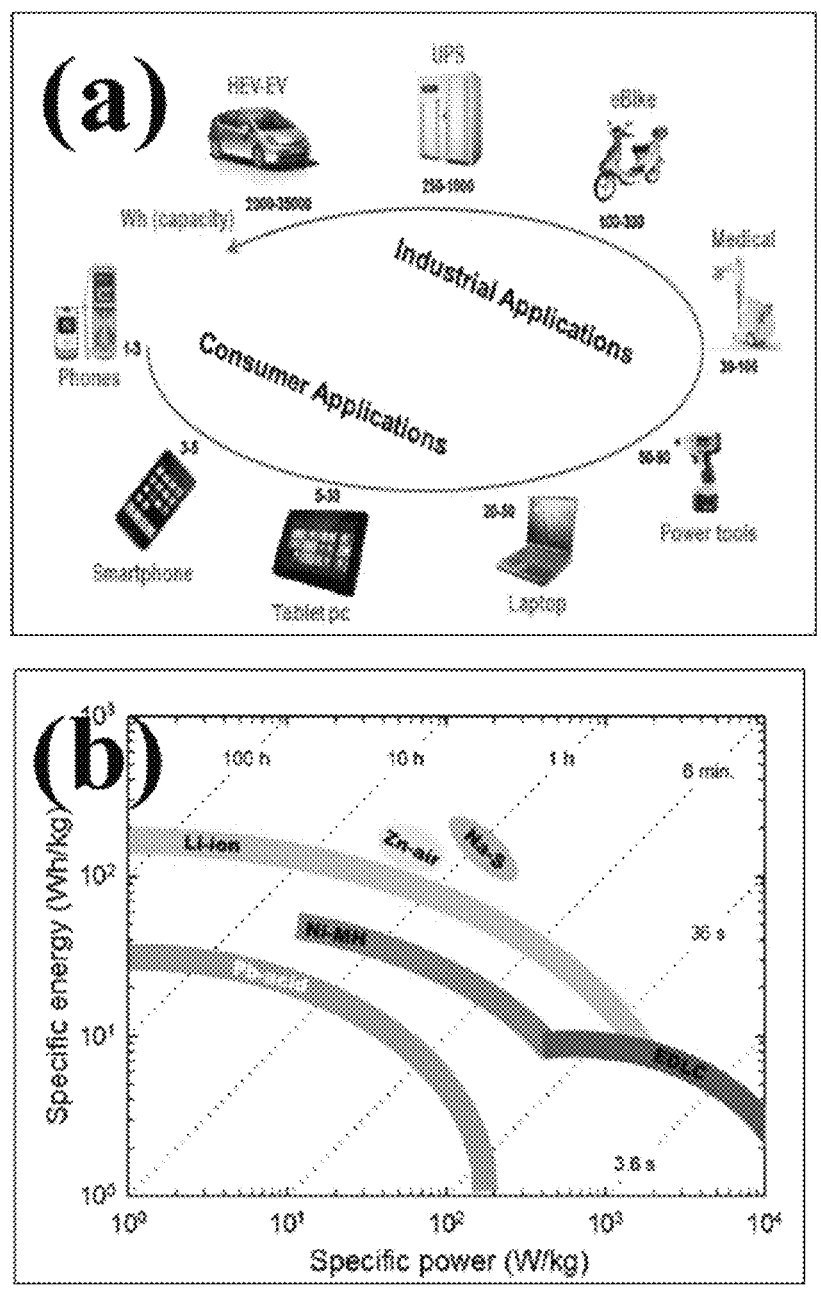

FIG. 29A-29B-Prior Art
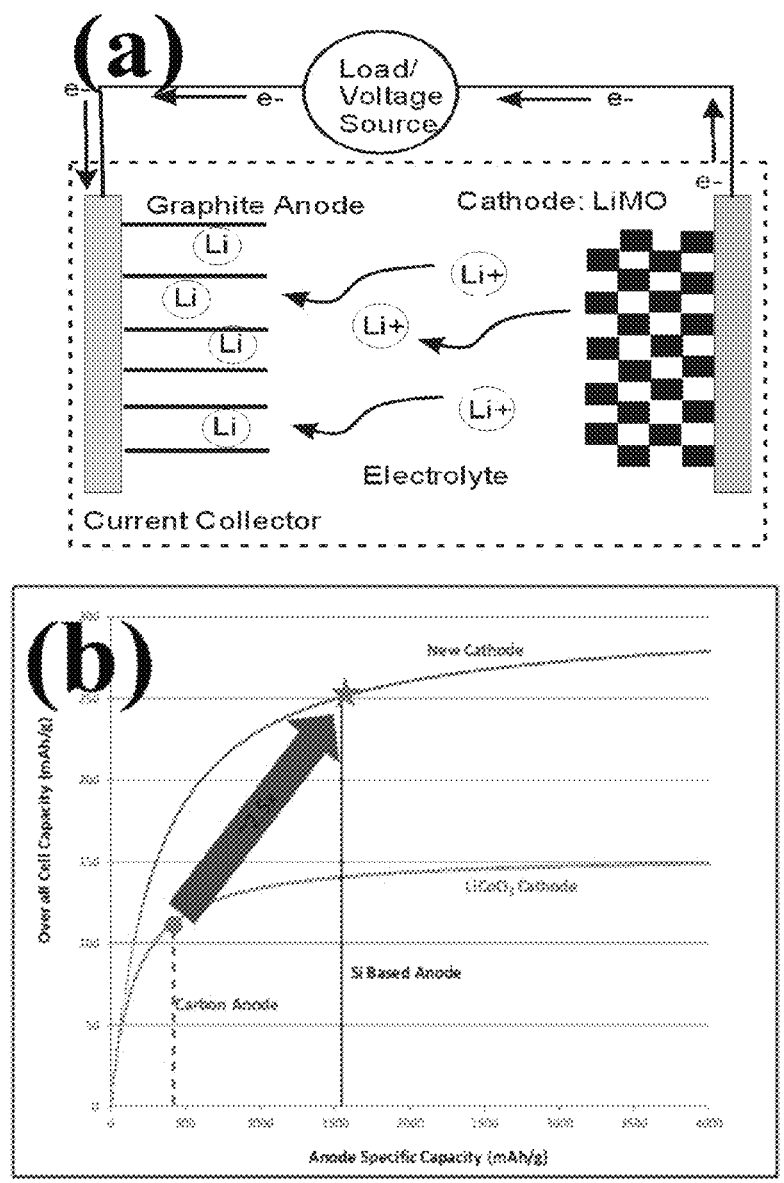

FIG. 30-Prior Art
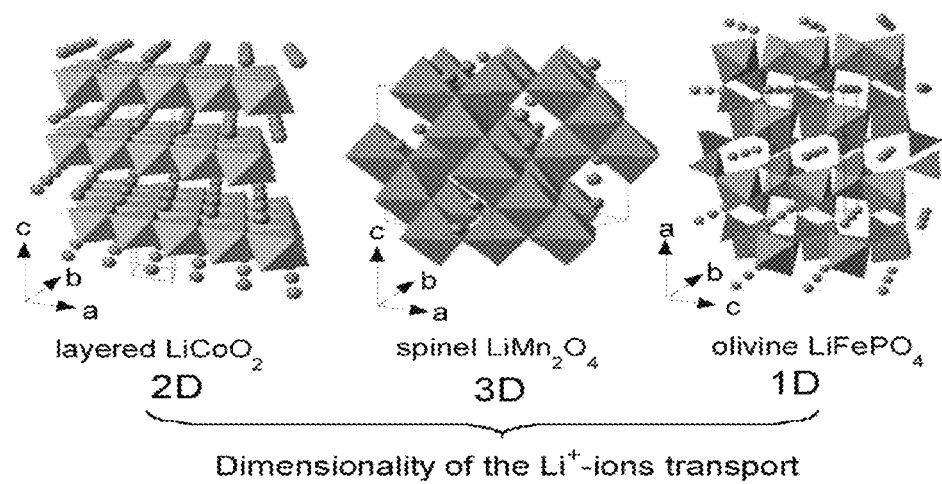
FIG. 31A-31C-Prior Art
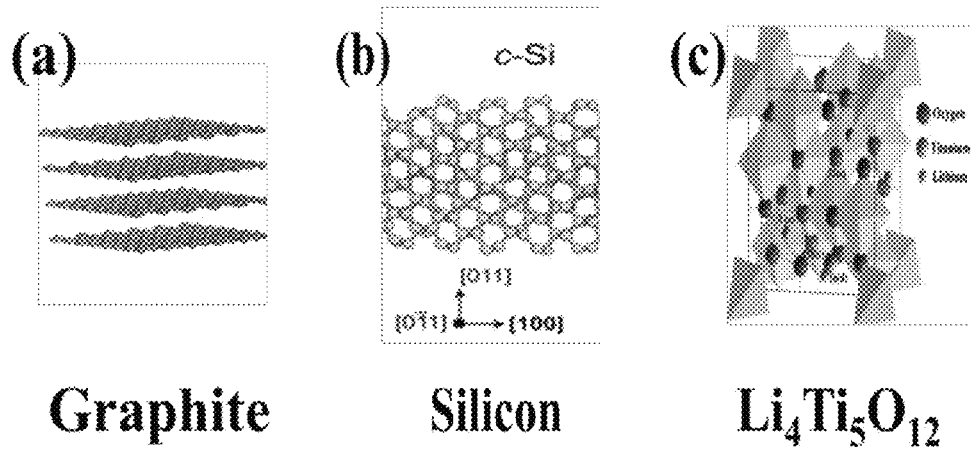

Voltage scale for materials versus Li/Li$^+$.

FABRICATION OF FLEXIBLE CONDUCTIVE ITEMS AND BATTERIES USING MODIFIED INKS

CROSS-REFERENCE TO RELATED APPLICATIONS

The present application claims the benefit of the filing date of U.S. Provisional Patent Application No. 62/285,147 filed on Oct. 20, 2015, and U.S. Provisional Patent Application No. 62/339,235 filed on May 20, 2016, the disclosure of which are incorporated herein by reference.

STATEMENT REGARDING FEDERALLY SPONSORED RESEARCH

This invention was made with government support under Agreement No. W15QKN-10-D-0503 awarded by the U.S. Department of Army. The government has certain rights in the invention.

FIELD

The present application discloses inks and printing technology used to fabricate, among other things, thin films for electronic components, antennas, and batteries. More particularly, the present application relates to an ink composition and new method using particle free silver ink, constantan particle suspension ink, and nickel ink to manufacture conductive flexible components and thin designable batteries.

BACKGROUND

Currently there is a great interest in manufacturing printed circuits, sensors, electronics and radio frequency identification tags via liquid based "ink". Generally, the functional ink is made of metallic nanoparticles (NPs) dispersed in organic/inorganic solvents. By using the functional fluid, inkjet printing technology is a promising method to deposit metallic nanoparticles on polymer substrate with designed patterns, however, there are many problems associated with the use of inkjet printing that need to be addressed.

The most widely used inks are made of silver and gold noble NPs due to the low melting temperature and chemical stability at a high temperature while sintered in air as well as high electrical conductivity. Also used NP inks are copper, platinum, and nickel organic/aqueous suspensions.

However, the utilization of such NP inks has disadvantages. Gold NPs are very expensive to utilize in mass production. Also NP based ink requires a high sintering temperature to join particles. Also, nanoparticle based ink is not suitable to high resolution printing due to nozzle clogging during printing.

Constantan ($Cu_{55}Ni_{45}$) nickel-copper alloy is also known for its excellent thermoelectrical properties. Nickel is much less expensive than gold, however, there are still problems using constantan based ink in printing conductive or electronic items. Constantan may be used for precision resistors, thermocouples and strain gauges with low temperature coefficient of resistivity (TCR). However, this material suffers surface oxidation that has been a serious impediment to the development and application of constantan in inkjet printing technology. Also, high melting temperature of constantan (1221~1300° C.) makes it hard to sinter especially at low temperature such as below 400° C. The sintering process of constantan usually requires a reducing atmosphere which is flammable gas, for instance hydrogen and methane. Reducing gas with high temperature is hard to achieve and dangerous in industry.

Therefore there still exists a critical need for a safe process to anneal (sinter) the inkjet printed constantan patterns at low temperature without using flammable reducing gas. Also there is a need for a NP ink that avoids nozzle clogging, uses lower sintering temperatures and achieves high resolution printing.

SUMMARY OF THE INVENTION

Particle-free silver ink has been developed to avoid nozzle clogging and achieve high resolution printing. Silver salt complex solution is used as a particle free ink. After printing and curing, the organic silver complex is transformed into a highly conductive silver thin film. The thermal treating temperature is usually lower than nanoparticle based ink. Thermal decomposition and chemical reduction of silver salts are two methods disclosed for particle-free silver ink. Chemical reduction makes denser silver film than thermal decomposition caused by volume shrinkage of silver precursor decomposition after thermal sintering. The resistivity of silver patterns made by chemical reduction is also lower than made by thermal decomposition because of less porosity. Addition of a surfactant additive further makes the silver film more uniform and easier to be sintered.

Both the thermal decomposition of silver salts and chemical reduction of silver complex can produce pure silver without impurity. The synthesized silver film has excellent electronic conductivity and adhesion. It has been discovered that sodium carboxymethyl cellulose (NaCMC) plays a crucial role in the final particle size and uniformity. No peeling off and cracking of the printed silver patterns occurred when the film was bent with a large radius. The ink made by chemical reduction is qualified for the flexible electronics fabrication.

Particle free silver ink disclosed utilizes a silver complex solution printed on polymer substrate and sintered in air. It is shown that the polymer additive NaCMC could control the particle shape and size of silver produced during thermal sintering. Moreover, the tests results shown herein show that a surfactant additive (NaCMC) may render the silver film more uniform and easier to be sintered. High resolution silver conductive tracks are made by particle free silver ink by inkjet printing.

The formulation and inkjet printing of constantan ink is also described. Due to the small nozzle sizes which are used for inkjet printing, nano-sized particles are typically required for ink formulation. However, due to their small size, metallic nanoparticles form an oxide layer on the surface during the nanoparticle fabrication process. A chemical process has been developed to remove the oxidation and cure the printed patterns. Ammonia chloride ($NH_4Cl$) is used to etch the surface oxidation and nanoparticles can be sintered together with a thiourea dioxide (TD) additive which reduces the sintering process temperature. The resistivity of synthesized constantan pattern is around 4 $\mu\Omega \cdot m$ and temperature coefficient is very close to that of bulk constantan. X-ray diffraction (XRD) and X-ray photoelectron spectroscopy (XPS) shows that the oxidation has been removed/reduced successfully. Scanning electronic microscopy (SEM) shows that printed particles are sintered very well. The low temperature (below 350° C.) sintering is attributed to the reduced copper and nickel from etched oxidation surfaces. The reduced copper and nickel have high surface energy and tend to sinter with each other; this process can cause solid diffusion among constantan particles. This method can also be used to sinter alloy particles at low temperature and make printed alloy patterns on flexible substrates.

Functional electronic devices like resistors, sensors, antennas and even energy storage devices have been fabricated by printing technologies. As a typical digital printing technology, inkjet printing has many advantages over the traditional mechanical printing technologies such as: low cost, computer controllable shape design and precise deposition. Application of inkjet printing is used in the present disclosure to fabricate conductive tracks and rechargeable lithium ion batteries. Other printing technologies are discussed.

Constantan particle suspension ink may be used to make constantan sensors and resistors and metallic conductive tracks. A new chemical reducing sintering (CRS) is used to eliminate oxidation layers and sinter the constantan at low temperature. CRS is much safer and easier than other current methods.

Nickel ink and Nickel conductive film is made by CRS and used as the current collectors for the lithium ion batteries, which is cheaper than the traditional gold current collectors and more conductive than conventional carbon serious current collectors. Nickel ink particle size could be reduced with a certain amount of chemical reductant additive such as nickel chloride ($NiCl_2.6H_2O$) and thiourea dioxide (TD). Flexible rechargeable lithium ion batteries are made by inkjet printing layer by layer. Inkjet printing, among other methods such as but not limited to flexo printing, screen printing, pad printing and the like, is used to fabricate thin film designable batteries and provides high resolution of the printed image due to the reduction of nozzle clogging.

Any combination and/or permutation of the embodiments are envisioned. Other objects and features will become apparent from the following detailed description considered in conjunction with the accompanying drawings. It is to be understood, however, that the drawings are designed as an illustration only and not as a definition of the limits of the present disclosure

BRIEF DESCRIPTION OF THE DRAWINGS

The patent or application file contains at least one drawing executed in color. Copies of this patent or patent application publication with color drawing(s) will be provided by the Office upon request and payment of the necessary fee.

FIGS. 1A-1B illustrates ink picking up on cliché; FIGS. 1C-1E illustrate ink picking up by deformable pad, and FIGS. 1F-1G illustrate image transfer from pad to 3D surface substrate.

FIG. 4A illustrates a schematic of gravure printed organic solar cells (OSCs) fabricated on rigid glass and flexible PET substrate, the insert graph showing performance of OSCs; FIG. 4B illustrates conductive tracks with folding data of customary office paper using XZ-250 ink, with maximum, median and minimum values of resistance variation; FIG. 4C illustrates flexible organic solar cell module, the insert is three cells connected in series used as a power source for a clock; FIG. 4D illustrates $LiCoO_2/LiNi_{0.5}Mn_{1.5}O_4$ structure.

FIGS. 7A-7D are a schematic diagram of screen printed object; FIG. 7A is a polymer battery; FIG. 7B is a solar cell; FIG. 7C is a full cell structure and layer by layer configuration of the fabricated batteries; FIG. 7D is lithium-ion batteries.

FIG. 8 is a schematic and structure of flexo-printing process.

FIGS. 10A-10C is an illustration of flexo-printed FIG. 10A multi-station for large-scale battery production; FIG. 10B optical waveguides; and FIG. 10C multi-layers structure of solar cell with the graphical insert of optical photo of printing process.

FIG. 11 is a schematic and structure of lithographic printing.

FIGS. 12A-12B are illustrations of plate roller details of FIG. 12A conventional and FIG. 12B water-less lithographic printing.

FIGS. 13A-13D are illustrations of schematic diagrams of lithographic printed items; FIG. 13A showing a sensor structure formed on polyimide film; FIG. 13B showing source/drain structures; FIG. 13C showing resistors with electroding grid, the insert is a small lithographic printer; FIG. 13D showing voltaic cells.

FIGS. 14A-14B are illustrations of schematics and structure of showing in FIG. 14A drop on demand (DoD) and FIG. 14B continuous inkjet printing (CIJ).

FIGS. 15A-15D are illustrations of schematic diagrams of inkjet printed items; FIG. 15A shows silver conductive patterns by functional ink; FIG. 15B shows flexible electronics on polyethylene terephthalate (PET) film; FIG. 15C shows carbon-based supercapacitor; FIG. 15D shows supercapacitor prototypes on metal foil current collectors and heat sealed device.

FIG. 16A shows negative nanoparticles; FIG. 16B shows positive charged electrical double layer stabilized nanoparticle suspension; FIG. 16C shows polymer surrounded stabilized nanoparticles; and FIG. 16D shows structure of surfactant and stabilized nanoparticles with the larger spheres representing conductive nanoparticles.

FIG. 17A illustrates chemicals; FIG. 17B illustrates solution type ink;

FIG. 17C illustrates a printing process; FIG. 17D illustrates solvent evaporation; FIG. 17E illustrates thermal decomposition; and FIG. 17F illustrates thermal sintering.

FIG. 18A illustrates chemicals; FIG. 18B illustrates solution type ink;

FIG. 18C illustrates printing process; FIG. 18D illustrates solvent evaporation and chemical reducing; and FIG. 18E illustrates thermal sintering.

FIG. 23A shows stable article suspension; FIG. 23B shows neck formation and solid diffusion at temperature below the melting point; FIG. 23C shows volume shrinkage and grain growth.

FIGS. 24A-24B illustrate evaporation of organic binder and thicker from the ink; FIG. 24C illustrates plasma reducing/etch process; and FIG. 24D illustrates neck formation due to the particle bombardment.

FIGS. 28A-28 B illustrate a schematic and graph; FIG. 28A shows applications and associated energy capacity required for rechargeable batteries; FIG. 28B shows a comparison of energy and power capabilities of rechargeable batteries where increasing specific energy implies longer battery runtime while increasing specific power implies increasing available current.

FIGS. 29A-29B illustrate a schematic and graph; FIG. 29A shows a scheme of lithium-ion battery with a lithium metal oxide (LiMO) cathode; FIG. 29B shows an effect of anode (x-axis) and cathode (curve) specific capacity on overall cell capacity where the resultant cell specific capacity (y-axis) is based upon the active electrode materials only and no other materials e.g., electrolyte, separator, case are considered.

FIG. 30 illustrates a crystal structure of three lithium insertion compounds in which the $Li^+$ ions are mobile through the 2-D (layered), 3-D (spinel) and 1-D (olivine) frameworks.

FIGS. 31A-31C illustrates crystal structures of three anode materials for lithium-ion batteries; FIG. 31A shows graphite; FIG. 31B shows silicon materials; and FIG. 31C shows lithium titanium-oxide (LTO) ceramics.

FIGS. 33A-33B show made by thermal decomposition without sodium carboxymethyl cellulose (NaCMC); FIGS. 33C and 33D show made by thermal decomposition with NaCMC.

FIGS. 35A-35B show thermal decomposition with NaCMC; and FIGS. 35C-35D show chemical reduced by N,N-dimethylformamide (DMF) with NaCMC.

FIG. 40B patterned silver thin flexible film made by inkjet printing; FIGS. 40C-40D tape test for printed silver thin film; FIG. 40E resolution of patterns; and FIG. 40F circuit board made by silver ink.

FIG. 44A shows constantan suspension in PVP-water solution; FIG. 44B shows eating away surface oxidation by $NH_4Cl$; FIG. 44C shows evaporation of solvents and thickener at low temperature in vacuum, thio-urea dioxide reduces metal ions into nano-sized pure metal layers on constantan surface; FIG. 44D shows solid diffusion among reduced nano-sized copper and nickel which causes activated sintering among constantan particles.

in FIG. 48A copper (Cu) 2p; in FIG. 48B nickel (Ni) 2p; in FIG. 48C oxygen (O) 1s of sintered constantan film without CRS process; and in FIGS. 48D-48F Cu 2p; Ni 2p; O 1s, respectively, of sintered constantan film without CRS process.

FIGS. 49B-F showing samples with CRS process sintered at various time intervals; 15 min; 30 min; 60 min; 90 min; 120 min, respectively, at 250° C. in vacuum environment.

FIG. 51A shows printed constantan samples with CRS process dried at 180° C. in vacuum; FIG. 51B shows the same samples sintered at 250° C. for 2 h after drying; FIG. 51C shows a cross-side view of printed constantan samples after sintering with the insert showing the SEM with different magnification; and FIG. 51D shows an optic photo of constantan strain gauges after sintering.

FIG. 53A shows ink aged for 0 h; FIG. 53B shows results of test #1 ink; FIG. 53C shows results of test #2 ink; and FIG. 53D shows results of test #3 ink.

FIG. 54A shows ink kept for 0 h; FIG. 54B shows test#1 ink kept with TD for 72 h, and KOH added before sintering; FIG. 54C shows test #2 ink with KOH kept for 72 h, and TD added into ink before sintering; and FIG. 54D shows test #3 ink with TD and KOH kept for 72 h.

FIG. 55A shows nickel precursor printing; FIG. 55B shows reducing agent printing on the nickel precursor layers; and FIG. 55C shows details of the chemical reducing process in the solution and nickel layer formation.

FIG. 56A shows nickel suspension in PVP-water solution; FIG. 56B shows eating away surface oxidation by $NH_4Cl$; FIG. 56C shows $NiCl_2$ added into the suspension to increase the nickel ions concentration; and FIG. 56D shows a printing and sintering process.

FIGS. 58A-58B show nickel nano powders; and FIGS. 58C-58D show nickel patterns after CRS process with different magnifications with neck formation marked by black arrows.

DETAILED DESCRIPTION

The present invention involves printing technologies, properties of printable inks, printable inks, sintering technologies, flexographic printing (or flexo printing), conductive color changing inks and conductive colorless inks, and printable and/or flexible batteries and all are herein discussed. Printed devices, electronics, and circuits continue to be made by various printers and inks with advantageous economics and properties. Such need has pushed manufacturing printing methods (e.g., pad printing, gravure printing, screen printing, offset lithography and flexography), digital (e.g., inkjet-printing) and even 3D printing technologies to develop new and improved methods. The basic principle of printing is the deposition process of functional "ink" on a substrate with designed patterns. The deposited ink then is dried or sintered to form stable and continue functional patterns for the further use.

Overview

I. Printing Technologies

The following is a brief synopsis of printing technologies that, depending on the implementation, may be utilized with the present disclosure. Pad printing is also known as tempographic printing. This technology can transform images from recessed areas (gravure) called the cliché filled with ink and the excess is moved with a metal doctor blade. A flexible pad or tampon is pressed onto the cliché and deformed to pick up the images (pad is filled with ink with certain image), and the ink on the pad is released and pressed on the substrate to transfer the images. An example of a pad printing process is shown in FIG. 1A-1G. Based on the working mechanism description above, the pad printing has several advantages: (a) Printing on a variety of substrates: 3D objects can be used as substrate. This is the main advantage of pad printing. No printing technology can transfer 2D images on 3D substrate except pad printing; (b) economy and simple printing process: its machinery process is very simple and maneuverable; the machine is easy to set up and requires less training especially for lab Research and Development (R&D); (c) it can achieve multi-color printing: it is easy to set several ink pods working together to print layer by layer with different colors; and (d) various inks can be used in pad printing: it have wide ranges of viscosity and surface tension due to the mechanical pressing.

Figures 1A, 1B, 1C, 1D, 1E, 1F, 1G:
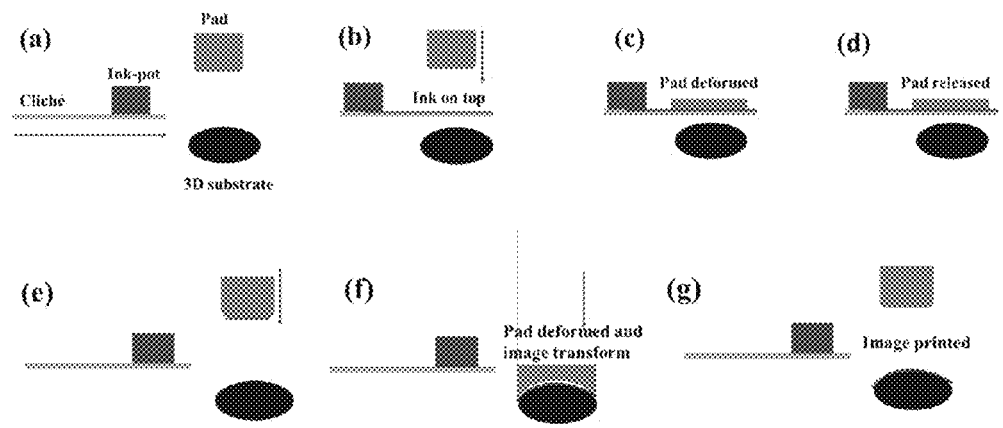
FIGS. 1A-1G are schematics of a pad printing process.
Figures 2A, 2B:
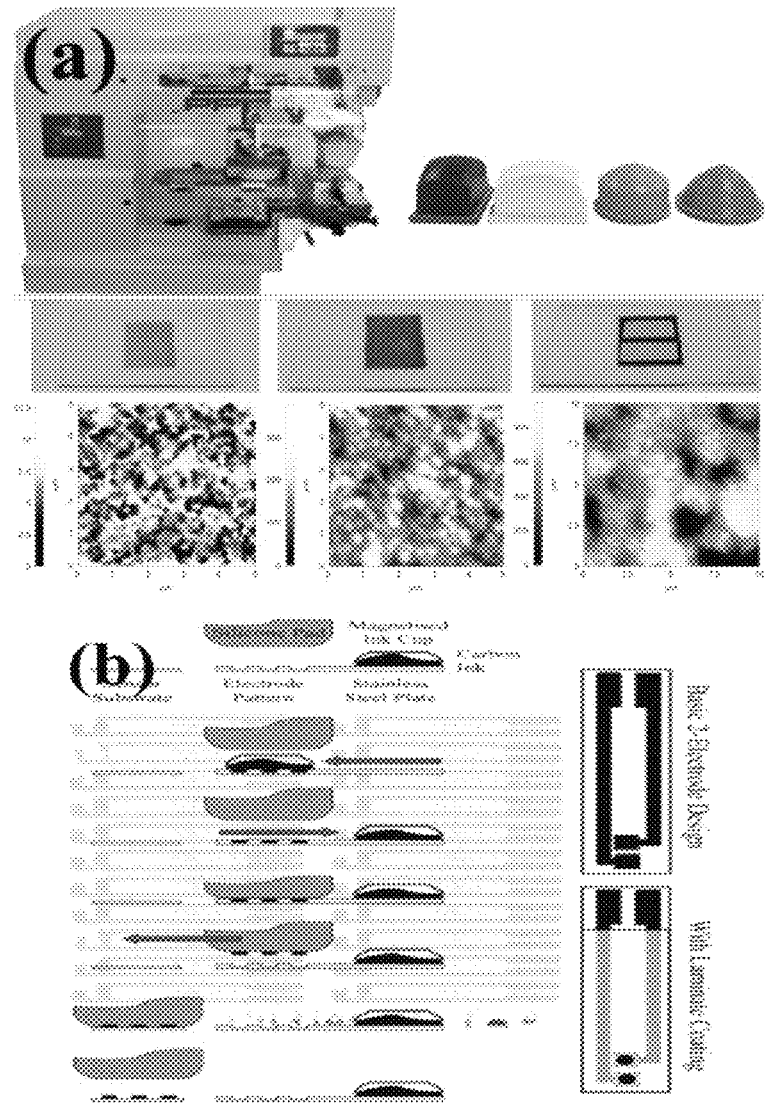
FIGS. 2A-2B are schematic diagrams of a pad printer with examples pads of different shapes and with a completed device of printed solar cell, and pad printed electrode assemblies.

As a mature technology, pad printing has already been applied in fabrication of electronics and energy storage devices. FIG. 2A shows the pad printer and pad with different hardness; the pad hardness is crucial to the morphology of final printing. FIG. 2B shows a known pad printing technique for the production of disposable electrode systems.

However, as an easy mechanical printing process, pad printing also has disadvantages and limitations. These limitations include that pad printing is less durable than other printing technologies. Also the cliché and pad-printed legends can be worn away by abrasion during the ink picking and printing deformation. Furthermore, necessary maintains on the deformable pad are required in this pad printing technology. It is hard to produce large images. For example, large pads require a large press, and such a large pad has poorer durability caused by the movement of the press than is one of smaller mass. This means that pad printing cannot achieve large scale printing. This limits pad printing application in industrial applications.

Figure 3:
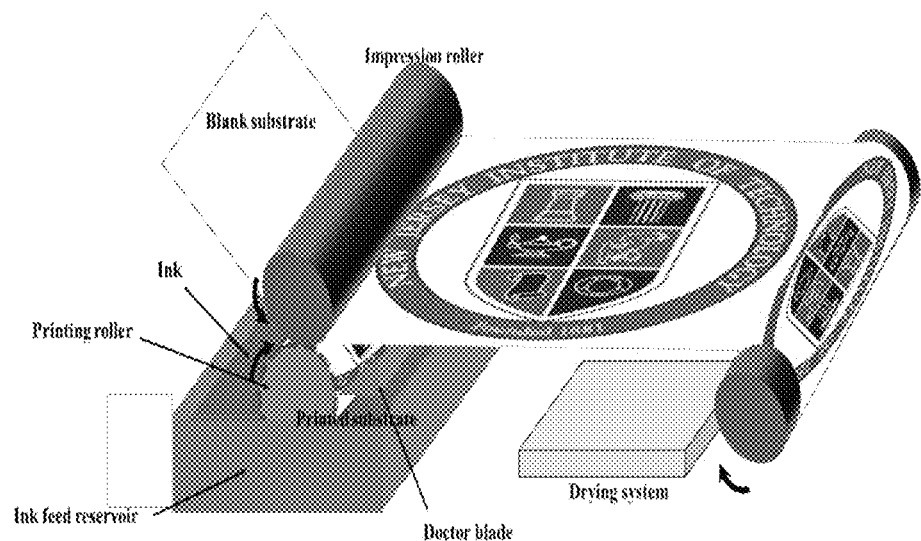
FIG. 3 is a schematic and structure of gravure printing process.

Gravure printing is a direct application process which transfers images on a substrate. Ink is placed directly onto the substrate without having to go through the complex image transfer methods. The gravure printing system consists of a printing roller, an impression roller, a feed reservoir, and a doctor blade, as shown FIG. 3. The printing roller, which is engraved or etched with the designed image and patterns on to the surface, picks up ink from the feed reservoir filled with ink. Then the extra ink on non-image areas is scraped off the printing roller by a doctor blade to the feed reservoir for the next printing. The ink on the printing roller then transferred to the substrate by the pressure from the press roller. Finally the ink is dried by drying system There are some advantages of gravure printing such as roll-to-roll production is easy for mass production, and it is a highly consistent and continuously reproducible print process. Gravure printing was the most popular printing method in industry before the flexo printing discussed herein. Set up is easy for gravure printing and requires less training due to the simple structure of printer. Multi-rollers can be mounted together in the same time to achieve front- and backside printing at the same time. Also, multi roller can achieve multi-color and multi-layer printing. The printer rolls have a long lifetime, unlike deformable pad in pad printing, the hard and durable nature of the metallic printing rollers used makes gravure printing an ideal process for providing high quality print on very long or regularly repeating runs, delivering cost advantages over other processes. Fast ink drying of printed substrate is achieved by evaporation that may contribute to environmental issues. The gravure process is ideally suited to situations where there is a range of print designs but a constant carton construction and size.

Figures 4A, 4B, 4C, 4D:
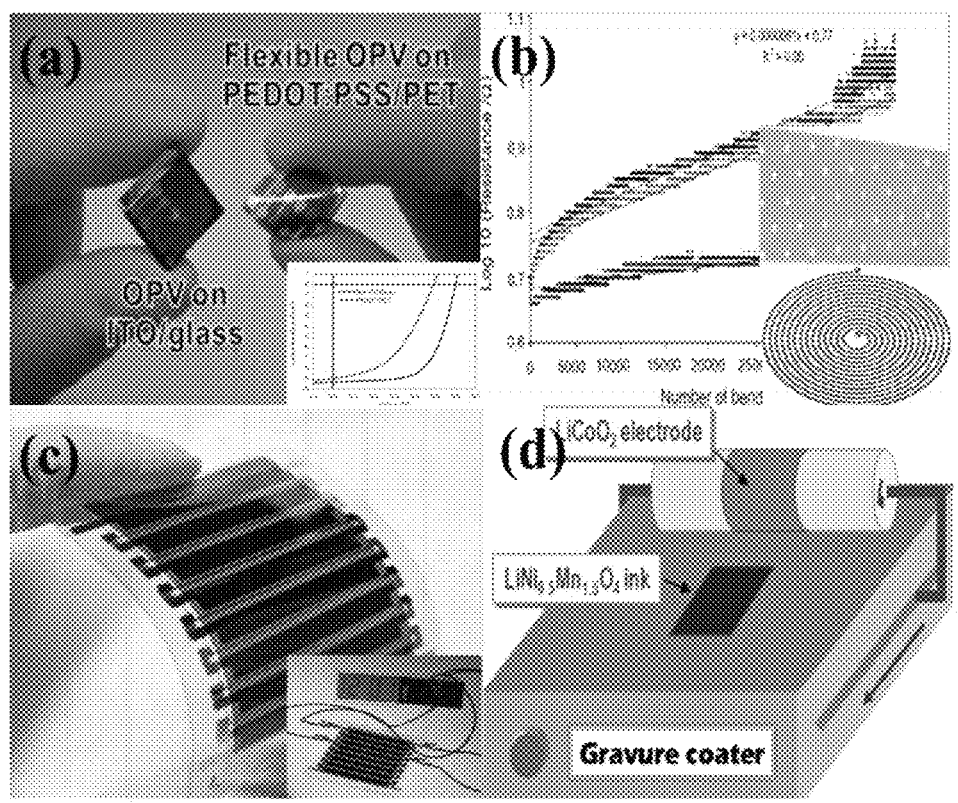
FIGS. 4A-4D are schematics.

Although gravure printing is no long as popular due to other more advantageous printing technologies, it is still used widely in large runs for magazines, newspaper and books fabrication. It is also applied in the fabrication of electronics and energy storage due to its roll-to-roll based continuous process that is an excellent economic method for industrial production. Organic solar cells (OSCs) printed on a flexible polyethylene terephalate (PET) substrate is known in the art. The printed PEDOT: PSS electrode has a relative low resistance (with a sheet resistance of 359 Ω/square) and 88.92% transparency. This electrode shows outstanding flexibility irrespective of the bending test modes as shown in FIG. 4A-4D. Shown in FIG. 4B after deposition on the paper, the patterns are cured in temperatures of 70-120° C. to achieve continuous and stable structures with high conductivity. Prior art gravure printed solar cell modules exhibit good electrochemical and mechanical flexibility performance as shown in FIG. 4C. Lithium-ion batteries by gravure printing have been met with limited success. One prior art attempt shown in FIG. 4D requires a protective layer ($LiNi_{0.5}Mn_{1.5}O_4$) coated on $LiCoO_2$ cathode by printing to enhance the electrochemical stabilities.

There are several disadvantages of Gravure printing. The printed substrate is limited to 2D flexible substance with acceptable thickness. Thus, 3D subjects cannot be used in gravure printing due to the close distance between press roller and printing roller. Also, the substrate generally must be mechanical flexibility due to the roll-to-roll process. Inks are limited to only low viscosity ink because high viscosity ink cannot be picked up as well by a printing roller leading to poor printing resolution. Startup costs are generally high and it takes a long time and high cost to make, maintain and change the printing patterns on the printing rollers.

Figure 5:
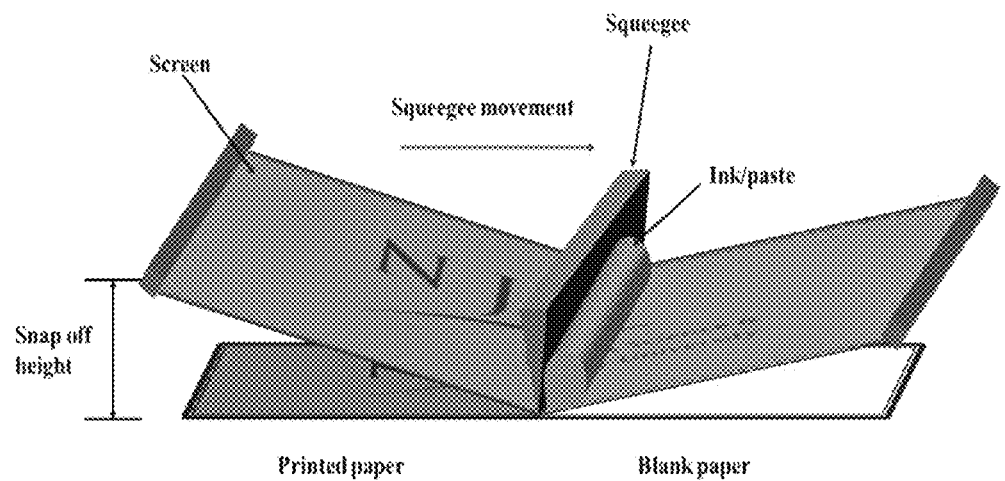
FIG. 5 is a schematic of a flatbed screen printing process.
Figure 6:
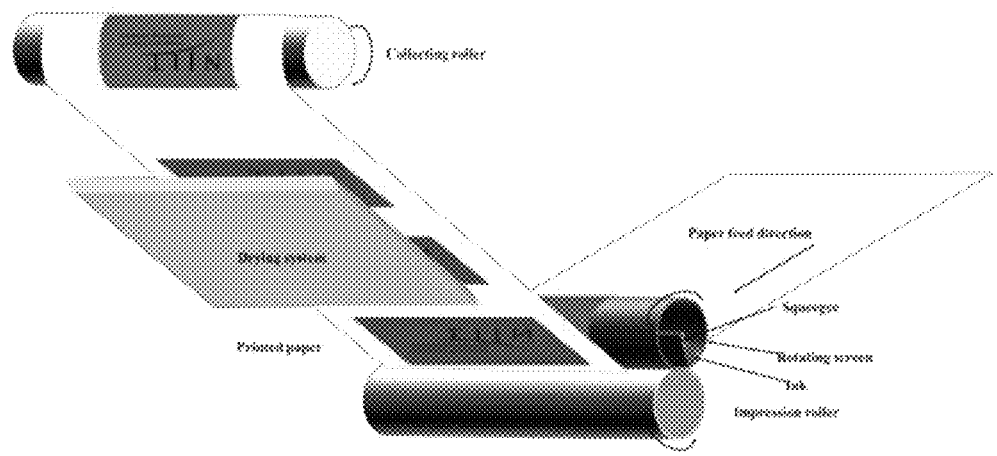
FIG. 6 is a schematic of rotary screen printing process.

Screen printing is an environment friendly printing method since there is only a small amount of chemical waste; however, this process also has limitations. There are two types of screen printing: flat bed and rotary screen printing. FIG. 5 shows a schematic of the flatbed screen printing process. Rotary screen printing as shown in FIG. 6. This method is usually implied in mass production. The rotary printing process uses essentially the same principle as flatbed printing but the screen web here is instead folded into a tube and the squeegee and the ink are placed inside of the rolling tube. Rotary process requires a longer adjustment run-in (adjusting the print with previously processed layers) compared to flat bed process. Flexible zinc-air battery has been produced by screen-printing. In this battery, a zinc/carbon/polymer composite is used as anode ink, and a vapor polymerized PEDOT cathode ink is printed onto two sides of a photo paper, while silver layers are used as a current collector. However this process has many disadvantages as discussed below. The structure of battery is shown in FIG. 7A. Fabrication of an organic-based bulk heterojunction solar cell is shown in FIG. 7B. However, this solar cell is made of inflexible glass. FIG. 7C shows a structure of multilayers battery. A current method to fabricate cathode electrode for lithium-ion batteries is shown in FIG. 7D. The limitation here is the aluminum substrate is not fully flexible.

Some advantages of screen printing include a relatively wide range of print substrates especially for flatbed screen printing process; the size of screen printing can be scaled up to make large images or scaled down; relatively low cost due to noncomplex machines required and reproducible deposition of precise motifs, even free standing lines and dots, by the use of various mesh counts, coupled with the right screen coating on to a variety of substrates.

There are several disadvantages to screen printing. The main disadvantage of the screen printing process is that the ink must be pushed through the screens. This means that it is difficult to mix colors in an accurate amount in order to simulate smooth gradients and other effects. So most of items printed by screen printing are made from a combination color zones. Also and most importantly there is a limited resolution. Screen printing is not as high quality resolution process and is not suitable for fine detailed reproductions such as micro devices. Also, the inks for screen printing are usually very thick which cannot be deposited uniformly and precisely as required for such devices. Screen printing requires multi printing process because it only prints one color at a time and changing patterns between runs is time consuming.

Figure 9A:
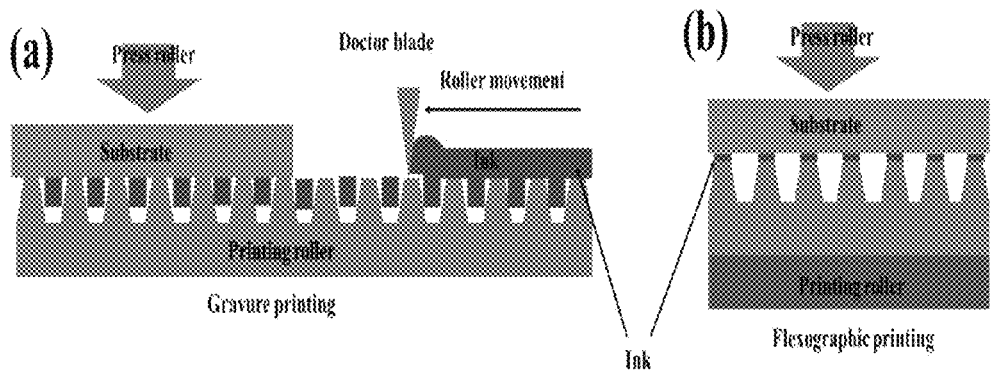
FIGS. 9A-9B is an illustration of gravure printing and flexo-printing.
Figure 9B:
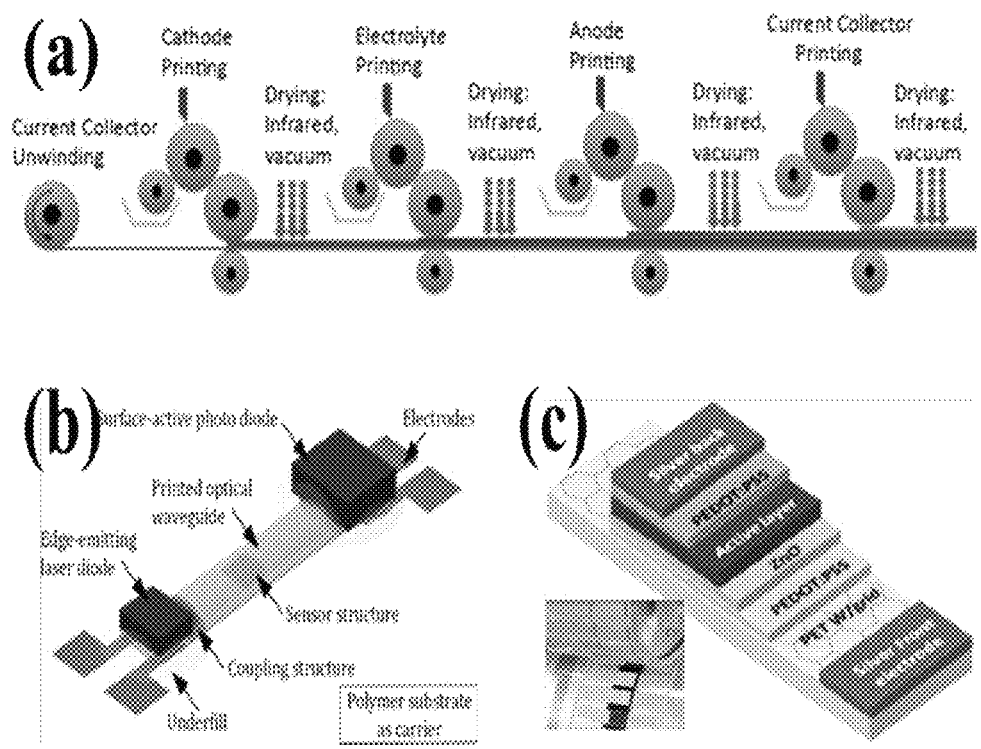

Flexographic printing (or flexo printing) is a high-speed rotational printing method, which is widely used in graphic arts and package printing on roll-to-roll process on various substrates such as cardboard, paper or plastic foil. The schematics and structure of flexo printer is illustrated in FIG. 8. Comparison of gravure printing and flexo printing as an example is shown in FIGS. 9A-9B. A roll-to-roll printing process for developed battery technology using commercially available flexographic printing presses is shown in FIG. 10A. Flexo printing can be also employed as optical waveguides production as shown in FIG. 10B. Solar cell fabrication by flexo printing is shown in FIG. 10 C. All of these examples for Flexo printing have limitations and disadvantages noted herein and below. Advantages of flexo printing include printing on a wide variety of surfaces, easy plate-making process, and both short-run and long-run deposition.

Disadvantages and limitations of flexo printing include inability to produce complicated and extensive artwork, or produce thick layers of ink due to the direct impression process. In other words, the thickness of printed patterns cannot be controlled easily. This process is especially bad for printed energy storage devices because thin layer only contains few active materials, which restricts the total energy storage of the device. Furthermore the patterns on the plastic plate mounted on impression rollers are made by lithographic printing and cannot stand for long time.

Off-set lithographic printing consists of conventional and waterless processes. Conventional lithographic printing is a 2-dimensional printing technique whose structure is unlike most other planographic techniques descripted above (i.e. both printed and non-printed areas are in the same plane). The offset lithography process is based on water based chemistry and creates images by having hydrophobic areas that are wetted by the water-based ink and hydrophilic areas that do not wet (as shown in FIG. 11 white part is hydrophilic and red "NJIT" logo is hydrophobic). This process requires some development of ink systems with hydrophobic and hydrophilic properties before it can be envisaged for fabrication of polymer photovoltaics. Waterless offset printing technology is a lithographic process that does not use hydrophobic or hydrophilic solution as shown in FIGS. 12A-12B. It is based on repulsion between the ink and siliconized areas as shown in FIG. 12B. Use of offset printing for printed sensors is shown in FIGS. 13A-13D. Advantages of offset printing include higher quality images than flexo printing because the rubber blanket conforms to the texture of the printing surface; longer durability than flexo printing because plates in offset printing only make contact with the printing blanket; long run printing capability. Disadvantages of off-set lithographic printing include poor resolution compared to rotogravure or photogravure printing. This is because of the soft pattern plate cannot transfer every details of the image precisely. Lithographic printing requires high maintenance, and its relative costs are high to fabricate image patterns.

Digital printing (inkjet printing) permits the scalability of functional materials in a continuous reel-to-reel system. Inkjet printing offers the versatility to switch quickly the deposited materials and the pattern design. Functional inks can be printed on various substrates layers by layers.

FIGS. 14A-14B show two types of commercial inkjet printing processes: drop on demand (DoD) inkjet printing and continuous inkjet printing (CIJ). In DoD inkjet printer, drops are only generated when given orders. The most widely used DoD printer uses piezoelectric materials to generate ink drops: a piezoelectric actuator is deformed by the image data signals to jet ink drops on the certain position, which is controlled by x-y mechanically moving plates and printing nozzles. DoD inkjet printing has more flexibility with ink and system design. This inkjet printer requires inks with certain range of viscosity and surface tension in order to be emitted easily. In contrast, CIJ inkjet printer uses high voltage to control the path of ink drops, a chamber with a nozzle at one end is occupied by a plunger or a pump, Ink is continuously pressed to the nozzles and is charged before emitting out. The charged droplets are deflected by the electrode plates which are controlled by the computer with image data pulse. Unused inks are collected by a collecting tray and then pumped into the cartridge for the next printing. CIJ has higher drop ejection frequency which might be easy in high duty cycle applications. CIJ inkjet printer also has wider range of ink because it requires less for the viscosity and surface tension compared with DoD. But CIJ process also suffers disadvantages. The exposure of the recycle tray may contaminate and variate the concentration of the ink which can result into high risk of clogging; this is also very bad for metallic ink due to the oxidation of metallic particles in air. The oxidized metallic particles cannot be cured in the sintering process. Another disadvantage is ink waste: only a small fraction of inks are required in one printing cycle. Precise quantities of a wide range of materials (particle ink and particle free ink) can be deposited in the form of single droplets or conducting lines on various substrates. As inkjet printing is a relatively fast technique, it potentially enables fast roll-to-roll patterning process.

As discussed before, the key challenge in printing technology is suitable ink formulations development which determines the drop ejection properties and the evaporation behavior and orientation upon solvent evaporation which influences the printing quality. The resolution of inkjet printing can reach to 20 to 50 µm by statistical variations of the flight direction of droplets and their spreading on the substrate. Taking metallic conductive inks as an example, uniform and monodisperse metal nanoparticles in aqueous or organic solvent dispersions contribute to attain a high dispersion stability and low electrical resistivity at low curing temperatures. In recent years, metallic precursor ink can produce high conductive patterns with good resolution without nozzle clogging (nozzle clogging is a serious issue of inkjet printing and can interrupt the printing process) at relative low curing temperature. High sintering temperatures are incompatible with common plastic foils, such as PET and polycarbonate (PC) having a relatively low glass transition temperature. The choice of foil is therefore restricted to more expensive polymers such as polyimides (PI) such as Kapton® whose working temperature can be as high as 400° C.

FIGS. 15A-15D illustrate digital printing applied in the fabrication of electronics and energy devices. A particle-free MOD ink (MOD=metal-organic-decomposition) of high silver content was directly used for inkjet printing silver conductive patterns on Polyimide (PI) substrate with disadvantages and limitations noted below. Silver oxalate is used as silver precursor, ethylamine as a complexing ligand to increase the solubility of silver oxalate in order to increase the silver loading (27.6 wt. % in this case), ethyl alcohol and ethylene glycol as the solvent with suitable viscosity and surface tension. The deposited silver ink on PI substrate is thermally treated at different temperatures and times. The silver film cured at 170° C. for 30 min shows a best properties with a resistivity of 8.4 µΩ·cm (18.9% of the bulk silver) and good adhesion on PI substrate. Inkjet printing technology can be used to replace the conventional photolithography to fabricate flexible electronics as shown in FIG. 15B. Here Ag/RGO (reduced graphene oxide) composite with good conductivity and dispersity is synthesized as conductive ink filler for inkjet printing. Carbon-based micro-supercapacitors in self-powered modules are fabricated with inkjet printing technology on silicon substrate as shown in FIG. 15C. The ink is first prepared by mixing an activated carbon powder with a PTFE polymer binder in ethylene glycol, the system is stabilized with a surfactant, and then the mixture is deposited by inkjet on patterned gold current collectors in the serrated shape to increase the contact area between cathode and anode. The substrate is heated at 140° C. in order to assure a good homogeneity. These micro-devices show a high capacity behavior over a wide working potential range (2.5 V for a cell capacitance of 2.1 mF/cm2). Fabrication of flexible supercapacitor is illustrated in FIG. 15D. GO (graphene oxide) is dispersed in water as an active materials ink. The ink is then deposited onto a metal film which is stick on Kapton® as current collectors by inkjet printing. After printing conductive graphene, electrodes are produced by reducing the graphene oxide at 200° C. These electrodes are sealed together with added electrolyte and separator with heat treatment, and the assembled supercapacitor performance is evaluated. The performance of the flexible packaged device works well with good specific capacity. But thicker graphene electrodes and further package optimization will be required to obtain good device-level performance. For instance, this capacitor is not fully inkjet printable: metal foil is used to act as current collector. The foil has to be stack on the Kapton® film, and this step reduces the production efficient significantly. Table 1 compares the various printing techniques.

TABLE 1

Comparison of printing techniques

| Principle | Printing process | Main advantage | Main disadvantage |
|---|---|---|---|
| Mechanical | Pad printing | 3D substrate | less durable and hard to scalable |
| | Gravure printing | High resolution | Can only be printed on smooth surface and printing plates |
| | Screen printing flexo printing | Miniaturization Can be printed on rough surface | Hard to print multi colors Low resolution and printing plates |
| | Lithographic printing | High resolution and can be printed on rough surface | Consumption of printing plates |
| Digital | Inkjet | Easy to setup and design | Nozzle clogging and consumption of cartridge |

Table1 shows the main advantages and disadvantages for the different printing techniques. Mechanical printing is easy to achieve mass production especially for industrial processes. However, it requires time and financial resources to replace or make printing roller especially for gravure printing (metallic roller) and lithographic printing (hydrophilic and hydrophobic roller). In contrast, through inkjet printing changes in design can be implemented very easily through the computer design software. However, inkjet printing requires cartridge and printing head replacement with every print. Considering cartridges and nozzles are already commercial available, digital printing still shows outstanding properties compared to mechanical printing. Discussed below in the experiments and examples was research conducted for the application of inkjet printing in microelectronics and energy storage systems.

II. Inks for Printing

Generally the ink for printing can be classified into two types: nano particle suspension ink and particle-free ink. The surface tension and viscosity are two crucial factors for the printing process; they must meet the requirements of specific printers. A typical ink has a viscosity up to 2 cP but it depends on the specific printer. Some printers can be designed to handle liquids up to 100 cP. Additives such as glycerol and isopropanol are can be used to adjust viscosity. Polymeric additives such Polyvinylpyrrolidone (PVP), Poly (vinyl alcohol) PVA and sodium carboxymethyl cellulose (NaCMC) are used to improve dye bonding to the substrate. Nanoparticle inks are the most widely used inks currently. Many of the materials previously discussed can be printed as fine particle/solvent (organic or aqueous) suspensions. The advantages of particulate suspensions are including the greater chemical stability of crystal and the higher concentration of active material loading over the other inks. However, particle sizes should be less than a micrometer (usually nanosized) to avoid sedimentation. Also, the dispersion must be very uniform to avoid any aggregation that would increase the viscosity and nozzle clogging during the printing. In order to make a stable and printable nanoparticle based ink, some chemicals are necessary to be added into the ink.

Nanoparticles in dispersions approach other particles and stick together due to Brownian motion, and this may cause aggregation followed by further irreversible sedimentation because of the higher density of dispersed materials than the liquid "solvent". This is especially important for the conductive nanoparticles because nano-sized particles tend to stick together to reduce the surface tension. In order to prevent the aggregation of nanoparticle based ink, surfactants and stabilizers are necessary to add into the ink, to enhance the shelf life and performance of inks. Basically, the stabilization of nanoparticles against aggregation is achieved by two main mechanisms: electrostatic and steric.

Figures 16A, 16B, 16C, 16D:
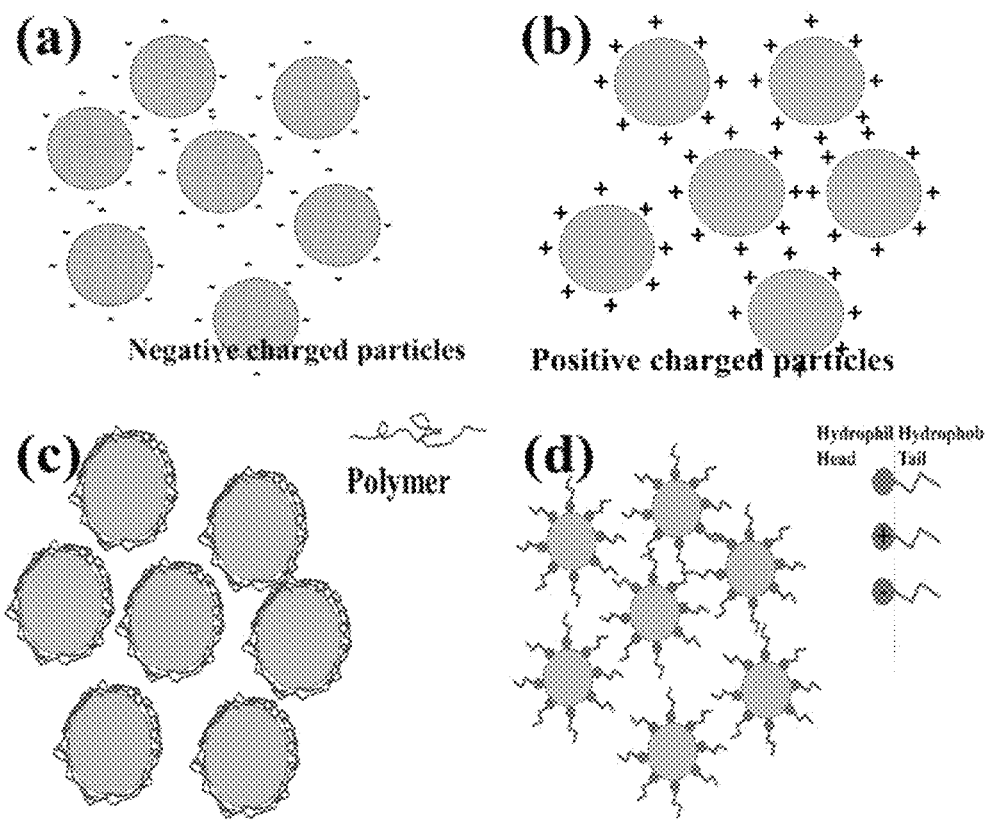
FIGS. 16A-16D are illustrations of nanoparticles.

Electrostatic stabilization is achieved by electrostatic repulsion between electrical double layers which are adsorbed on the nanoparticles' surface as shown in FIGS. 16A-16B. The value of the electric potential of the nanoparticles is known as zeta potential: higher absolute electrical potential values can give a larger electrostatic repulsion which can make the suspension system more stable. The electrosteric mechanism is especially effective when stabilizing nanoparticles in aqueous dispersions. The disadvantage of electrostatic stabilization is its sensitivity to electrolyte concentration (which is caused by the salts or polar solvent concentration), which strongly affects the thickness of the electrical double layers; this limits the application and stability of nanoparticle inks. Also, it is hard to achieve electrostatic layers in nonpolar solvents systems. To overcome this problem, steric stabilization is another alternative method to make stable suspensions. Steric stabilization is achieved by surrounding the particle with an adsorbed layer of sterically bulky molecules, such as polymers (FIG. 16C and surfactant shown in FIG. 16D). The polymer/surfactant coated nanoparticles will no longer stick together. Static stabilization is very effective in highly loaded metal nanoparticles dispersions: non-ionic amphiphilic polymers containing both hydrophobic and hydrophilic components. Their molecules are capable of binding to the surface of metallic nanoparticles thus providing effective steric stabilization. Depending on the embodiment the following may or may not be used: poly (N-vinyl-2-pyrrolidone) (PVP), Poly (vinyl alcohol) (PVA) and Carboxymethyl cellulose (CMC) of various molecular weights, which exhibit a highly effective protective function in both organic and aqueous media. PVP has been proven to be an effective stabilizer for Ag and Cu NPs in both aqueous and organic solvents.

Particle free ink uses specific solvents to make a stable solution which can be deposited on substrate by printing technologies. The deposited materials are then precipitated by evaporation or chemical reaction at a proper sintering temperature in a certain atmosphere environment. Particle free ink is an excellent choice for printing especially in inkjet printing because of no clogging risk. The particle free ink includes particle free metallic ink and particle free polymer ink (most of the time this means UV-Curable Ink). The particle free metallic ink has two principles: thermal decomposition and chemical reduction. Metal-organic decomposition ink (MOD ink) dissolves metallic salts into specific solvents.

Figures 17A, 17B, 17C, 17D, 17E, 17F:
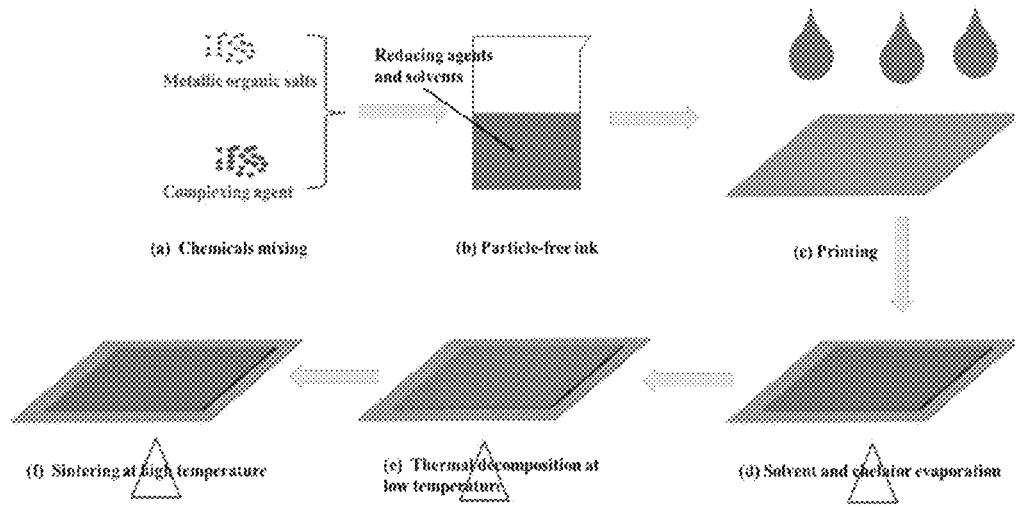
FIGS. 17A-17F are schematics of thermal decomposition metallic organic ink printing process.

Since metallic organic salts have poor solubility, chelating agents are necessary to increase the solubility as shown in FIGS. 17A-17B. After ink deposition on substrate as shown in FIG. 17C, the printed patterns are dried in certain environment to evaporate solvent and chelating agents and leave the metallic organic salts as shown in FIG. 17D. The metal can be achieved by the disproportionation reaction at a certain temperature as shown in FIG. 17E. The deposited metal is then sintered at high temperature to enhance the adhesion on substrate as seen in FIG. 17F.

Figures 18A, 18B, 18C, 18D, 18E:
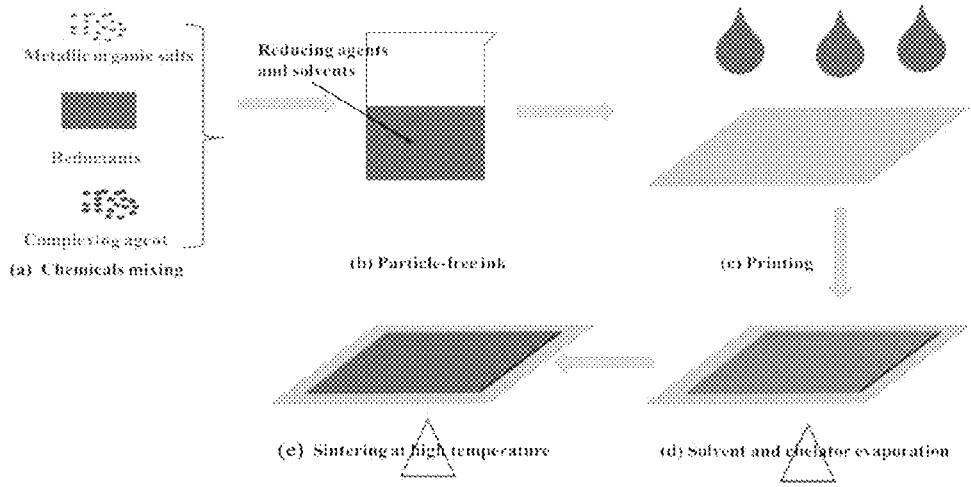
FIGS. 18A-18E are schematics of chemical reducing metallic organic ink printing process.

Another MOD ink use chemical reducing agents (most time solvent with reducing capability) mix with metallic organic salts and complexing agents to make a stable solution as shown in FIGS. 18A-18B. The ink is then deposited on substrate by printing as shown in FIG. 18C. The printed patterns then heated by thermal plate to evaporate solvent, in the meantime the reducing agents reduce the metallic ions to form metallic nano particles which then settle on the substrate as shown in FIG. 18D. The nano particles are then sintered at high temperature to make a continue film on the substrate shown in FIG. 18E.

Figures 19A, 19B, 19C:
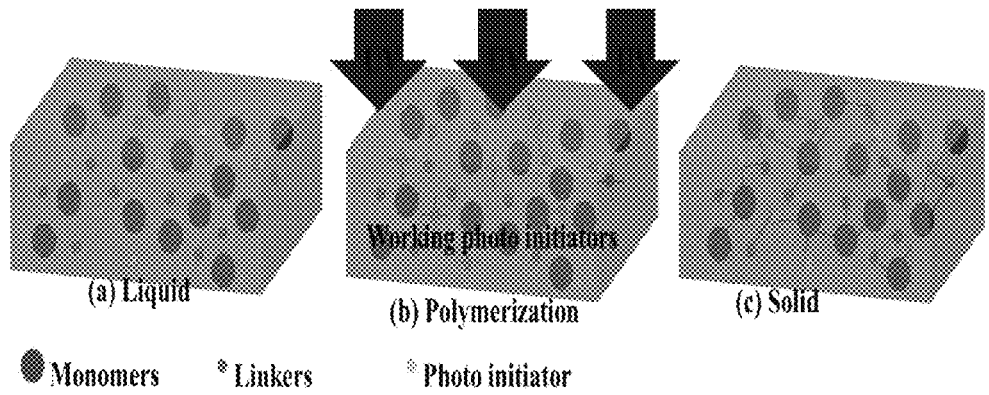
FIGS. 19A-19C illustrates a drying process of ultraviolet (UV) curable ink.

UV curing process is a photochemical process in which high intensity ultraviolet light is used to instantly cure inks. UV curable ink has many advantages over traditional inks, for instance: increase production speed, reduce risk of nozzle clogging due to particle free systems and facilitate superior bonding between active materials and substrate. UV curable inks are a better alternative to solvent-based products. Conventional thermal drying is achieved by solvent evaporation. This process shrinks the initial volume significantly which can cause space porous structure which lowers the contact areas among the active materials; those porous structure leads to a poor conductivity in metallic conductive inks. Organic solvent evaporation creates potential environmental pollutants issues. In contrast, no solvent evaporation in UV curable ink and any loss or shrinkage of coating thickness or volume of printed film. A UV formulation consists of the following main parts: monomers, linker, photoinitiators (UV sensitive component) and other additives and stabilizers. The irradiation-sensitive element in the ink is the photo initiator which is affected by the UV irradiation. The ink is stable without dense UV shining and appears in liquid form as shown in FIG. 19A. The photo initiator at a radical polymerization forms free radicals, which are able to split the double bonds within the oligomers and monomers; this is a polymerization reaction in FIG. 19B. Polymerization reaction transforms the fluid varnish film into a three-dimensional solid structure as shown in FIG. 19C. Physical properties such as viscosity η, surface tension γ, density ρ, contact angle θ of the ink and adhesion on the substrate are the most important properties that affect ink and final products performance.

Viscosity plays an important role in keeping the uniform shape of each drop and stabilizing the elongation drop by eliminating the oscillations after the fluid detaches from the nozzles. If the ink is too viscous, large pressure is needed to generate and jet droplets out from the nozzles. Nozzle clogging will happen if the pressure is not enough to shot the droplet especially in particle free ink which usually has high viscosity due to the large dissolved precursors (even though no particle blocking the nozzles, the ink is too thick to print). Another problem is high viscosities are usually caused by high molecular weight and polar solvents. Most of those solvents have a relative high evaporation point which means it will take a long time to dry the inks.

Figure 20:
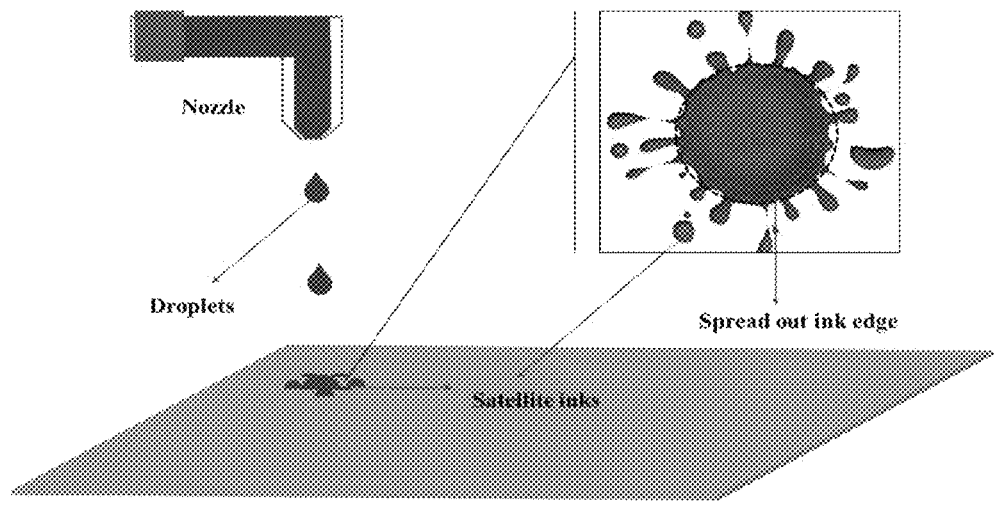
FIG. 20 illustrates satellite drop formations and rough edge caused by ink spreading over from printing low viscosity ink.
Figure 21:
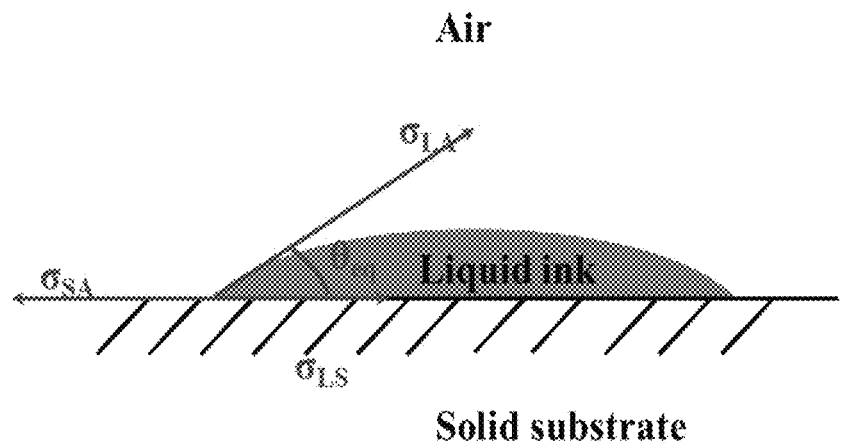
FIG. 21 illustrates a contact angle between liquid drops and substrate.

On the other hand, if the ink is too thin (low viscosity), satellite spots would be formed due to the impact between the droplet and substrate; also, low viscous ink may easily spread out over the substrate after inkjet deposition as shown in FIG. 20: the red dash line marks the original ink drop on the substrate after deposition. The rough edge is caused by ink spread out due to the low viscosity; the small satellites drops also formed during the ink deposition, both of satellite spots and rough edge lower the resolution of final patterns. Most of time, low molecular weight and non-polar solvents have low viscosity. These solvents with low vapor pressure can be evaporated very quickly. Fast evaporation of solvent too rapidly destroys the uniformities of ink formula, and potentially partially or totally clogs the nozzles due to the solute precipitation before droplet ejection. In order to make an ink with a property viscosity, ethanol, methanol, ethylene glycol, glycerol and polymers are used as viscosity adjusters. The recommended viscosity of inkjet printer in this research is 10-12 cp. The extended area that a drop wets the surface is usually described by its equilibrium contact angle (θeq in FIG. 21), which is defined as the angle between the liquid and solid interface as ink contact with the substrate. The liquid takes the shape which minimizes the surface energy of the system. Gibbs demonstrated that minimizing the free energy requires the minimization of the sum (ω) of three energies contributed by the three interfaces.

$$\Psi = \sigma_{LA} A_{LA} + \sigma_{SA} A_{SA} + \sigma_{LS} A_{LS} \qquad \text{Equation 1}$$

Where σ is the surface tension and A is the contact area (interface), the subscript LA, SA and LS are the liquid-air, solid-air and liquid-solid, respectively. For a plane, homogeneous surface, the minimization yields, where contact angles can be expressed as:

$$\cos \theta eq = \sigma SA - \sigma LS / \sigma LA \qquad \text{Equation 2}$$

Figure 22:
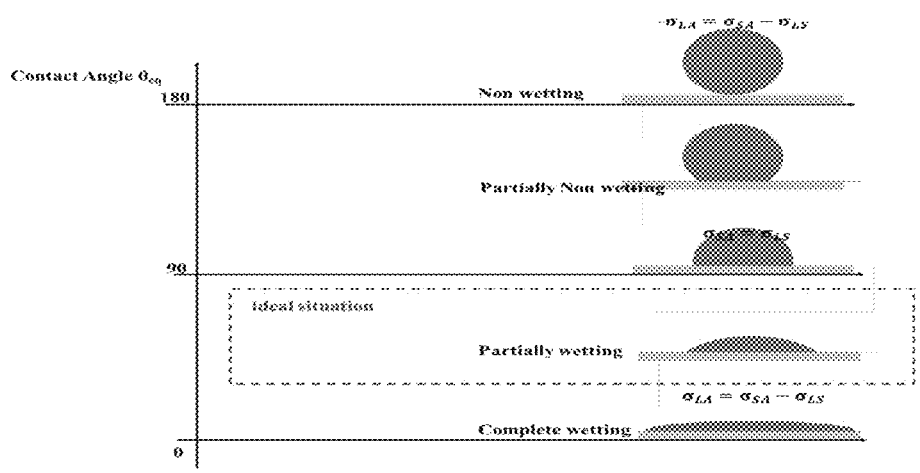
FIG. 22 illustrates wetting behavior of a liquid drop according to the contact angle ($\theta$).

This equation 2 is known as Young's Equation. The shape and size of the droplets on the substrate are controlled by the surface tension. The wetting situations after inkjet deposition are descripted in FIG. 22 and the ideal wetting situation is marked by red line where the contact angle is between 0° ~90°. In order to make a low contact angle, other chemical additives are necessary to adjust the surface tension of ink such as low surface tension solvent and surfactants.

III. Sintering Technologies

To form a continuous, stable and flexible film, particles/ particles precipitate from the solution must be sintered. Sintering is defined in the art as a process of joining particles together at a temperature below the melting point of the materials. The sintering process is especially important for conductive patterns fabrication. Good conductive cannot be achieved without sintering due to the huge physical contact resistance among particles. This is the reason there is low conductivity of carbon based ink because carbon based materials cannot be sintered easily. The conventional method to sinter metal nanoparticles is thermal heating. Because of the high surface-to-volume ratio due to the nano size effect, they are characterized by decreased melting temperatures (temperature depression).

For example, for silver and gold particles with a diameter around 2.5 nm, a reduction in melting point is estimated to be around 400° C. and 500° C., respectively However, the melting temperature for 1.5 nm gold particles is found to be as low as 380° C. (the melting point of bulk gold is 1063° C.). Even for particles of 20 nm diameter, the melting point was found to be significant lower than that of the bulk metal. Such a depression of the melting point makes metallic nanoparticles much "softer" than large particles at a certain temperature range which is below the melting point, and enhanced solid diffusion of the metal atoms induces initial neck formation between Nano particles (NPs) thus causing the emerging of particles to each other. Then the bonded particles are followed by grain growth and shrinkage with formation of a bulk phase.

Figures 23A, 23B, 23C:
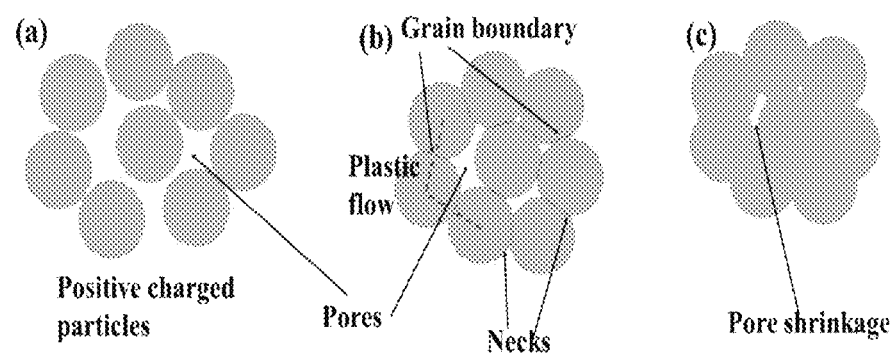
FIGS. 23A-23C illustrates thermal sintering process of metallic particles.

For conventional thermal sintering of metallic nanoparticles, three steps are possible: (a) after the evaporation of solvent, metallic nanoparticles settle down on the substrate. Some of them contact with each other while others do not as shown in FIG. 23A; (b) with the temperature rising, nanoparticles become much softer and getting closer to each other due to the volume expansion; in this time solid diffusion or plastic flow is activated near the grain boundaries, neck formation occurs between two particle as shown in FIG. 23B, but the existence of porosity among particles still make the film nonconductive; (c) with the temperature continuing to increase, pore shrinkage occurs because particles tend to merge together. Particle contact each other further and further in FIG. 23C. Nanoparticles are needed to formulate conductive ink particle suspension not just only to prevent nozzle clogging but also to enable easy sintering at relative low temperatures. Low temperature sintering is necessary for inkjet printing because commonly used substrates are flexible polymers which cannot survive at high temperatures.

However, nanoparticles may cause a serious problem: surface oxidation, which is caused by high chemical reactivity at nano size. The high melting temperature oxidized layers prevent particle sintering and also lower the thermal and electronical conductivity of the particle. New sintering technologies have been developed to promote sintering and eliminate oxidations in nanoparticle inks as introduced follow.

Figures 24A, 24B, 24C, 24D:
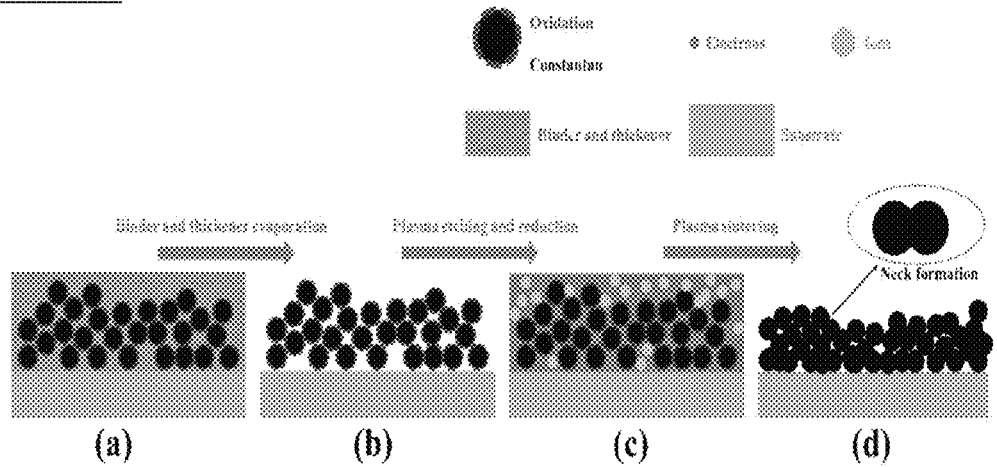
FIGS. 24A-24D illustrates plasma reduction and sintering process.

Plasma sintering can anneal metals at low temperature. FIG. 24A-24D shows the schematics of the plasma reduction and sintering process after inkjet printing. After inkjet printing, the patterns are transferred to vacuum ovens to evaporate the binder and thickener to increase the contact among nanoparticles as show in FIGS. 24A-24B. The dried patterns are treated under H2/Ar plasma for a while to remove the oxidized layer as shown in FIG. 24C. Also, during this process, the bombardment in the plasma can connect individual particles together (neck formation). This plasma "sintering" process as shown in FIG. 24D can anneal metallic nanoparticles patterns without damaging polymer substrates. Plasma sintering technology has been used to fabricate silver conductive tracks successfully in the art while other metals have not been reported. Plasma sintering depends strongly on the hardness of materials because it highly depends on the bombardments between the metallic particles and plasma ions. Silver is soft and exhibits a low melting temperature which make is ideal for plasma sintering; other metals usually have relative higher melting temperature or hardness.

Figure 25:
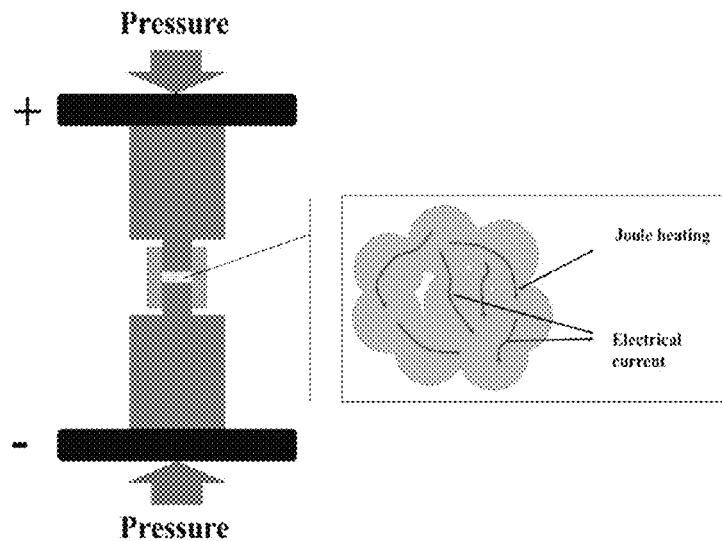
FIG. 25 illustrates a schematic of electrical sintering.

It is known that electric sintering is achieved by applying a voltage over the dried printed structure which causes current flow through the printed particles, leading to a local heating at particle-particle boundary. The whole process is shown in FIG. 25. When current passes through the nanoparticles, heating occurs between the interfaces of particles due to the high contact resistance. After the voltage pulse, necks can be formed among the particles due to the local thermal heating. In order to enhance the sintering effect, pressure is applied on the printed patterns to eliminate the space voids among the particles. The main advantages of this method are the short sintering time (from microseconds to tens of seconds) and room temperature processing which means this sintering method can be expanded to a range of printing substrates. However, the main disadvantage of this sintering method is obvious: it can only be applied on the conductive materials. Isolated materials cannot be sintered. Lots of metallic inks like copper and nickel are surrounded by non-conductive oxidation layers.

Photonic sintering is a low thermal exposure sintering method developed to sinter nanoparticle based thin films. The process uses a xenon flash lamp to deliver a high intensity, short duration (<1 ms) pulse of light to the deposited patterns. Subsequently light absorption by the printed metallic layer results in its heating which leads into evaporation of liquid, and nanoparticles sintering as displayed in FIG. 26. This method is mainly used to sinter silver and copper nanoparticles which have relative low melting temperature.

Figure 26:
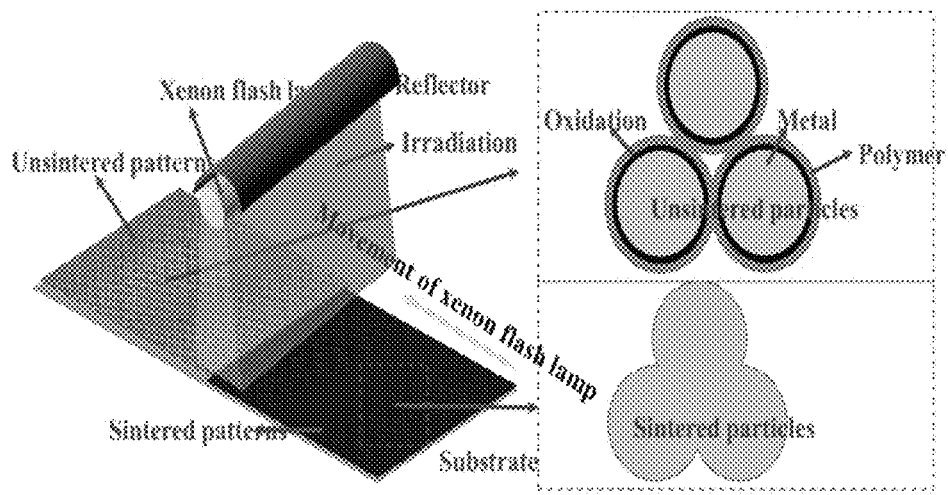
FIG. 26 illustrates a schematic of photonic sintering.

Generally, the metallic nanoparticles are surrounded by oxidation layers due to the Nano sized effect. The oxidation has high melting point and poor thermal and electrical conductivity which makes particle impossible to sinter and have poor properties after sintering. In order to remove the oxidation layers and enhance the sintering result, suitable amounts of reducing capability polymers are added to the ink. Oxidation reduction occurs when intense pulse light passes the printed patterns as shown in FIG. 26. The advantages of photonic sintering are it can be operated at room temperature in a short time. Also, photonic sintering can achieve roll to roll processing which makes it excellent sintering method in industrial production.

Figure 27:
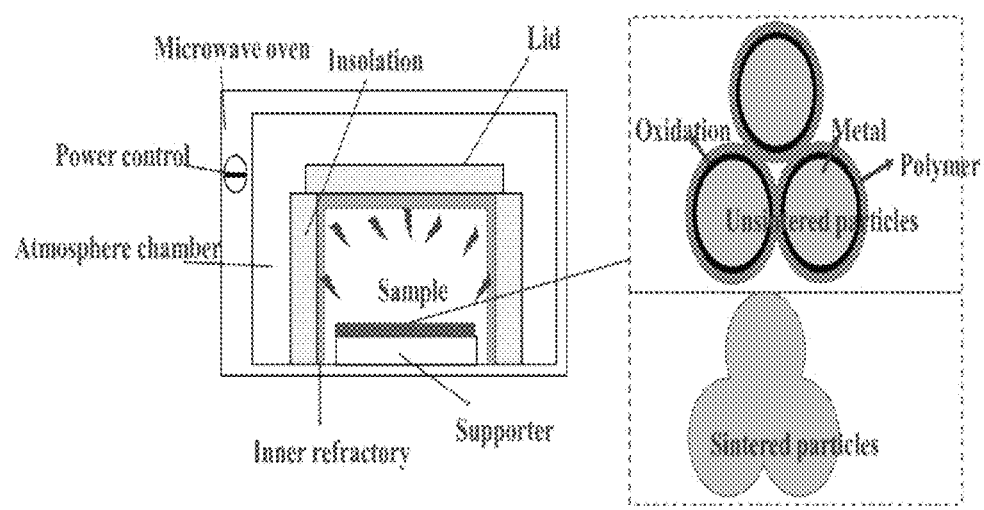
FIG. 27 illustrates a schematic of microwave sintering.

Flash microwave sintering process is developed to sinter printed patterns as shown in FIG. 27. Metals can be sintered by microwave radiation in a short time. Another advantage of this sintering method is it combines chemical reduction when microwave is illuminating the pattern. However, this method has a very small penetration depth: the penetration depth has been shown at 2.54 GHz for Ag, Au, and Cu ranges from 1.3 to 1.6 μm. The printed thickness must smaller than the penetration of the microwave in order to cure the inner materials. Since inkjet printed conductive tracks meets this requirement, this technology must be adapted for industrial manufacturing.

IV. Printing Conductive Films

In recent years, there has been more attention to the fabrication of conductive inks with the development of printing technology in electronic industry. Generally, nanoparticle suspensions and particle-free inks have all been developed to make conductive tracks. The basic fabrication process of suspensions is to disperse solid metallic particles in organic/inorganic solvents. Solid particles are deposited on flexible substrate by printer, and then the printed pattern is sintered to make crackless films.

Traditional methods require ultra-small (below 50 nm) solid particles and high sintering temperature. Because the working temperature of substrates for conductive ink is usually below 400° C. which is a relative low temperature for thermal sintering, the temperature depression for sintering in nano-sized particles is advantageous for processing on plastic substrates. This limits the application of conductive ink due to the complexity of the synthesis of size qualified particles especially for alloy particles.

Metallic nanoparticles can oxide in the air very easily, so typically the sintering process is performed in hydrogen reducing atmosphere which is a high flammable gas with safety issues. Various sintering methods are developed to cure conductive inks such as microwave, plasma and photonic sintering to interconnect particles as mentioned above. All those sintering methods need complex instruments and safety protection.

Another approach is a particle-free ink; soluble metal source precursors and reducer are dissolved in solvent. After deposition by printer, conductive track is formed during thermal sintering process by chemical reducing reaction. Particle-free ink depends on the solubility of metal precursor in solvent; it is not effective scalable pathway for massive products in industry.

On the other hand, particle-free conductive inks can only make pure metal tracks; it is impossible to make particle free alloy ink. The most printable conductive inks are summarized in Table 2. Gold is the most conductive metal which can be sintered very easily (thermal sintering in air). However, gold ink suffers the expensive cost which can only applied in small amounts.

Aluminum ink is fabricated from aluminum hydride which is a very unstable (air and water sensitive) and chemically flammable. This makes aluminum ink impossible to print in air. Carbon black, carbon nanotubes and graphene inks have high resistance due to non-sintered property of carbon. Silver, copper and nickel inks are promising for the conductive tracks: silver has relative high conductivity per volume and mass; also silver ink requires simple sintering process without protecting atmosphere. Compared with silver, copper and nickel inks have much lower cost without sacrificing too much conductivity. However, for conventional inks in the art, both of copper and nickel need to be sintered with protecting atmospheres.

TABLE 2

Summary of Various Inks

| | Relative conductivity per unit volume | Relative conductivity per unit mass | Surface Resistance (printed) Ω/sq |
|---|---|---|---|
| Gold | 0.7 | 0.33 | $5 \times 10^{-1}$ |
| Silver | 1.05 | 0.9 | $5 \times 10^{-2}$ |
| Copper | 1 | 1 | 10 |
| Aluminum | 0.4 | 1.3 | 1.5 |
| Nickel | 0.24 | 0.25 | 50 |
| Carbon black | 0.00001 | 0.00004 | 132 |
| Graphene | 0.0003 | 0.0012 | 65 |

V. Flexible Lithium-Ion Batteries

Energy storage devices are illustrated in FIG. 28A. Based on the currently known power sources, shown in FIG. 28A, Li-ion batteries are the prime candidate to meet these requirements, however, this disclosure is not so limited to Li-ion batteries and includes other batteries and conductive material that may utilize the technology disclosed.

Rechargeable lithium-ion batteries have a higher energy density than most other types of rechargeable batteries. This means that for the same volume or weight they can store more energy than other rechargeable batteries. Lithium-ion batteries are expected to provide an energy return factor higher than that assured by conventional batteries, e.g., lead-acid batteries which are shown in FIG. 28B. In its most conventional structure, a lithium-ion battery shown in FIG. 29A contains an anode, a cathode formed by a lithium metal oxide or phosphate, and an electrolyte which is typically a lithium salt such as LiPF6 dissolved in an organic solvent such as ethylene carbonate. Between the anode and cathode is a semipermeable separator. FIG. 29A shows a typical lithium-ion battery configuration. The graphite electrode is typically deposited on a copper current collector while the cathode material is typically deposited on an aluminum current collector. The cathode and anode react according to the Equations (3) and (0.4) reactions:

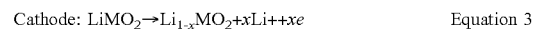

Cathode: $LiMO_2 \rightarrow Li_{1-x}MO_2 + xLi+ + xe$     Equation 3

Anode: $xLi_+ + xe- + 6C = Li_xC_6$     Equation 4

While Li-ion batteries have enabled the growth in the portable electronics, further improvements are needed to meet the high specific energy demands required by uninterruptible power supplies and electric vehicles. To increase the capacity of Li-ion cells, materials with higher specific capacities than those currently used for the electrodes will be needed. FIG. 29B shows the effect of electrode capacity on the overall capacity of a cell. It should be noted that this estimation is based solely on the weights of the active materials, i.e., the weight of the cell case, separators, and current collectors, etc. are not considered. However, it provides a useful comparison of the effect of changing one or both electrodes. Currently, Li-ion cells consist of a LiCoO2 cathode (capacity of 155 mAh/g) and a graphite anode (capacity of 372 mAh/g) which is displayed in FIG. 29B. The combination of these electrodes leads to a cell capacity of 109 mAh/g.

In addition to the overall growth in the use of batteries, there is a parallel trend to develop mechanically flexible batteries. Form factor is becoming a major driver shaping innovation and transforming the energy storage industry through the emergence of new applications such as wearable electronic devices, flexible displays, conformal sensor networks, implanted medical devices, micro-vehicles and the Internet of Things, which demand thin profiles and flexibility. Mechanically flexible batteries are typically fabricated as thin flat sheets, enabling the batteries to conform to odd-shaped spaces. The mechanical flexibility of these batteries enables product designers with a range of possibilities. For example, electronically controlled drug delivery systems or wearable medical sensors could be wrapped around a wrist or arm. Conformal flexible battery sheets can be attached to or inserted into various shapes enabling them to conform to the packaging shape of a hand-held device thereby providing power for electronic devices. Limited flexible battery technology is already being used in the next generation of credit cards and security cards known as 'smart cards' or 'powered cards'. These cards utilize the batteries to power embedded memory chips or microprocessors. Flexible batteries can also be used to power Radio Frequency Identification (RF-ID) sensory devices by providing local power for the integrated sensors.

The main challenges in flexible energy storage devices are the design and mechanical properties of current collectors, as well as the fabrication of flexible electrode materials with high capacity and electrical conductivity. The mechanical flexibility of the batteries is predominately determined by electrodes/current collectors.

To meet the high cell capacity and mechanical flexibility requirements outlined above, a printable high energy capacity cathode material is disclosed in conjunction with high energy capacity silicon anode to increase the overall cell capacity. The second major theme of the battery development described herein is to use printing technology to pattern electrode structures to improve battery cycling lifetime and flexibility. The third theme is to use water based processing for the inks to eliminate the need for organic solvents and binders. Following is an overview of the cathode, anode, and binder materials. The conventional positive materials for lithium-ion batteries are: olivine, layered and spinel structured crystals are shown in FIG. 30. The classification of the structure is based on the lithium ion diffusion pathways inside the crystals. The typical 1D structure positive material is LiFePO4 (LFP) which is an excellent candidate material for Electric Vehicles (EVs) and Hybrid Electric Vehicles (HEVs) due to the relative easy obtain row materials and cheap cost of fabrication, high capacity, non-chemical toxicity and outstanding thermal stability. The main drawback of LFP positive material is poor rate capacity due to the limitation of lithium ion diffusion pathway. Also, LFP has very low electronic conductivity.

Typical 2D structure positive materials including: layered transition metal oxide materials, such as $LiCoO_2$, $LiNiO_2$, $LiNi_{1/3}Co_{1/3}Mn_{1/3}O_2$ and $LiNi_{0.8}Co_{0.2}O_2$, suffer a drawback of oxygen evolution in the high delithiated state which—despite their high theoretical capacities—could cause severe thermal runaway of the cell leading to low practical energy capacity.

Considering the lithium rich manganese-based (LRM) layered materials $xLi_2MnO_3 \cdot (1-x)Li[Ni_{1/3}Co_{1/3}Mn_{1/3}]O_2$ as an example, these materials have attracted increasing attention as a promising high-capacity cathode with an anomalously high discharge capacity of more than 250 mA·h/g through the activation of $Li_2MnO_3$.

However, the commercial application of LRM cathodes in Lithium-ion batteries is hindered by several drawbacks including poor cycle life, low thermal stability and a gradual voltage drop during cycling. $LiMn_2O_4$ (LMO) is the typical 3D spinal cathode materials for lithium-ion batteries. The theoretical capacity is competitive with existing materials and in the 4V region. The 3D structure has relative high ion diffusion which flavors a high rate capacity. However, there are some problems with the material that leads to a slow capacity loss and need to be solved: the dissolution of divalent Mn and oxygen from the host structure in the high-voltage region, this can lead to a loss of active cathode material. LMO also suffers degradation during cycling over the high-voltage two-phase region (approx. $Li_{0.5}Mn_2O_4$-λ-$MnO_2$). The widely used method to modify cathode materials is the surface carbon coating in order to increase the electronical conductivity among particles during charging and discharging. However, the carbon coating method obviously helps nothing in the lattice electronic conductivity or chemical diffusion coefficient of lithium within the crystal.

Another modification is ion doping: Substitution of a small quantity of elements inside positive materials by other ions to improve the kinetics of lithium ion diffusion and change the crystal lattice which can enlarger the pathway of lithium ion, this can improve the capacity delivery, cycle life, and rate capability. However, such doping usually lowers the battery's capacity due to the incorporation of inactive elements into the cathode. A coating approach can also improve rate capability and cycle stability for Li-rich layered oxides. But the highly continuous coating on the surface of particles is not realistic to obtain during practical processing.

In the below experiments and examples, $LiNi_{1/3}Co_{1/3}Mn_{1/3}O_2$ (NMC) is used as the cathode materials to make printable positive electrode considering the stability and relative good performance. Carbon-based anodes are the most popular for lithium-ion batteries. Lithium ions are basically stored inside the layers structure which is shown in FIG. 31A. In order to achieve higher energy density for lithium-ion batteries, there is great interest in replacing carbon-based anode materials with silicon or silicon-based compounds FIG. 31B. When compared to graphite-based $Li_1C_6$ with a specific capacity of 372 mAh/g, the fully lithiated lithium-silicon phase, $Li_{22}Si_5$, exhibits a theoretical specific capacity of ~4200 mAh/g. When cells are made with silicon-based anodes, high capacity is observed initially. However there is a significant decrease in capacity as the cells experience charge/discharge cycles. The decrease in capacity with cycling has been attributed to two main phenomena: decrepitating and continuous formation of an impermeable solid electrolyte interphase (SEI) layer which are descripted below. In carbon based anodes, the Li+ ions are intercalated between graphite planes, with minimal expansion. For silicon-based anodes, the Li forms a series of alloys with silicon, each with a different molar volume. As Li+ enters and leaves the silicon material during cycling, there is a significant volume change as the alloy composition and associated molar volume varies. The fully lithiated alloy, $Li_{22}Si_5$, undergoes a >300% volume expansion compared to silicon alone. The main drawback to silicon anodes is its cycle performance. Failure of the Si anodes is mainly caused by the large volume expansion/contraction during lithium insertion/extraction because the intermetallics of Li/Si have much greater molar volume than the nanostructure Si phase. Volume change can cause stress gradient inside Si particles. Large stresses induced by the repetitive volume expansion and contraction can cause cracking and pulverization of the Si anodes resulting in the loss of electrical contact between them. Stress development in electrode materials is one of the primary causes of performance degradation (capacity fade) and failure of Li-ion batteries. It represents a major bottleneck in the development of new high-capacity electrode materials for Li-ion batteries. Solid-electrolyte interphase (SEI) film formation which results from the decomposition of electrolytes is another important factor in the battery performance, which leads to irreversible capacity loss. Large volume changes crack the SEI films and expose Si to electrolytes repeatedly, thus facilitating the continued growth of SEI films. As a result, active Si particles are isolated by the electric-insulated SEI films and the anode's electrochemical activity degrades. Another anode materials for lithium anode is $Li_4Ti_5O_{12}$ (LTO) (as displayed in FIG. 31C. The theoretical capacity of LTO is around 175 mAh/g with a flat charge/discharge potential plateau at 1.55 V, the charge-discharge plate is due to the stable Ti4+/Ti3+ redox couple versus and experiences zero-strain during lithium intercalation/deintercalation. LTO also has other advantages such as cheap and green raw materials, excellent safety, structural stability, high rate capabilities and long cycle life.

$Li_4Ti_5O_{12}$ is used in the below experiments and examples of the present invention. For lithium-ion batteries, the binder serves two primary functions: (a) holding the active materials and conductive agent (e.g., carbon black)

into a cohesive, conductive film; (b) adhering the conductive film to the current collector. Poly-vinylidene fluoride (PVDF) has been a widely employed as a binder for electrodes in Li-ion batteries due primarily to its electrochemical stability over a large voltage range (window voltage of the battery). PVDF is insoluble in water and slurries are prepared industrially with an organic solvent, N-methyl-pyrrolidone (NMP). Several studies show that NMP, while an excellent solvent for PVDF, is dangerous to humans and the environment ("United States Environmental Protection Agency", 2006). Traditional methods which use PVDF as a binder for lithium-ion batteries require a process of recovery and treatment for the organic vapors. Furthermore, the NMP solvent or another organic system is flammable which increases potential danger during electrodes fabrication which means strict control must be introduced to ensure safety. Also, humidity is another problem for organic solvent system (water <2%). This requires severe water control system and associated high costs. The last problem is PVDF itself: fluorine is one of the degradation products in the battery that produces a stable LiF phase. The choice of liquid electrolyte could accelerate the formation reaction of LiF and other harmful products with double bond (C=CF—). Furthermore, self-heating thermal runaway can be induced. Lastly, some research has indicated that PVDF has strong binding but low flexibility which limits its applicability as a mechanically flexible power source. The low flexibility of PVDF can easily deteriorate the battery's cycle life characteristics due to breaking of the mechanical bond between active materials during the expansion/contraction process which occurs during charging and discharging.

Figure 32:
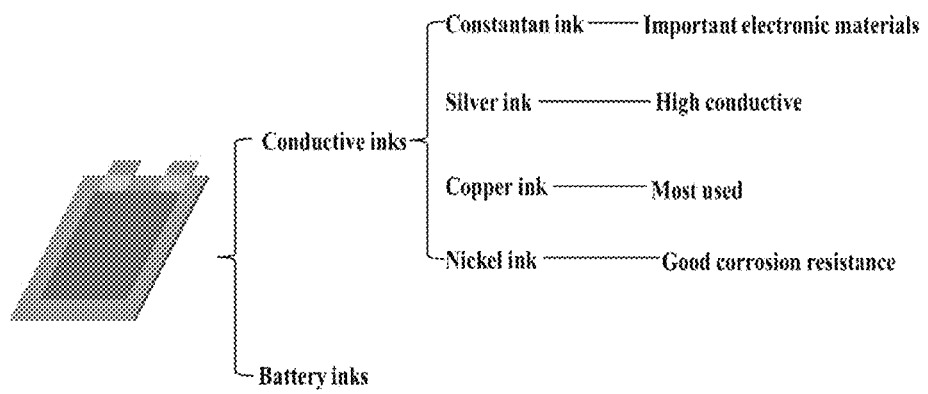
FIG. 32 illustrates a graphic of various conductive inks studied and battery inks.

The separator in battery is used to prevent circuit short due to contact between the anode and cathode while lithium ions can pass through the separator to achieve the electrochemical reaction. Also thermal stability and mechanical flexibility are also required to prevent some extreme conditions. The most commercially used porous polymer separators for lithium-ion batteries are made of polyethylene (PE) or polypropylene (PP). However, most polymer separators do not have thermal stability which can cause thermal deformation and lead to energy runaway or even worse accident. Additionally, polymer separators could easily be penetrated by lithium dendrite formed at high rates or long-term cycling uses, which can cause circuit short or possible fire eventually. Moreover, polymer separators usually have poor wettability in organic solvent electrolytes due to their hydrophobic property. In order to overcome those problems, surface modification is introduced on the commercial polymeric separator: (1) inorganic filled polymer composite separators; (2) inorganic coating on polymer composite separators. Although the inorganic/organic separator can improve the safety and stability of batteries, the mixture still has low mechanical flexibility and thermal stability due to the polymer separator bulk. Other disadvantage of polymer separator is impossible to print polymers with micro porous structure. Pure inorganic separators have been used in the past to replace the polymer separator. Also, inorganic materials can be adapted into the printing technologies to make thin porous separator. In contrast, it is not easy to print porous organic separator. ZnO and ZrO2 are used to make printable separators in the below experiments and examples. Furthermore, the below examples illustrate the use, among other things, of flexo printing, conductive color changing inks and conductive colorless inks V. Overview of Experiments FIG. 32 illustrates the overview of experiments conducted. In order to make printable batteries, both conductive inks and battery inks are studied as shown in FIG. 32. Several metallic inks are studied constantan ink, silver ink, copper ink and nickel inks. Constantan is an important electronic material widely used in sensors and resistors due to its unique physical properties: low temperature coefficient. Silver has high electronic conductivity which is a perfect material for the conductive film, moreover, as an precious metals, silver share common properties as gold like high conductivity, relative low melting points that make it easily to be sintered, chemical stability and high corrosion resistance in air. Furthermore silver is less expensive compared to gold based materials. Copper is the most widely used material in electronics due to high property price ratio. In order to meet the extreme condition inside the lithium-ion batteries (high operating voltage, chemical corrosion and conductivity requirements), nickel ink is also studied in the below experiments. The battery inks are made of battery active materials with carbon black conductive agent. Battery inks are deposited on the suitable conductive films based on the results of conductive inks research to make electrodes for the lithium-ion batteries.

Fabrication of Particle Free Silver Ink

Silver film made by thermal decomposition and chemical reduction are compared. The effect of additive of sodium carboxymethyl cellulose in the silver ink is also investigated. Silver citrate is used as silver precursor which can be decomposed to silver above 100° C. Silver citrate is much safer than silver nitrate in making silver ink because it will not produce explosive silver iodide, and it has almost the same silver content (silver citrate: 63 wet. %, silver nitrate: 64 wet. %). Dimethylformamide (DMF) is used as a mild reductant to reduce silver complex in aqueous solution by silver mirror reaction.

Example 1

Materials—

All of the chemical reagents used in the experiments were purchased from commercial sources with analytical purity and used without further purification. Silver citrate, ammonia, propanol alcohol, sodium carboxymethyl cellulose (NaCMC) and dimethylformamide (DMF) were purchased from Sigma Aldrich, USA. Kapton® was from Dupont Company, USA.

Synthesis of Particle Free Silver Ink (a) Thermal Decomposable Silver Ink without NaCMC:

The solvent for ink was made by mixing 0.01 g deionized (DI) water and 0.01 g ammonia. 0.01 g silver citrate was added to the solvent, the mixture was bath ultrasonicated for 15 min to produce silver ammonia complex. The final viscosity was adjusted by adding propanol alcohol to meet the requirement of printer, volume ratio of water to propanol alcohol is fixed at 1:1. A clean and transparent particle free solution was formed.

(b) Thermal Decomposable Silver Ink with NaCMC:

0.15 wet. % NaCMC solution was prepared by dissolving NaCMC in DI water at 50° C. and magnetic stirred for 30 min. 0.01 g of NaCMC solution, 0.01 g ammonia and 0.01 g silver citrate were mixed, the mixture was ultrasonicated for 15 min to produce silver ammonia complex. The viscosity of silver ink was adjusted by adding propanol alcohol. The final NaCMC concentration is 0.05%. NaCMC was used as polymer capping agent and film former.

(c) Chemical Reductive Silver Ink with NaCMC:

The solvent for chemical reductive ink was prepared by dissolving NaCMC in ammonia, the concentration of NaCMC in ammonia is 0.15 wet. %. Then 0.01 g of NaCMC ammonia solution, 0.01 g DMF and 0.01 g silver citrate were mixed and ultrasonicated for 15 min to produce silver ammonia complex. The viscosity was adjusted by adding propanol alcohol to 10 cp. The final NaCMC concentration is 0.05%.

Fabrication of Conductive Patterns by Nanoparticle Ink:

Conductive patterns were prepared from the particle-free inks by inkjet printing (DMP-2800, Fujifilm, USA) on a Kapton substrate. The substrate was washed by propanol alcohol and DI water to remove all the organic contaminants on the surface. The printed patterns were first dried in air at 100° C. for 30 min to evaporate liquid solvent. The dried patterns were then sintered at 225° C. in for 30 min on the thermal plate. The films then cooled to room temperature.

Characterization X-Ray Diffraction (XRD)

XRD measurements were carried out on a Philips PW3040 X-Ray Diffractometer, 2θ ranges from 10° to 80° with CuK_α radiation (λ=15.4 nm) with a step size of 0.02° and a time per step of 15 s. Scanning Electron Microscope (SEM) LEO 1530VP Field Emission SEM instrument was used to observe the surface morphology of printed patterns. Resistivity Measurement The resistivity of the patterns was measure by fore point probe. The thickness of the patterns is confirmed by SEM to calculate the resistivity. Thermal Analysis Thermogravimetric analysis (TGA) and Differential thermal analysis (DTA), STA 449 F1 Jupiter from Netzsch, Inc. USA, were used to study the thermal behavior of different inks and chemical reaction processes. Measurements were carried out in air with a temperature rise of 5 K/min. Tape Testing Adhesive strength is measured by tape testing. A scotch tape was sticked on the surface of the silver patterns and peeled off up to five times.

Example 1 Results

Effect of NaCMC Surfactant

The effect of NaCMC surfactant on silver film fabrication is studied. CMC was found to be a very effective water soluble polymer stabilizer against aggregation. The main principle is negative charged carboxyl radicals (—COO—) in NaCMC solution bind on the positive charged metallic particles, the attached polymer layer can provide a strong electrostatic or steric repulsions to cancel the attractive van der Waals to prevent agglomeration.

Figures 33A, 33B, 33C, 33D:
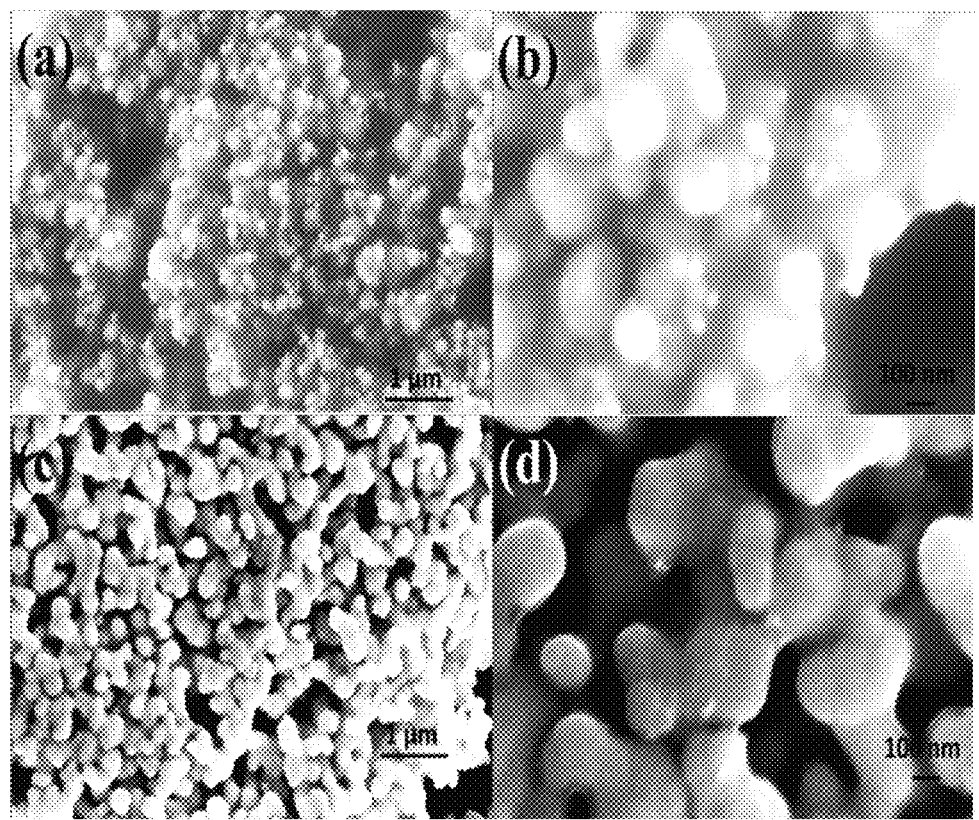
FIGS. 33A-33D illustrate photomicrographs from scanning electron microscope (SEM) of silver.

FIG. 32 shows the SEM images of silver film made by thermal decomposition without NaCMC and thermal decomposition with NaCMC at different magnifications. The particle size is not uniform without NaCMC additive from FIG. 33A-33B. Also the large particles are not sintered very well. The silver film becomes more uniform after adding NaCMC from FIG. 33C-33D. This can be explained by Ostwald ripening process which occurs in drying process without NaCMC additive. Small silver citrate crystals dissolve, and redeposit onto larger silver crystals. In contrast, NaCMC can adsorb on silver citrate crystals and prevent Ostwald ripening, which can produce smaller crystals. The Ostwald ripening process is bad for film formation because it leads to an inhomogeneous structure and large silver citrate particles are hard to be sintered. However, the silver film still exhibits significant porosity after sintering even with the help of NaCMC. This is caused by the volume shrinkage of silver citrate after thermal decomposition. Generally, production of silver from silver citrate thermal decomposition has two steps: (a) deposition of silver citrate on the substrate; (b) disproportionation reaction of silver citrate to produce silver film. The volume of each silver particle from silver citrate disproportionation reaction can be calculated: the silver content is about 63 wt. % based on the calculation from the silver citrate chemical formula (C6H5Ag3O7), and the density of the silver is three times greater than silver citrate salt, so the volume of a single silver particle is only 20% of the original silver citrate particle from the thermal decomposition. Even though the thermal decomposition can produce nano particles which require low sintering temperature, we still cannot get a dense structure due to the volume shrinkage of silver and mass of porosity during the disproportionation reaction; the space porosity structure makes the relative lower conductivity of final products. FIG. 33 SEM images of silver made by: (a) and (b) thermal decomposition without NaCMC; (c) and (d) thermal decomposition with NaCMC.

Figure 34:
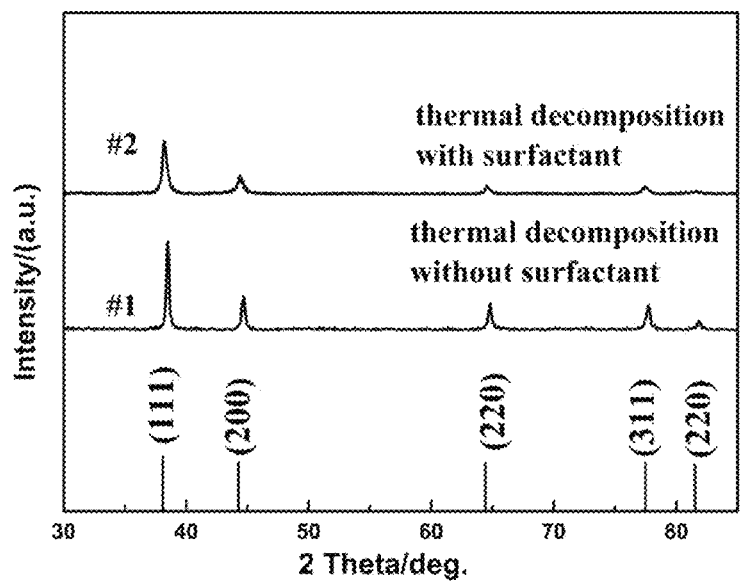
FIG. 34 illustrates a graph showing x-ray diffraction (XRD) patterns of silver made by thermal decomposition without and with NaCMC.

FIG. 34 shows the XRD patterns of silver after thermal sintering: silver films made by thermal decomposition of silver citrate without/without NaCMC additive are marked by #1, and #2, respectively. All of them show at 2θ of 38.1°, 44.3°, 64.4°, 77.5°, and 81.5° index as (111), (200), (220), (311) and (222) (JCPDS file No. 04-0783) reflections of the Fm-3m space group without any significant impurities. This means slight NaCMC additive has no effect on the space structure of final silver. However, the intensity if XRD peaks drops significantly after adding NaCMC from #1 and #2 patterns. The particle size and the width of XRD peaks have a reciprocal relationship according to Scherrer's Equation which means that larger particles give sharper signals. This confirms the Ostwald ripening process with no NaCMC additive as mentioned above: NaCMC can reduce and unify particles size effectively.

Effect of DMF Reductant

Figures 35A, 35B, 35C, 35D:
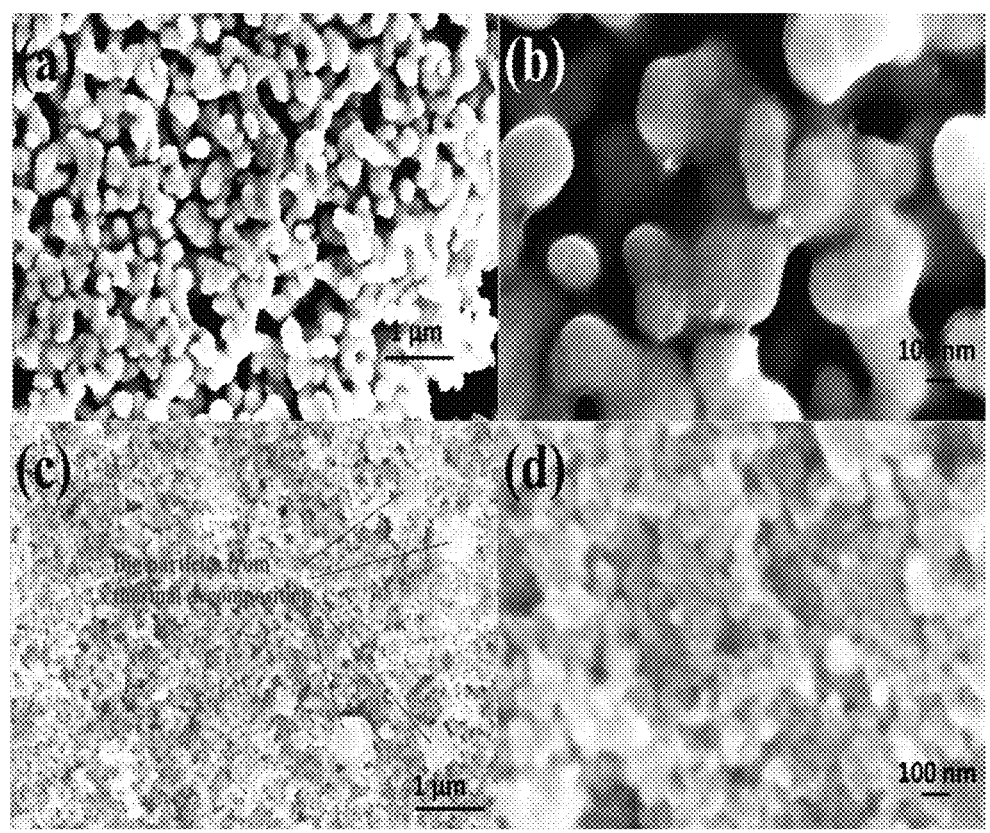
FIGS. 35A-35D illustrate photomicrographs from scanning electron microscope (SEM)
Figures 36A, 36B:
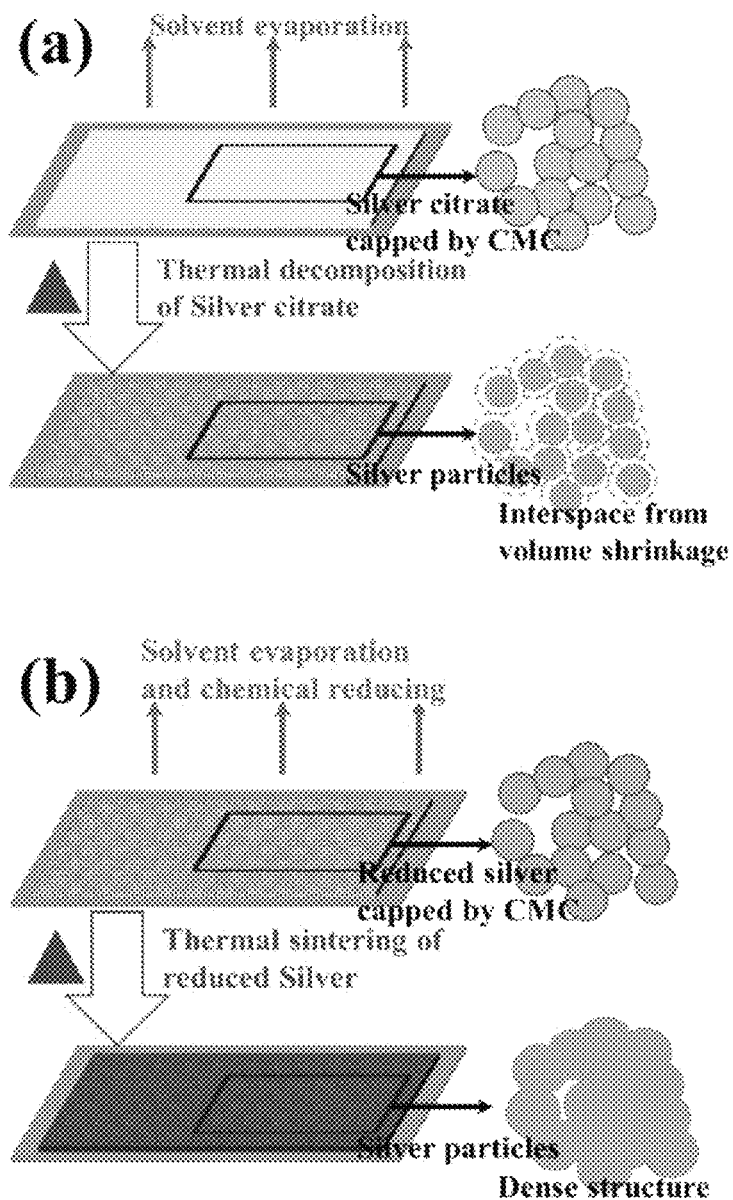
FIGS. 36A-36B illustrate a scheme of silver films made by thermal decomposition and chemical reduction, respectively.

FIGS. 35C and 35D show the SEM morphologies of silver particles reduced by DMF. Silver particles synthesized by thermal decomposition are also displayed in FIGS. 35A and 35B in order to compare. Volume shrinkage leads to the porous and discontinuous structure as discussed in FIG. 36A. The most of inter porous structure disappears the conductivity of printed silver patterns. However, silver films made by chemical reduction are significantly denser with much smaller particle size than those made by thermal decomposition. The original particle size is below 50 nm which is half of the particle size made from thermal decomposition. This suggests silver particles are formed in the solution as shown in FIG. 36B. The chemical reduction has two steps: (a) silver reduction in the DMF solution during low temperature drying process; (b) deposition of silver instead of silver citrate on the substrate which can make denser and more continuous structure after solvent evaporation. Smaller size particles benefit from thermal sintering due to the temperature depression at nano size. Moreover, smaller particles can give a denser structure which can increase the conductivity of silver patterns.

Figures 37A, 37B:
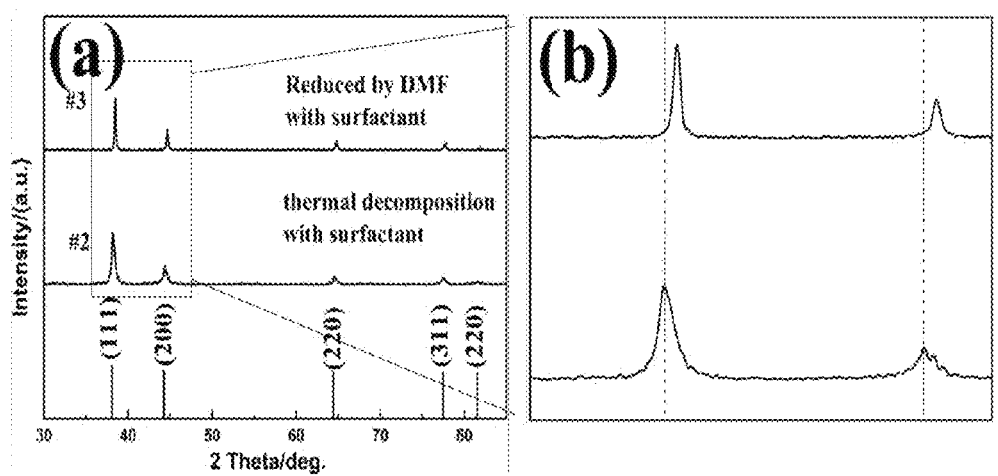
FIGS. 37A-37B illustrate graphs having XRD patterns of silver made by thermal decomposition with NaCMC; and chemical reduced by DMF with NaCMC, respectively.

FIGS. 37A-37B shows the XRD patterns of silver synthesized by thermal decomposition and DMF reduction. Both methods can produce pure silver without any impurities. FIG. 37B presents the detail of XRD from 2θ=35° to 55°; silver signals made by DMF reduction shift to higher degree than thermal decomposition as displayed in FIG. 37B.

The high angle shift indicates smaller crystal size which is confirmed by SEM results. Smaller crystals benefit thermal sintering and higher conductivity in the final printed patterns. Thermogravimetric analysis (TGA) and Differential thermal analysis (DTA) are carried out to study the thermal decomposition and chemical reduction processes.

Figures 38A, 38B:
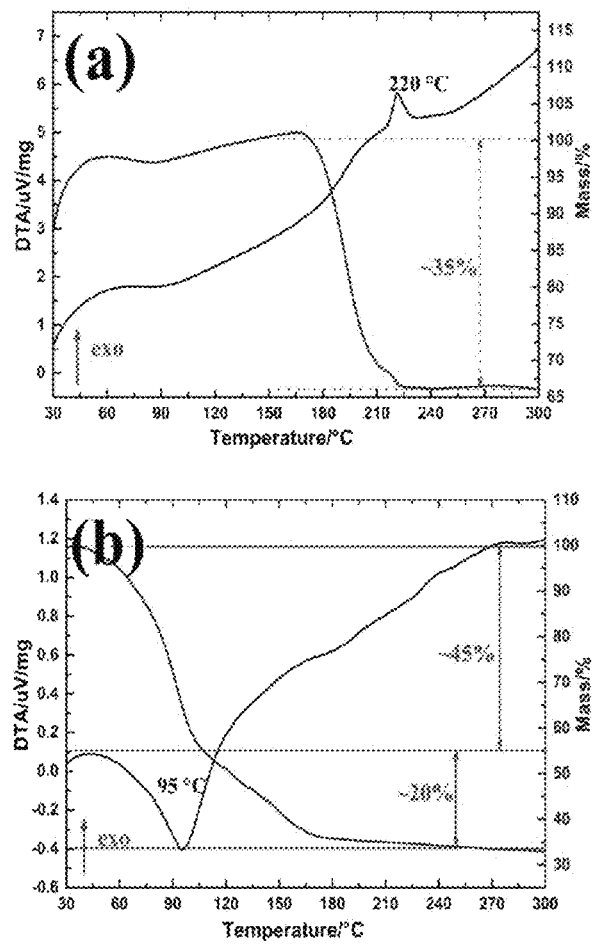
FIGS. 38A-38B are graphs that illustrate thermogravimetric analysis (TGA) and differential thermal analysis (DTA) of silver citrate powder and silver citrate conductive ink reduced by DMF with NaCMC, respectively having samples tested in air with a temperature rise rate of 5° K/min and wherein "exo" in the graphs denote an exothermic reaction.
Figures 39A, 39B, 39C, 39D:
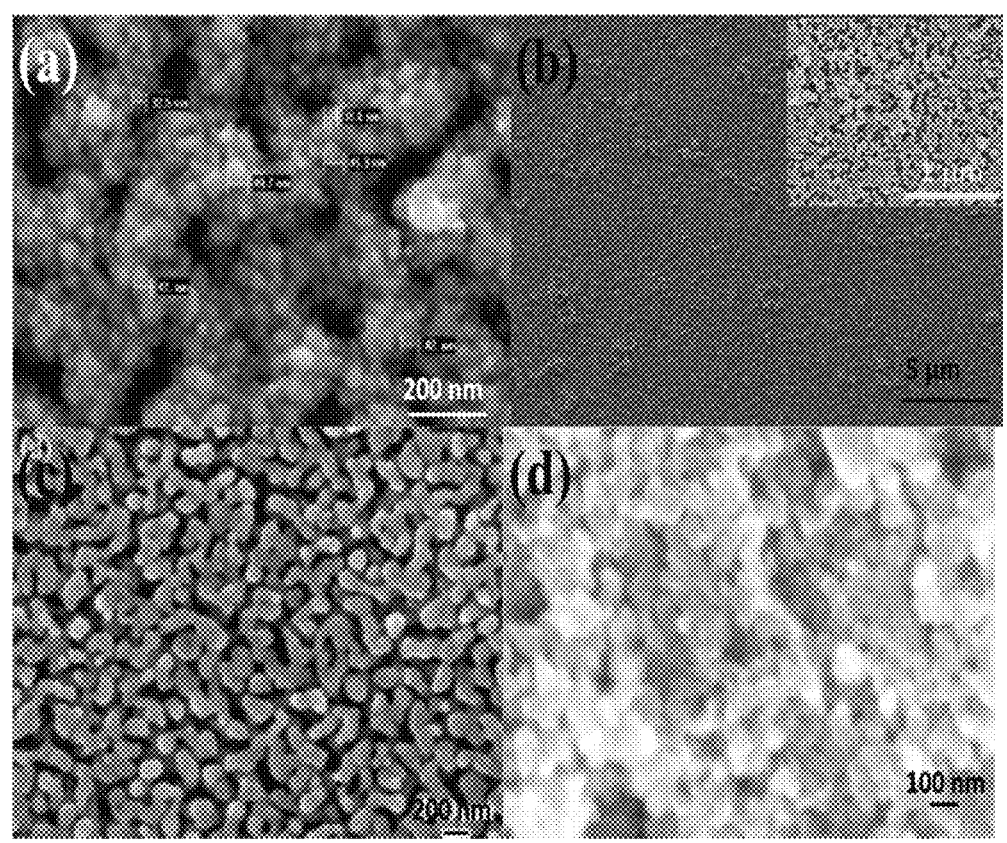
FIGS. 39A-39D are photomicrographs of surface morphology of references shown in FIGS. 39A-C; and in FIG. 39D silver patterns synthesized.

FIG. 38A indicates that thermal decomposition temperature of silver citrate powder is at approximately 220° C. with heat releasing.

DTA of silver citrate shows the mass loss is around 35% which corresponds to elements loss in citrate (C6H5O7)3. DTA and TGA results are similar to a previous report (Nie et al., 2012). DTA in FIG. 37B shows that the chemical reduction of silver ions occurs at 95° C. which is even lower than the evaporation temperature of water solvent, which means DMF can reduce silver ions very effectively. TGA in FIG. 38B displays two mass loss steps: the first mass loss is from 30-95° C. corresponding the formation of silver particles in water solvent; the second mass loss step between 95-160° C. attributes the evaporation of water solvent.

The mass loss in two steps is not exactly equal to the water and citrate content which might be associated with the dissolve of ammonia (formed from Equation (3)) and thermal decomposition of carbamic acid in Equation (4). The silver remaining is around ~25% which is close to the theoretical silver content 20%.

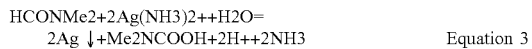

$$HCONMe_2 + 2Ag(NH_3)_2^+ + H_2O = 2Ag\downarrow + Me_2NCOOH + 2H^+ + 2NH_3 \quad \text{Equation 3}$$

$$Me_2NCOOH \rightarrow CO_2 + Me_2NH \quad \text{Equation 4}$$

Comparison with Other Researchers

Previous reported data of silver patterns made by various silver inks are listed in Table 2 for comparison. The sintering temperature ranges from 75-300° C. (only one is sintered at 961° C.) with sintering time 5-60 min. Silver particle-free ink requires lower sintering temperature compare with silver nanoparticle ink, and there is no concern for nozzle clogging during the printing. Silver particle free ink can also skip silver nano particles synthesis process which usually requires a strict chemical process. Silver citrate is an excellent precursor to make silver particle-free ink due to its high silver content compare with other precursors (Silver neodecanoate ($Ag(C_{10}H_{19}O_2)$): 39 wt. % silver; $AgO_2C(CH_2OCH_2)3H$: 38 wt. % silver), the lower silver content gives the more porous final products (as shown in FIG. 39A-39D) with poorer conductivity.

The NaCMC additive also contributes to unify and reduce the particle size: NaCMC adsorption on silver particle controls the final shape and prevents aggregation (compare FIGS. 35B and 35D); NaCMC is also a good film former contributes to the adhesion of silver patterns on polymer substrate. Chemical reducing is more efficiency to make dense silver patterns with high conductivity compared with thermal decomposition displayed in FIG. 39C. The volume shrinkage and porous structure cannot be avoided due to the density difference between silver precursor and silver.

The silver patterns fabricated from this recipe have the lowest electrical resistivity although some researchers have more competitive sintering conditions (lower sintering temperature and shorter sintering time). The resistivity of silver made by chemical reducing process is almost half compared to the silver made by thermal decomposition, which is caused by less porosity.

TABLE 3

Resistivity of Silver Films Fabricated by Different Silver Inks

| Silver source | Status | Sintering temp (° C.) | Sintering time (min) | Resistivity (μΩ · c m) | Source |
|---|---|---|---|---|---|
| Bulk silver particles | 5-7 nm | 300 | 10 | 3 | Fuller, et al. (Fuller, Wilhelm, |
| Bulk silver particles | (1-10 nm) | 300 | 15 | 35 | Szczech et al. (Szczech, Megaridis, |
| Bulk silver (10-50 nm) | (10-50 nm) particles | 150-260 | 3 | 16 | Hsien Hsueh Leeet al. (Hsien-Hsueh et - |
| silver | Bulk | 961 | — | 1.61 | (Dong et al., 2015) |
| Silver oxalate | Particle-free | 150 | 30 | 8.6 | Yue Dong et al. (Dong et al., 2015) |
| Silver nitrate | Particle-free | 250 | 10 | 7.41 | Jung Tang Wu et al. (J.-T. Wu, Hsu, Tsai, & |
| Silver neodecanoate | Particle-free | 150 | 5 | 9 | Angela L. Dearden et al. |
| $AgO_2C(CH_2OCH_2)_3H$ | Particle-free | 130 | 30 | 9.1 | Stephan F. Jahn et al. (Jahn et al., 2010) |
| Silver nitrate | Particle-free | 100 | 60 | 13.7 | Jung Tang Wu et al. (J.-T. Wu, Hsu, Tsai, & |
| Silver citrate | Particle-free | 150 | 50 | 17 | Xiaolei Nie et al. (Nie et al., 2012) |
| Silver nitrate | Particle-free | 200 | 30 | 8.5 | Dongjo Kim et al. (D. Kim, Jeong, Lee, Park, & Moon, |
| Silver oxide | Particle-free | 75 | 20 | 6.1 | Shih Pin Chen et al. (S.-P. Chen et |
| This work (thermal decomposition) | Particle-free | 225 | 30 | 5.7 | |
| This work (reduced by DMF) | Particle-free | 225 | 30 | 3.1 | |

Figures 40A, 40B, 40C, 40D, 40E, 40F:
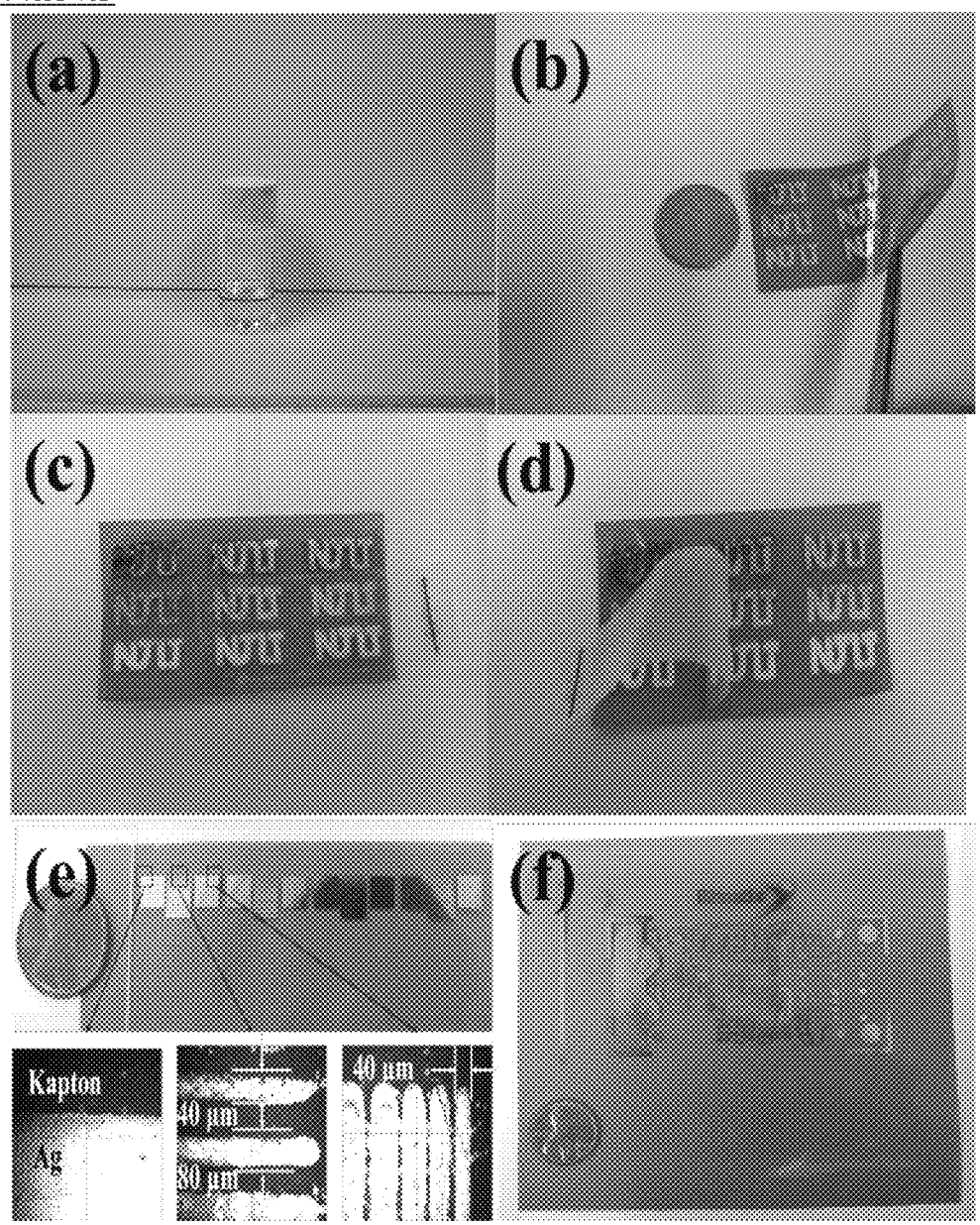
FIGS. 40A-40F are images, for FIG. 40A particle-free silver ink (chemical reduction with NaCMC) kept at room temperature for 3 days.
Figures 41A, 41B, 41C, 41D, 41E, 41F, 41G:
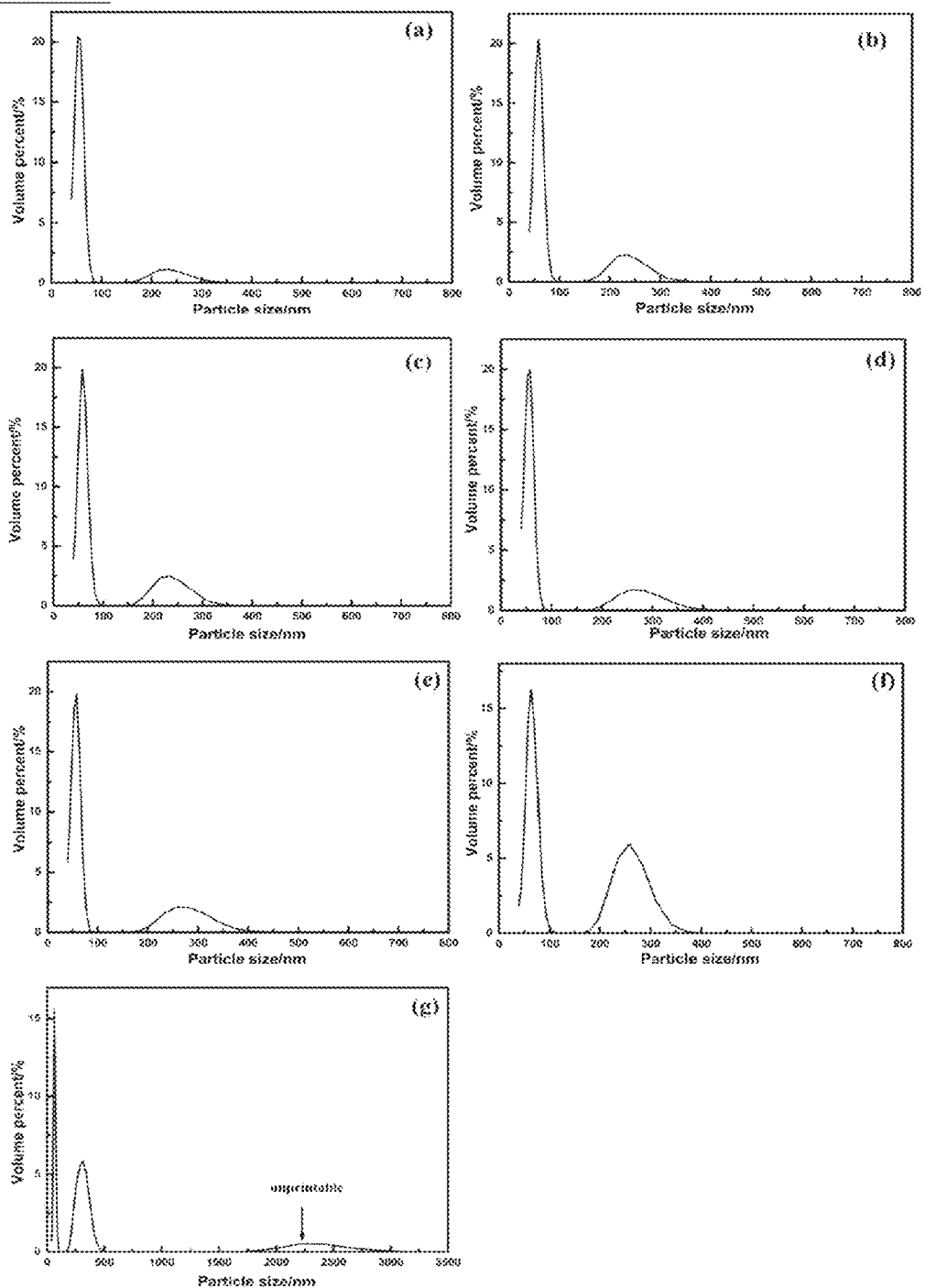
FIGS. 41A-41G illustrates graphs having particle size of ink numbers 1-7.

FIG. 40A shows the photograph of synthesized chemical reductive particle-free silver ink kept for 3 days at room temperature. The ink remains colorless and transparent without any precipitation suggests good stability. Depending on the embodiment dyes or other color additives may be used in the colorless ink to provide for color changes depending on the need. The colorless ink provides for additional uses due to its clarity. "NJIT" metallic shiny patterns are made by inkjet printing, for example, on flexible Kapton® substrate as shown in FIG. 40B. Other printing techniques may be utilized as well as other flexible substrates depending on the implementation. The mean width of patterns is 1 mm No peeling off or cracking occurs while bending the patterns, which indicates a good flexibility of the printed patterns for circuits and sensors.

A tape test is performed to inspect the adhesion of synthesized silver patterns on Kapton® substrate in FIGS. 40C and 40D. The printed patterns stay completely and smoothly after removal the tape suggests very strong adhesion between the patterns and Kapton® substrate. FIG. 40E illustrates that the resolution of patterns made by silver ink is 40 μm.

A small circuit board is also printed and shown in FIG. 40F, the printed circuit board exhibits fine appearance and can be used in microelectronics, sensors and smart cards.

In summary, colorless particle-free silver ink for printing is synthesized and compared by two major processes: thermal decomposition of silver salts and chemical reduction of silver complex. Both of processes can produce pure silver without impurity. Examination of SEM images of silver films made by chemical reduction exhibit denser and more continuous structures than those made by thermal decomposition. The porous structure is caused by the volume shrinkage during silver precursor disproportionation reaction. Also, chemical reduction can make silver films at relative lower temperature compared to the thermal decomposition of silver citrate. The synthesized silver film has excellent electronic conductivity and adhesion compared to other reported research. The testing also indicates that NaCMC plays crucial role in the final particle size and uniformity. No peeling off and cracking of the printed silver patterns occurred when the film is bended with a large radius. These results suggest that the ink made by chemical reduction is an attractive possibility for the flexible electronics fabrication.

Fabrication of Constantan Ink

Interest in printed circuits, sensors, electronics and radio frequency identification tags which are fabricated via liquid based "ink" have grown considerably in recent years. Generally, the functional ink is made of metallic nanoparticles (NPs) dispersed in organic/inorganic solvents. By using the functional fluid, inkjet printing technology is a promising method to deposit metallic nanoparticles on polymer substrate with designed patterns.

The printed patterns are typically annealed via thermal, microwave, plasma and photonic sintering methods to fabricate crack-free films. It is important to have the patterns annealed at low temperature in order to protect flexible polymer substrates. The most widely used inks are made of silver and gold noble NPs due to the low melting temperature and chemical stability in air.

Constantan ($Cu_{55}Ni_{45}$) nickel-copper alloy is known for its excellent thermo-electrical properties. Constantan is generally used for precision resistors, thermocouples and strain gauges with low temperature coefficient of resistivity (TCR). However, this material suffers surface oxidation which has been a serious impediment to the development and application of constantan in inkjet printing technology. Also, its high melting temperature of constantan (1221~1300° C.) makes it hard to sinter especially at low temperatures. The high melting temperature oxidation layers of constantan further complicate the sintering of constantan. The sintering process of constantan usually requires a reducing atmosphere which is flammable gas, for instance hydrogen and methane. Reducing gas with high temperature dangerous and expensive to achieve and maintain in industry. The below example demonstrates a novel and safe chemical process to anneal the inkjet printed constantan patterns at low temperature without using a flammable reducing gas.

Example 2

Materials

The constantan powder used in the ink formulation is commercially available with particle size around 100 nm purchased from American Elements, USA. The ammonia chloride (NH4Cl), glycerol, Polyvinylpyrrolidone (PVP), potassium hydroxide and thiourea dioxide are all obtained from Sigma-Aldrich, USA. All chemicals are analytical grade and used as received without further purification.

Characterization X-Ray Diffraction (XRD)

XRD measurements were carried out on a Philips PW3040 X-Ray Diffractometer, 2θ ranges from 10° to 80° with CuK_α radiation 15.4 nm) with a step size of 0.02° and a time per step of 15 s. Scanning Electron Microscope (SEM) LEO 1530VP Field Emission SEM instrument was used to observe the surface morphology of raw materials and printed patterns. Resistivity Measurement The resistivity of the patterns was measure by fore point probe (Jandel CYL-HM21, USA). The thickness of the patterns is confirmed by SEM to calculate the resistivity. Thermal Analysis Thermogravimetric analysis (TGA) and Differential thermal analysis (DTA), STA 449 F1 Jupiter from Netzsch, Inc. USA, were used to study the thermal behavior of different inks and chemical reaction processes. Measurement was carried out in air with temperature rise 5 K/min. Laser Particle Size Analyzer The particle size was measured by Beckman Coulter N4 Plus laser particle size analyzer, Beckman, USA. Water was used as media and ultra-sonication was carried during measurement.

Ink Formulation

The constantan ink for this example is made by water, glycerol, PVP and constantan nano powder. Water is the solvent which is cost effective and safe; PVP is used as binder and surfactant; glycerol is used to adjust the final viscosity. Different constantan, PVP and water weight ratio are studied (Table 3) labeled as 1, 2, 3, 4, 5, 6 and 7. All the inks are ultra-sonicated for 30 min to disperse constantan into the water.

TABLE 4

Ink Formulation

| label | Constantan (wt. %) | Water (wt. %) | PVP (wt. %) |
|---|---|---|---|
| 1 | 10% | 85% | 5% |
| 2 | 15% | 80% | 5% |
| 3 | 20% | 75% | 5% |
| 4 | 25% | 70% | 5% |
| 5 | 30% | 65% | 5% |

TABLE 4-continued

| | Ink Formulation | | |
|---|---|---|---|
| label | Constantan (wt. %) | Water (wt. %) | PVP (wt. %) |
| 6 | 35% | 60% | 5% |
| 7 | 40% | 55% | 5% |

Figure 42:
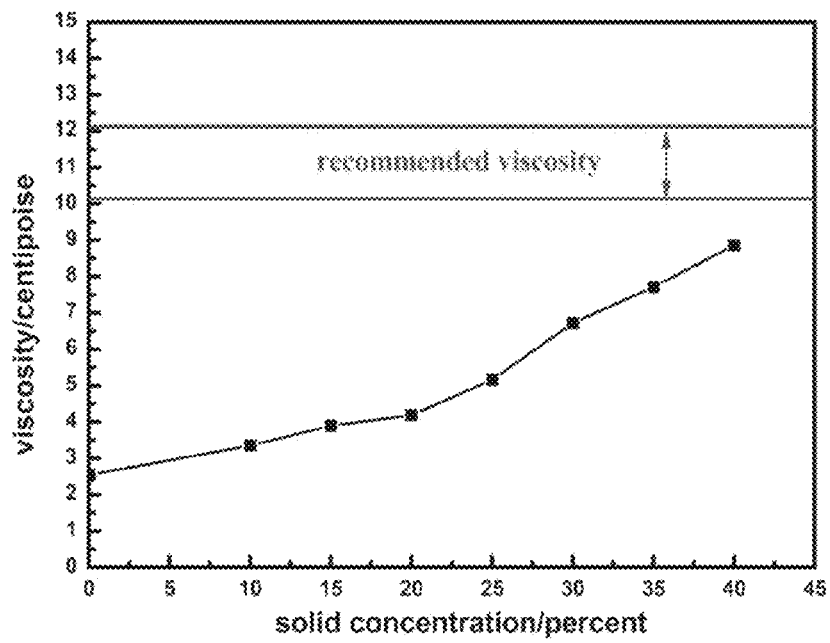
FIG. 42 is a graph illustrating viscosity of ink with different solid fraction.

FIG. 41A-41G illustrates the particle size after ultra-sonication. Particle size increases with increasing solid fraction. The suitable particle size for DMP-2800 inkjet printer is below 450 nm. So ink 6 is chosen to be the final formulation. Viscosity of those inks is checked by viscometer as shown in FIG. 42 Viscosity increases with increasing solid fraction, but none of them meets the requirement of DMP-2800 inkjet printer (12-14 cp). So glycerol is added to the ink to make it printable (only 6th ink is studied). Final ink formulation is: Constantan suspension: water:glycerol:constantan:PVP=12:5:7:1 by weight.

Patterns are printed by a DMP-2800 inkjet printer (Fujifilm, Japan) on Kapton film at room temperature. The printed patterns are first dried at 180° C. in vacuum and then sintered in vacuum furnace at 350° C. in vacuum.

Figure 43:
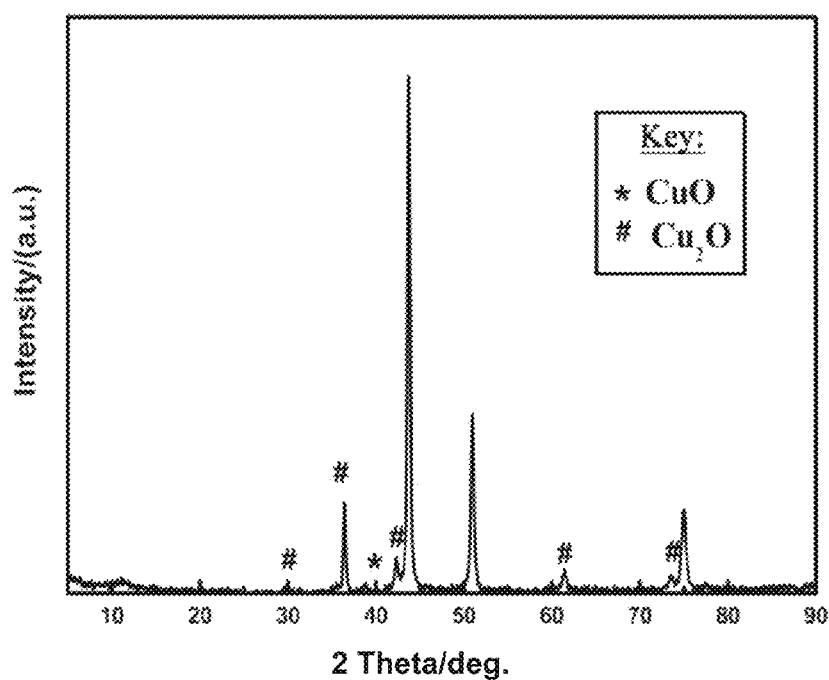
FIG. 43 is a XRD graph showing patterns of constantan patterns after sintering in vacuum.

FIG. 43 shows XRD pattern of the final printed samples sintered in vacuum. Cu2O and more CuO are found in sample. Considering samples are dried and sintered in vacuum environment, the impurities are introduced in ink fabrication and even printing process. The resistivity of sample is tested and it is found to be infinite, which indicates oxidation invalidated the constantan sample. The above results indicate regular constantan ink cannot be sintered due to the oxidation layers which are introduced during ink preparation and the inkjet printing process. A popular method used to sinter metallic inks which have oxidation layers is forming gas sintering. However, forming gas is quite dangerous especially for massive production. A novel chemical method is introduced herein to make conductive constantan ink on plastic substrate which can be sintered in vacuum without using forming gas.

Figures 44A, 44B, 44C, 44D:
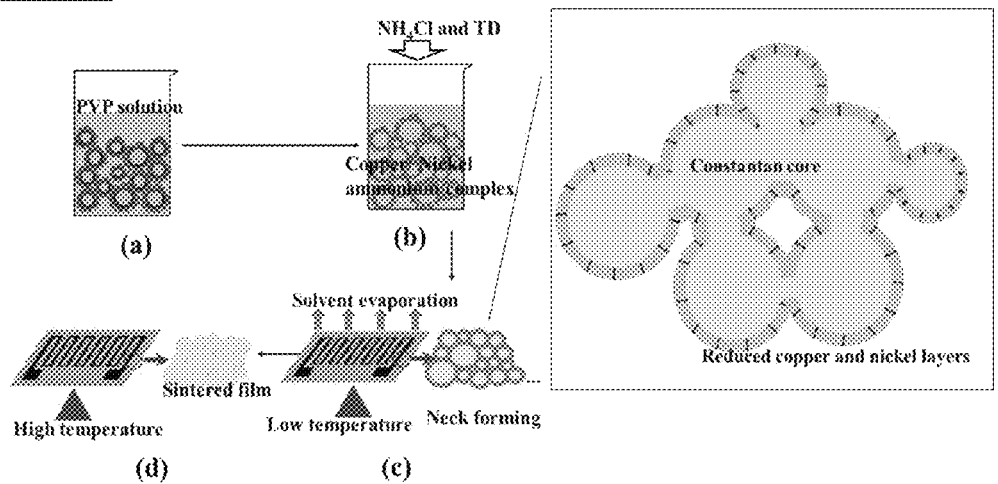
FIGS. 44A-44D are schematics of sensor fabrication.

FIG. 44A-44D shows the scheme of fabrication process. 4 g Constantan NPs and 0.3 g PVP are dispersed in 4 g water by ultra-sonication for 30 min as shown in FIG. 44A. Large particles are separated by centrifuge 5000 RPM for 5 min. NH4Cl is added into the suspension to etch away surface oxidation (CuO and NiO), the suspension is magnetically stirred for 12 h to dissolve the oxidation completely; a copper/nickel ammonia complex is formed in the meanwhile in FIG. 44B. Thiourea dioxide (TD) and KOH solution (1 mol/L) is added into that suspension as the reductant in FIG. 44C. Viscosity is adjusted to 10 cp using glycerol as the thickener. The suspension then is magnetically stirred for 30 min to make uniform ink. As a control comparison, a separate batch of ink is formulated: constantan NPs and PVP are dispersed in glycerol/water solvent by ultra-sonication for 30 min, which contains: 40 wt. % constantan powders, 40 wt. % water, 20 wt. % glycerol and 3 wt. % PVP binder.

Patterns are printed by a DMP-2800 inkjet printer (Fujifilm, Japan) on Kapton® film at room temperature. The printed patterns are first dried at 180° C. in vacuum as shown in FIG. 44C to evaporate water and thickener. It is known that thiourea dioxide can reduce most Cu2+ and Ni2+ with presence of OH— around 80° C. Constantan particles are then surrounded by the reduced copper and nickel due to the wettability. Samples are then sintered at 350° C. in vacuum. The reduced copper and nickel have high surface energy and tend to merge to each other to form "necks". With the growth of necks, the solid diffusion among constantan particles is activated by the reduced copper and nickel. Finally, annealed constantan film is obtained in FIG. 44D named sample with chemical reduction sintering (CRS) process. Also, the control ink without TD and KOH (i.e. without the chemical reduction sintering (CRS) process) is sintered under the same conditions as the sample containing TD/KOH.

Example 2 Results

CRS Process Research

Figure 45:
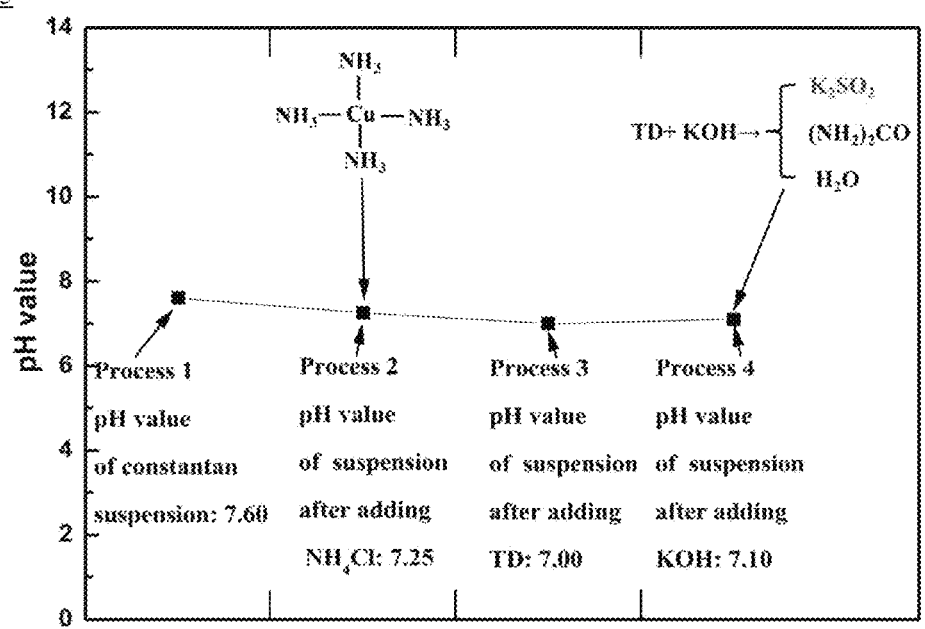
FIG. 45 illustrates the pH value changes during ink fabrication.

The measured pH value change of the ink during fabrication is shown in FIG. 45. The pH value of constantan/water/PVP dispersed is around 7.60 in process 1. In process 2, there is no significant pH change after adding ammonia chloride (NH4Cl) into the constantan suspension. This confirms the formation of copper/nickel ammonia complex, because NH4Cl solution is acidic if no copper/nickel ammonia complex is formed. The pH value drops down a little after adding TD into the suspension in process 3.

Surprisingly the pH value remains the same after adding KOH into the suspension which suggests chemical reaction between TD and KOH at room temperature is:

$$(NH_2)_2CSO_2 + 2KOH = (NH_2)_2CO + K_2SO_2 + H_2O \qquad \text{Equation 5.}$$

Adding KOH has no effect on pH value according to Equation (5). The high chemical active $SO_{22-}$ released from Equation (5) (marked red in FIG. 45) can reduce copper/nickel ammonia complex at high temperature in basic environment as in Equation (6):

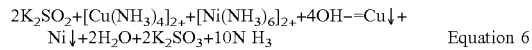

$$2K_2SO_2 + [Cu(NH_3)_4]_{2+} + [Ni(NH_3)_6]_{2+} + 4OH^- = Cu\downarrow + Ni\downarrow + 2H_2O + 2K_2SO_3 + 10N\,H_3 \qquad \text{Equation 6}$$

Thermogravimetric analysis (TGA) and Differential thermal analysis (DTA) are carried out to study the sintering process of two constantan inks. All samples are tested in inert atmosphere; "exo" is an abbreviation for exothermic reaction. TGA in FIG. 46A have three main mass losses: (a) before 150° C.: is due to the evaporation of water which is around 40 wt. %, this process is corresponding to endothermic peak (1) in DTA curve; (b) between 150 and 250° C.: is the evaporation of glycerol which is 20 wt. % and corresponding to endothermic peak (2) in DTA; (c) between 300° C. and 450° C.: is the thermal decomposition of PVP binder, however, there is no obvious signal detected from DTA, this might be caused by the small quality of binder. A weak endothermic peak is detected in DTA around 600° C. without any mass loss in TGA curve; this weak endothermic peak might be the sintering process of constantan powder. 600° C. is above the melting temperature of most polymers. In contrast, a DTA peak shoulder in area (1) in FIG. 46B indicates a possible chemical reaction happens below 110° C. TD in basic environment has high reducing ability which can reduce Ni2+ in aqueous. In this case, TD can also reduce Ni2+ and Cu2+ which are produced from NH4Cl etching. Also, the slope changes around 110° C. in TGA curve (marked with black dash line) suggests a light mass change, this is caused by the H2O and NH3 produced from copper and nickel reduction as shown in Equation (6).

Figures 46A, 46B:
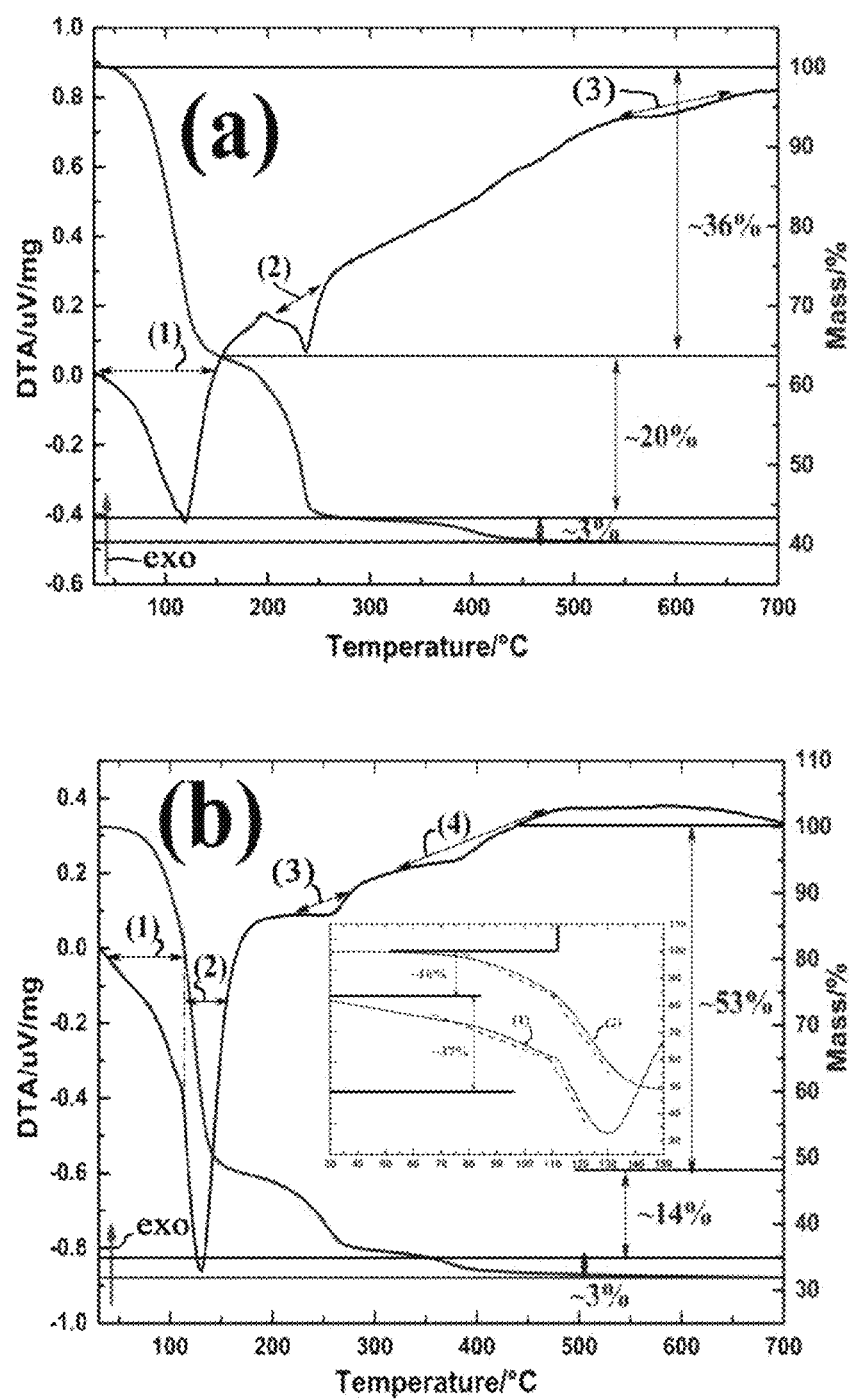
FIGS. 46A-46B illustrates thermogravimetric analysis (TGA) and differential thermal analysis (DTA) of in FIG. 46A constantan ink without CRS; and in FIG. 46B constantan ink without CRS, the graphical insert in FIG. 46B is the details between 30~150° C. with all samples tested in argon gas with temperature rise rate of 5° K/min.

Endothermic peaks (2) and (3) in FIG. 46B are representing water and glycerol evaporation as discussed above. A wide Endothermic peak (4) is detected between 350–400° C. This might be caused by solid diffusion between copper, nickel and constantan particles. DSC and TGA results suggest chemical reduction can lower the sintering temperature effectively and sinter constantan without damaging the polymer substrate.

Figure 47A:
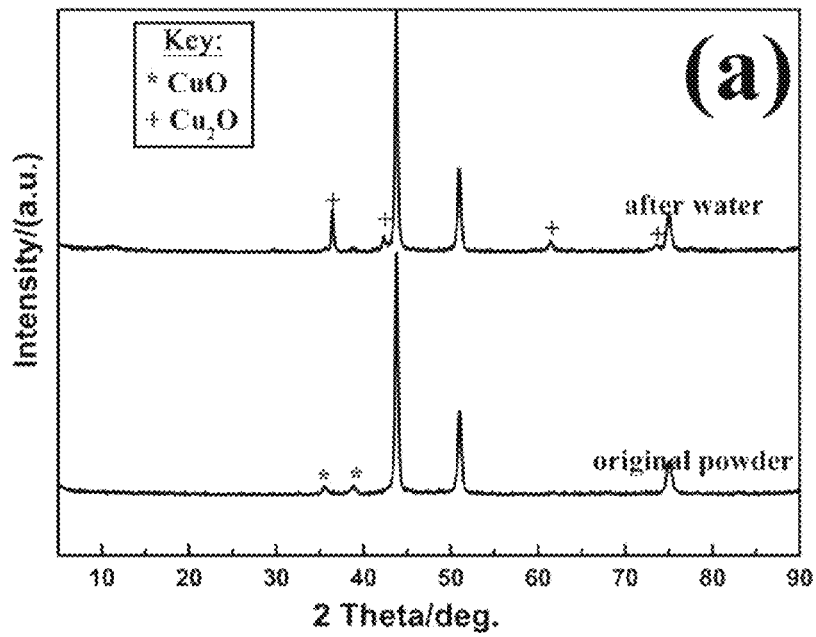
FIGS. 47A-47B illustrates XRD patterns shown in FIG. 47A of constantan particles with oxidation and dried ink without CRS; and shown in FIG. 47B ink with CRS dried at 180° C. and sintered at 250° C. in a vacuum.
Figure 47B:
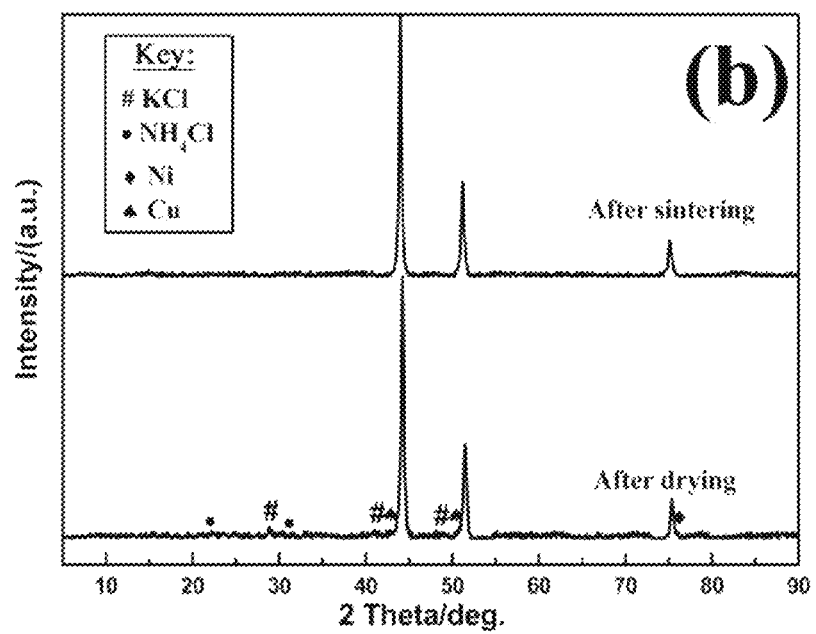
Figures 48A, 48B, 48C, 48D, 48E, 48F:
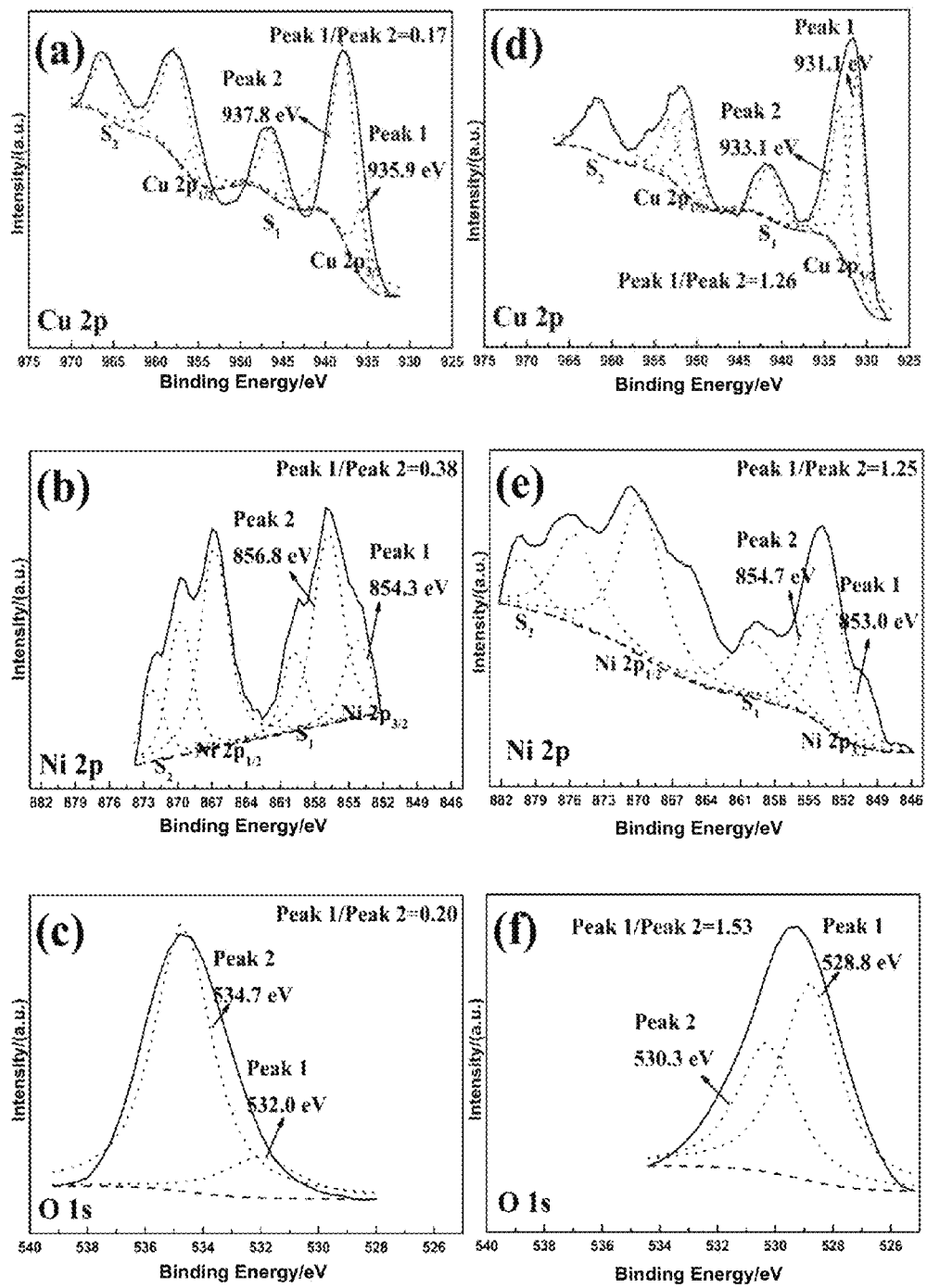
FIGS. 48A-48F illustrates graphs showing x-ray photoelectron spectroscopy (XPS) spectra of sintered constantan film.

FIGS. 47A-47B shows the XRD patterns of different samples. The oxidation is inevitable during constantan synthesis process in FIG. 47A. The oxidation has low thermal and electronic conductivity which would prevent solid diffusion during thermal sintering process of constantan. Dispersing constantan particles in water during ink fabrication can make it worse as shown in FIG. 47A where most of the impurities are CuO and $Cu_2O$. In contrast, the CRS process can remove most of the oxidation at low temperature in FIG. 47B. Weak pure nickel and copper signals are observed as we predicted before and some NH4Cl is left in the sample.

After high temperature sintering at vacuum, no $NH_4Cl$ could be found in XRD patterns due to the chemical decomposition. The sharp XRD peaks of final constantan patterns after CRS process is known to suggest fine and larger crystal structure.

To have a good understanding of TD reducing process during the designed chemical process, XPS is used to analyze the surface of synthesized constantan film synthesized with/without CRS process (FIG. 48A-48F). Cu 2p 3/2 can be deconvoluted into two peaks: low binding energy peak which originates from metallic copper atom, while high binding energy is bonding with oxygen ion in FIGS. 48A and 48B. The peak area ratio of copper to copper oxide obtained from constantan film without/with CRS process is 0.17 and 1.26, respectively. Also, Cu 2p 3/2 signal with CRS process constantan film shifts toward lower binding energy significantly compared to the samples without CRS process. XPS of Cu 2p 3/2 indicates less oxidation after CRS process.

The same phenomenon can be seen from Ni 2p3/2: Ni2+ peak shifts to lower binding energy and decreases significantly with CRS process in FIGS. 48C and 48D. O 1s can also be deconvoluted into two peaks: a low binding energy peak which originates from the adsorbed oxygen on the sample, while high binding energy is from oxidation status (CuO and NiO) in FIGS. 48E and 48F. The peak area ratio of oxygen to oxidation obtained from constantan film without/with CRS process is 0.20 and 1.53, respectively. XPS results can be explained by two reasons: (a) the CRS process can remove/reduce oxidation effectively; (b) The CRS process is an efficacious method to sinter constantan because sintered constantan is more resistant to oxidation (no nano size effect) compared to nano sized constantan.

Figures 49A, 49B, 49C, 49D, 49E, 49F:
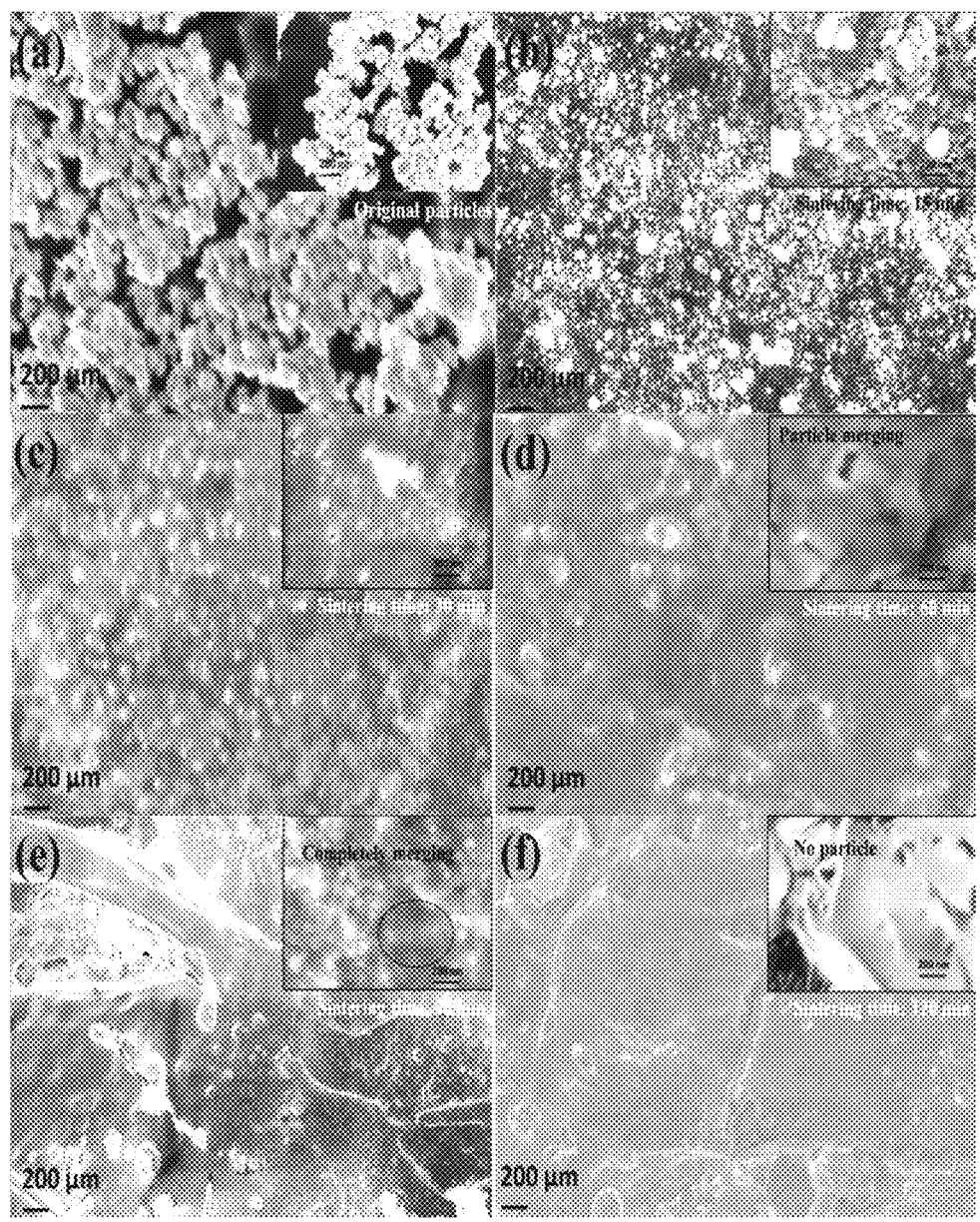
FIGS. 49A-49F are photomicrographs of SEM images of FIG. 49A showing samples without CRS process.

FIG. 49A-49F show samples without CRS process and printed samples with CRS process sintered at different temperature in vacuum. FIG. 49A shows a sample for which the CRS process is not sintered. The original particle size of constantan particles is around 100 nm which is not a very small number compared to known methods. It is also the smallest size commercial constantan particle. Small particles are preferred because the melting temperature is reduced due to Nano size effect, so the smaller particle the easier to be sintered. The commercial available constantan size is around 100 nm which has almost the same melting temperature as the bulk constantan metal.

As mentioned before, this is one of the main reasons limit the application of constantan in inkjet printing technology: it cannot be sintered without damaging the flexible polymer substrate. On the other hand, densification and grain growth start when sintering constantan samples at 250° C. for 15 min as shown in FIG. 49B. The surface becomes uniform and smooth and particles contact to each other to an increases extent after 30 min sintering in FIG. 49C. Grain rearrangement and neck formations among particles are found. In this stage, the particles are penetrated by softened copper and nickel; different microstructure evolution pathways are formed. Solid diffusion happens after 30 min sintering from FIG. 49D. Particles start merging together and grain boundaries start disappearing.

With an increase of sintering time, particles continue disappearing and a smooth surface can be detected in FIG. 49D. The grains merge more and more after being sintering for 90 min which is displayed in FIG. 49E. No particles are left and pore shrinkage can been seen after 2 h sintering as shown in FIG. 49F. Theoretically, constantan cannot be sintered at low temperature due to its high melting point. However, solid diffusion among constantan particles can be "activated" by the merging of reduced copper and nickel from dissolved oxidation. In other words, the reduced copper and nickel transport results into particles bonding of constantan.

Electronical Properties of Constantan Patterns

Figures 50A, 50B:
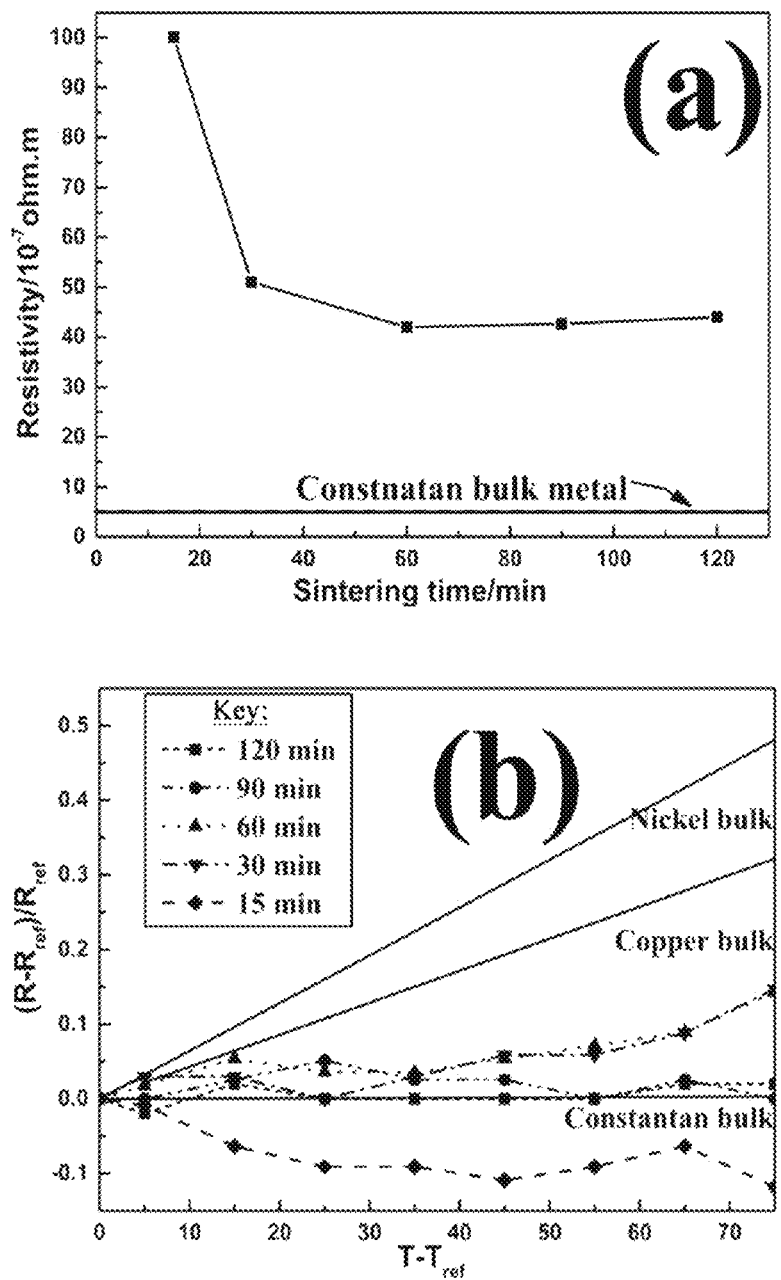
FIGS. 50A-50B are graphs illustrating resistivity change with increasing sintering temperature; and relative resistance change versus temperature change, respectively, with testing temperature 25~100° C.

The resistivity and temperature coefficients of samples without/with the CRS process are measured in FIG. 50A-50B. Samples without CRS process have almost infinity resistivity (not show). The resistivity of samples with CRS process decreases with increase sintering time. Resistivity becomes stable after being sintered 60 min, but the final resistivity is still ten times large than constantan bulk metal (FIG. 50A). The high resistivity relative to bulk is caused by interspace and pores among sintering constantan particles. In this research, the porous cannot be eliminated due to the low temperature. The temperature coefficient is also measured in FIG. 50B. The slope of three black solid lines represent temperature coefficient of constantan, copper and nickel bulk metal, which are $4\times10_{-5} K_{-1}$, $4.29\times10_{-3} K_{-1}$ and $6.41\times10_{-3} K_{-1}$ respectively. The temperature coefficient of constantan samples becomes closer to the theoretical value of constantan bulk metal with increasing sintering time from the FIG. 50B. This suggests solid diffusion of sintering takes time to finish. Though the sintered constantan has relative high electronical resistivity compared to bulk, it still has good and stable temperature coefficient.

Figures 51A, 51B, 51C, 51D:
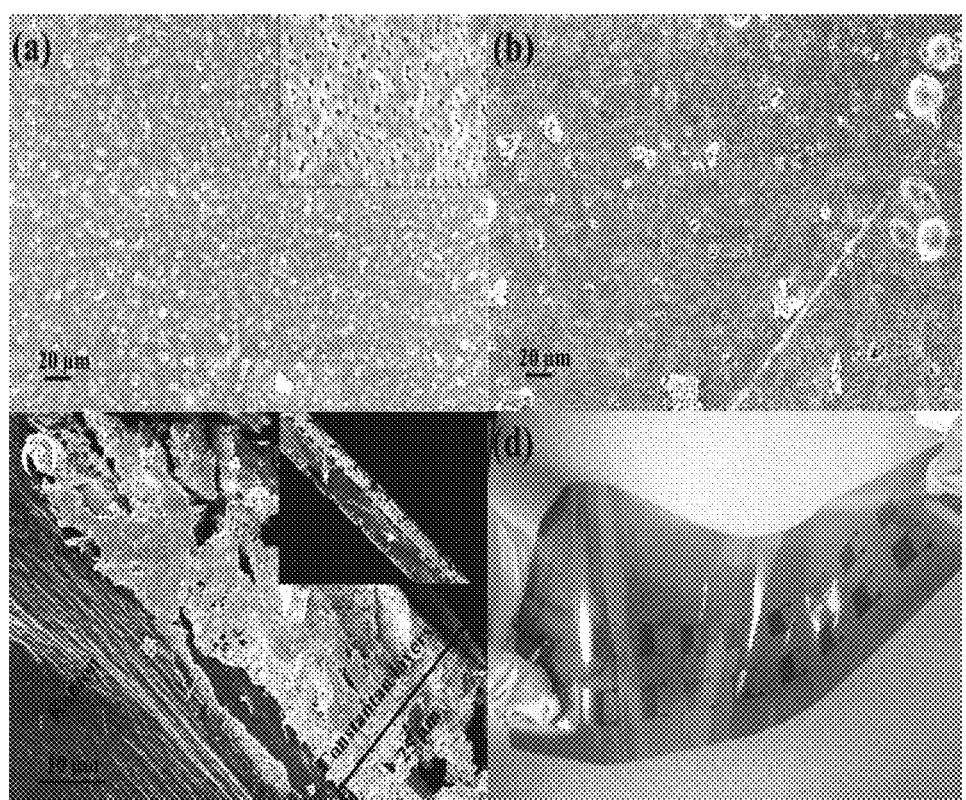
FIGS. 51A-51D are various SEM photomicrographs and photographs.

FIG. 51A displays the constantan samples prepared with chemical reducing process dried at 180° C. in vacuum. Thickener (glycerol) and water solvent are evaporated during this process. In this process, copper and nickel ions in water solvent are reduced by TD in basic condition; reduced copper and nickel tend to stick on constantan nano particles to reduce surface energy. In the meantime, constantan particles are joined by the reduced copper and nickel to form a net structure. The dried samples are then transferred to a vacuum oven and sintered at 250° C. in vacuum for 2 h. The structure becomes denser and most inter porous structures disappear in FIG. 51B. The reduced copper and nickel enhance solid diffusion of constantan at relative low temperatures during this process. FIG. 51C shows the cross-side of printed samples. The printed samples are sintered very well not only on the surface but also in depth. Inter porosity is also detected from the cross-side which explains the high resistivity of the printed samples compared with constantan bulk. FIG. 51D shows the flexibility of printed constantan strain gauges prepared from CRS process, No peeling off or cracking occurs while bending the patterns. Adhesion of constantan on Kapton® substrate is performed by tape testing. The constantan can stay on substrate completely and smoothly after removing the tape.

Ink Stability

Figure 52:
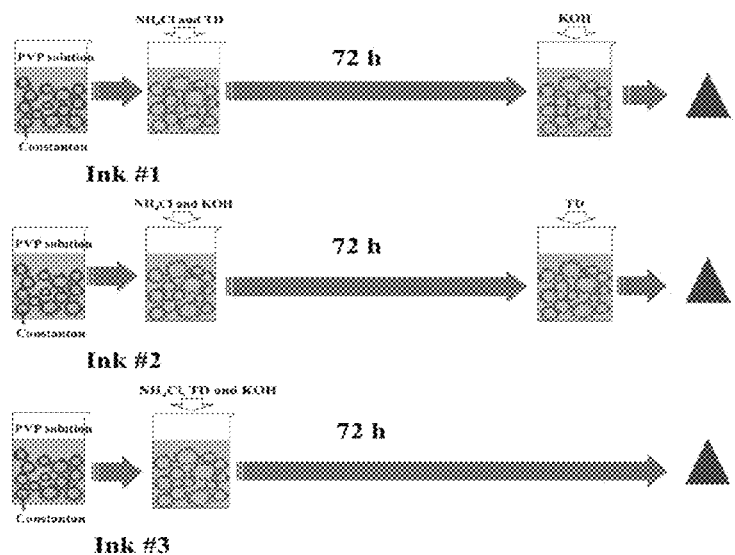
FIG. 52 illustrates three inks with different store methods.

Stability of this chemical process is evaluated in the practical application. Three samples are made as shown in FIG. 52: constantan, PVP, glycerol, TD and $NH_4Cl$ are mixed in DI water, KOH is added to the suspension after 72 h, this ink is marked as #1. Using the same procedure, constantan, PVP, glycerol, KOH and $NH_4Cl$ are mixed in DI water; TD is added to the suspension after 72 h marked as #2. Constantan, PVP, glycerol, KOH, TD and $NH_4Cl$ are mixed in DI water and age 72 h marked as #3.

Figures 53A, 53B, 53C, 53D:
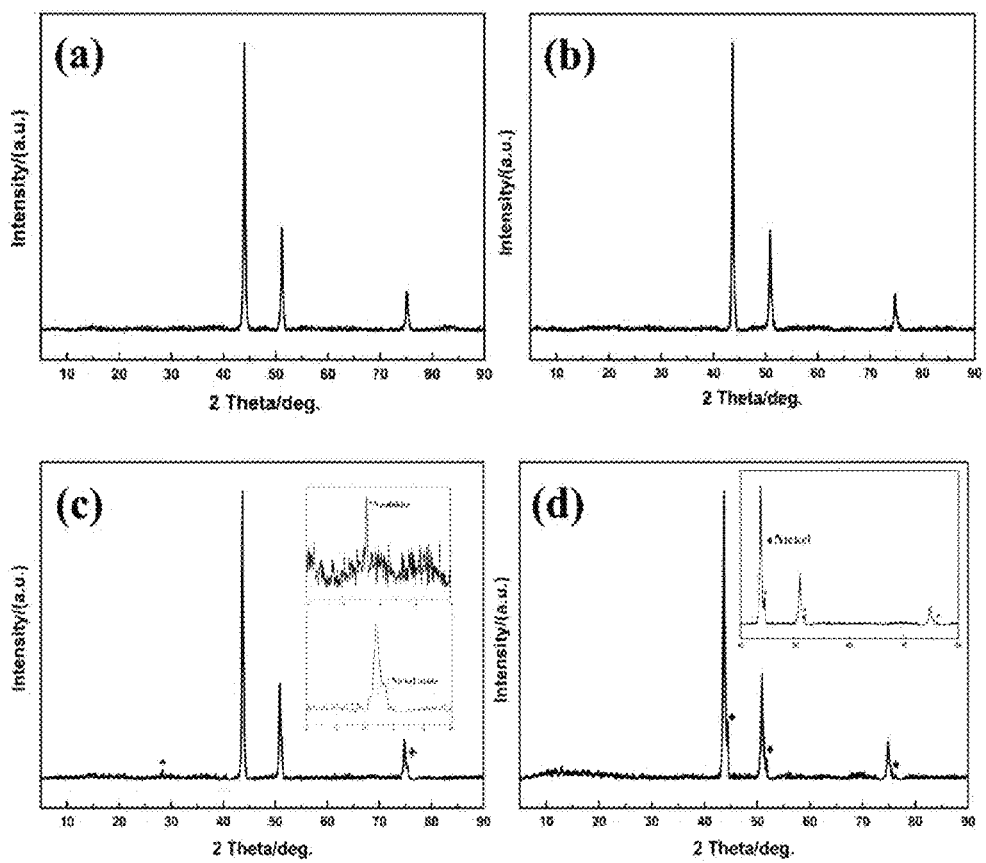
FIGS. 53A-53D illustrate XRD patterns of sintered samples.

Three inks are dried and sintered 2 h in vacuum following the same process mentioned above. FIG. 53A-53D shows XRD patterns of sintered samples by the ink with CRS process aged for 0 h (FIG. 53A), #1, #2 and #3 inks (FIGS. 53B, 53C, and 53D). No significant impurity detected in FIG. 3.13 (b) which shows the same space structure as the ink kept for 0 h (FIG. 53A). However, nantokite and nickel oxide have been found in the sample from the #2 ink in FIG. 53C. Copper/nickel ammonia complexes are not very stable with the presence of OH— according to the following chemical Equations 7-10; CuO and NiO precipitation may consume OH—. After 72 h, adding TD may not reduce the precipitated solid CuO, NiO and corresponding salts. Also TD cannot release active $SO_{22}$— due to lack of OH- according to Equation (6).

FIG. 53D shows pure nickel has been detected in sample from #3 ink which suggests TD still can exhibit reducing capability in neutral condition, although the reducing rate is slow at room temperature. It can still reduce a significant amount of nickel and copper ions. Reduced copper and nickel would merge together and form big particles. Those big particles cannot be sintered at relative low temperature due to losing the nano effect. XRD results suggest that ink can be stored in room temperature for a long time without alkaline. Alkaline is needed to activate the chemical process before using the ink.

$$Cu_{2+} + 4NH_3 = [Cu(NH_3)_4]_{2+} \quad \text{(Equation 7)}$$

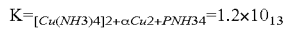

$$K = _{[Cu(NH3)4]2+\alpha Cu2+PNH34} = 1.2 \times 10_{13}$$

$$Ni_{2+} + 6NH_3 = [Ni(NH_3)_6]_{2+} \quad \text{(Equation 8)}$$

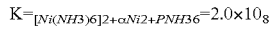

$$K = _{[Ni(NH3)6]2+\alpha Ni2+PNH36} = 2.0 \times 10_8$$

$$Cu_{2+} + 2OH- = (OH)_2 \downarrow \quad \text{(Equation 9)}$$

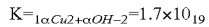

$$K = _{1\alpha Cu2+\alpha OH-2} = 1.7 \times 10_{19}$$

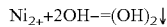

$$Ni_{2+} + 2OH- = (OH)_2 \downarrow$$

$$K = 1\alpha Ni2 + \alpha OH-2 = 1.8 \times 10_{15} \quad \text{(Equation 10)}$$

Figures 54A, 54B, 54C, 54D:
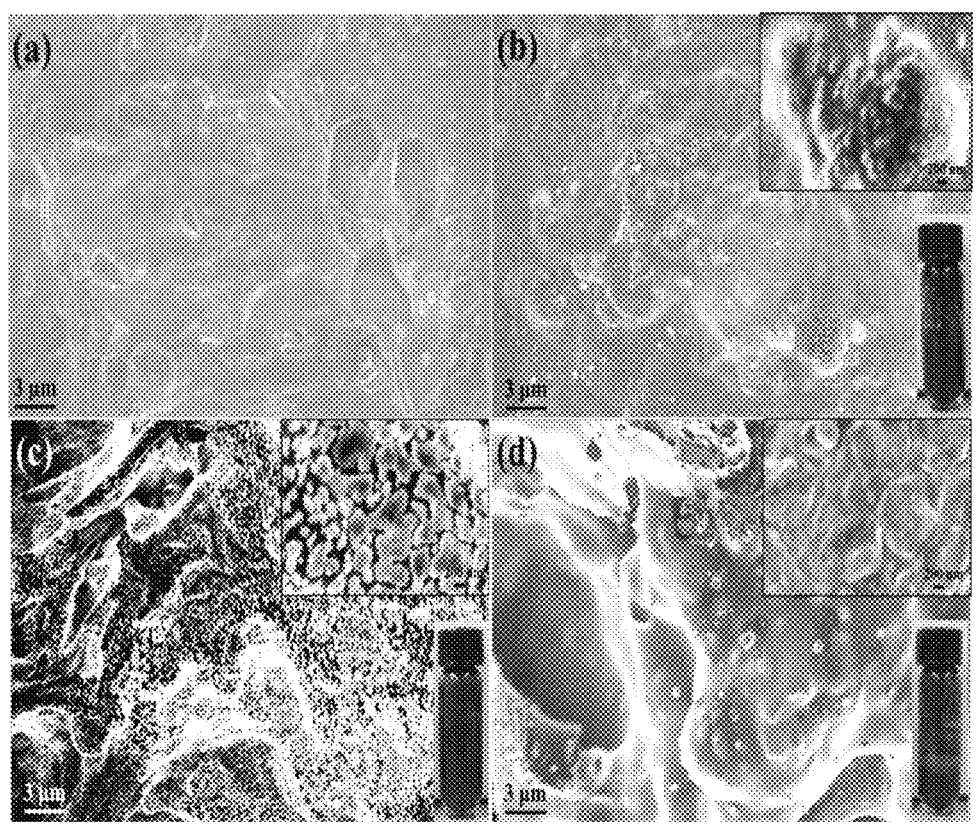
FIGS. 54A-54D illustrate SEM images of sintered samples.

FIG. 54A) is the sample sintered from the ink stored for 0 h. Similar morphology can be seen from sample sintered from the #1 ink in Figure MB. FIG. 54C shows sample sintered from the #2 ink which is not sintered very well in the high magnification SEM: particles are barely merged. This is attributed to the oxidation formation during storage in basic condition; precipitated oxidation cannot be sintered due to the high melting temperature. For sample sintered from the ink #3, copper deposition can be seen from the bottle in FIG. 54D; this is because of the slow reducing process of copper and nickel ions by TD at room temperature. Reduced copper and nickel agglomerate and settles on the bottle. The agglomerated copper and nickel effectively are wasted: large particles cannot be sintered together at low temperature as discussed before. The aged experiment indicates that ink can be stored for a long time without KOH; KOH should be added into the ink right before printing.

In summary, using a CRS process, stable constantan ink is formulated and constantan patterns are fabricated by inkjet printing. This simple process can remove/reduce surface oxidation and sinter high melting temperature constantan alloy NPs at relative low temperature without flammable reducing gas, this has been confirmed by TGA and DTA. The composition of sintered constantan film is confirmed by XRD and XPS. SEM shows the CRS process can anneal constantan NPs effectively after sintering for 2 h at 250° C. in vacuum. The solid diffusion of constantan NPs is activated by merging of reduced copper and nickel. The printed constantan patterns electronical resistivity values within a factor of 10 and temperature coefficients comparable to constantan bulk. The fabricated constantan patterns on Kapton® have excellent mechanical flexibility. Other flexible substrates may be used deending on the implementation. In addition, the proposed way of storage of functional constantan ink during application was found beneficial for reasons cited herein. Other printing methods may be used to apply the ink. This CRS process can make printed constantan resistor and strain gauge and other electronic devices, such as but not limited to, batteries and the like, with the advantages described.

Fabrication of Nickel and Copper Ink

For conductive inks such as silver ink and gold for the fabrication of flexible electronics, the most important motivations are good electrical conductivity and chemical stability of noble metals. Printed copper and nickel is an alternative way to replace noble metallic inks. There are many advantages of copper and nickel electronics: (a) copper have excellent electrical conductivity which is even better than gold (conductivity of copper is 58.5×106 S/m, gold is 44.2×106 S/m) with cheap raw materials (b) nickel is used as a barrier against oxidation, which could greatly help in the production of printable circuit boards (PCBs), (c) also nickel has a special usage in the energy storage.

However, those two metals suffer serious problems as jettable inks: copper nanoparticles are rapidly oxidized in air which can prevent copper sintering. On the other hand, nickel particles are surrounded by a thin dense oxidation layers like aluminum. Sintering would probably have to be done in the forming atmosphere (mixture of hydrogen and nitrogen). What is worse, the melting point of nickel is 1440° C. which makes it impossible to sinter with normal thermal curing.

Figures 55A, 55B, 55C:
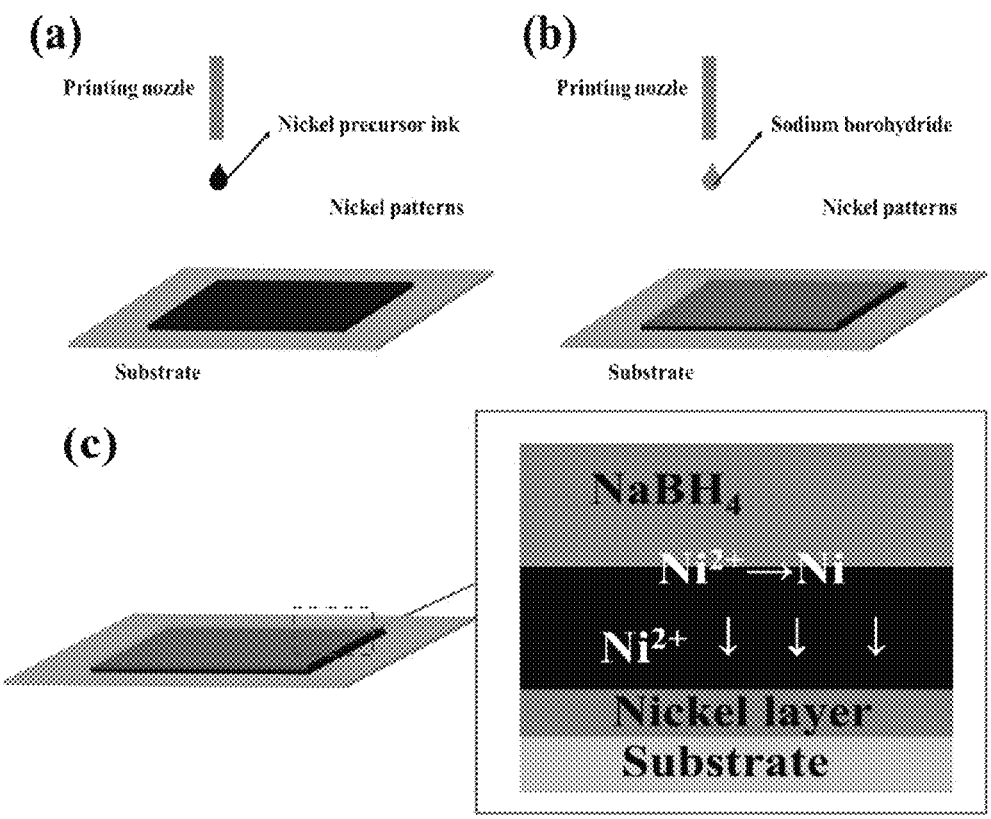
FIGS. 55A-55C are schematics of nickel printing.

Prior attempts to conquer this problem used a multi printing method to avoid thermal sintering which is shown in FIG. 4.1. The nickel precursor (NiSO4) solution is printed on polymer substrate with suitable viscosity and surface tension as shown is FIG. 55A. Following nickel precursor deposition, reducing agent (NaBH4) solution is printed on the top of nickel precursor solution as displayed in FIG. 55B. The NaBH4 can reduce Ni2+ into nickel particles at room temperature and then settled down on the polymer substrate. The reduced nickel particles will aggregate together to form a nickel layer due to a reduction in high surface energy in FIG. 55C. This method can also be applied to copper, silver and gold. The drawback of multi-printing method is it is hard to control the reducing agents to nickel precursor ratio which means this method may produce lots of chemical remains due to its uncontrollable chemical reaction; chemical remains can lower the conductivity of printed nickel film.

This Example and Experiment devises a novel approach to printable nickel conductive ink. Here a modified CRS method is used to make printable nickel and copper inks.

Example 3

Materials

The nickel and copper powders used in the ink formulation are commercially available from American Elements, USA with particle sizes around 80 nm purchased. The ammonia chloride (NH4Cl), glycerol, Polyvinylpyrrolidone (PVP), potassium hydroxide, nickel chloride (NiCl2) and thiourea dioxide are all obtained from Sigma-Aldrich, USA. All chemicals are analytical grade and used as received without further purification.

Preparation of Nickel and Copper Inks

Figures 56A, 56B, 56C, 56D:
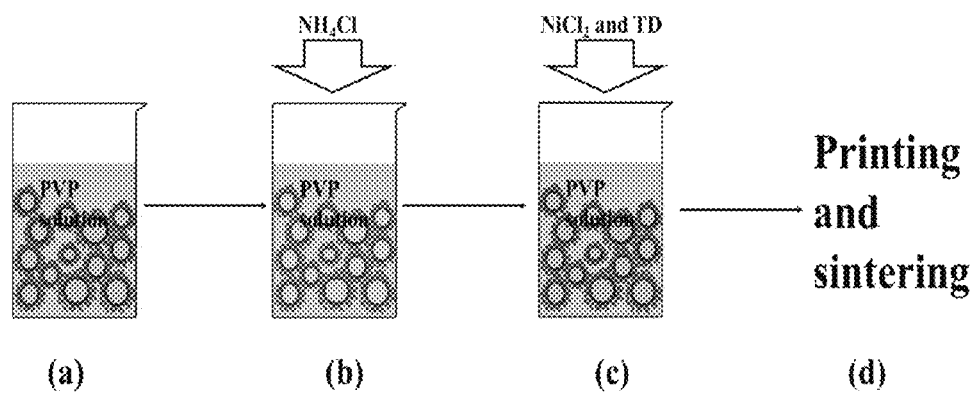
FIGS. 56A-56D illustrate schematics of nickel ink.

FIG. 56A-56D shows the scheme of fabrication process. 4 g nickel NPs and 0.3 g PVP are dispersed in 4 g water by ultra-sonication for 30 min as shown in FIG. 56A. Large particles are separated by centrifuge 5000 RPM for 5 min. NH4Cl is added into the suspension to etch away nickel oxide, and the suspension is magnetically stirred for 12 h to dissolve the oxidation completely; a nickel ammonia complex is formed in the meanwhile in FIG. 56B. However, unlike nickel which is surrounded by a thin dense oxidation which can prevent nickel particles from further oxidized, the key of CRS method is using a reduced metal from etched oxidations to join metallic particles; the reduced metal acts like bridge while thermal sintering. The thin oxidation nickel oxide layer cannot provide enough nickel ions to join nickel particles. Nickel chloride is added to the nickel suspension to provide enough nickel ions as shown in FIG. 56C, in the meantime, thiourea dioxide (TD) and KOH solution (1 mol/L) is added into that suspension as the reductant. Viscosity is adjusted to 10 cp using glycerol as the thickener. The suspension then is magnetically stirred for 30 min to make a uniform ink. As a control comparison, a separate batch of ink is formulated: constantan NPs and PVP are dispersed in glycerol/water solvent by ultra-sonication for 30 min, which contains: 40 wt. % nickel powders, 40 wt. % water, 20 wt. % glycerol and 3 wt. % PVP binder. The final ink is printed and sintered as descripted previous in FIG. 56D. The preparation of the copper ink is followed the same procedure as constantan ink as descripted previously.

Preparation of Nickel Conductive Film

Patterns are printed by a DMP-2800 inkjet printer (Fujifilm, Japan) on Kapton® film at room temperature. The printed patterns are first dried at 180° C. in vacuum and then sintered at high temperature in vacuum. The copper patterns are sintered at 250° C. while the nickel patterns are sintered at 400° C.

Characterization

X-Ray Diffraction (XRD)

XRD measurements were carried out on a Philips PW3040 X-Ray Diffractometer, 2θ ranges from 10° to 80° with CuK_α radiation (λ=15.4 nm) with a step size of 0.02° and a time per step of 15 s. Scanning Electron Microscope (SEM) LEO 1530VP Field Emission SEM instrument was used to observe the surface morphology of raw materials and printed patterns. Resistivity Measurement The resistivity of the patterns was measure by fore point probe (Jandel CYL-HM21, USA). The thickness of the patterns is confirmed by SEM to calculate the resistivity. Thermal Analysis Thermogravimetric analysis (TGA) and Differential thermal analysis (DTA), STA 449 F1 Jupiter from Netzsch, Inc. USA, were used to study the thermal behavior of different inks and chemical reaction processes. Measurements were carried out in air with temperature increasing at a rate of 5 K/min.

Example 3—Results

Nickel Part

Figures 57A, 57B:
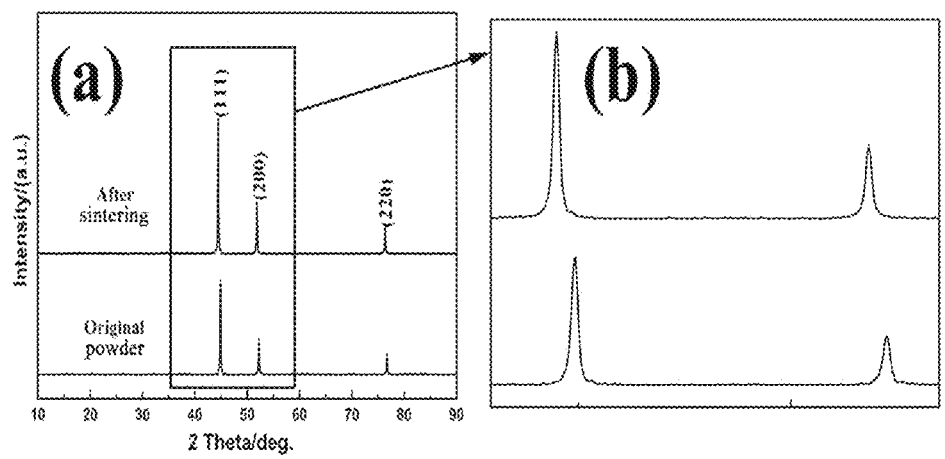
FIGS. 57A-57B illustrate XRD patterns of nickel before and after sintering; and details of the top two strongest XRD signals, respectively.

FIG. 57A-57B shows the XRD patterns of nickel powder before and after sintering. All of them show at 2θ of 44.5°, 51.8° and 76.4° index as (111), (200) and (220) (JCPDS file No. 04-0783) reflections of the Fm-3m space group without any significant impurities. Usually, nickel is oxidized in air and surrounded by a thin and dense oxidation. This phenomenon is similar with aluminum. However, no oxidation is detected from XRD results indicating that this oxidation layer is too thin to be detected. This oxidation layer is very dense and has very tight chemical connect with the nickel bulk to prevent further oxidation, which would be a barrier among the particles during sintering. The thin oxidation layer cannot provide enough nickel ions which play an important role during CRS process; additional external nickel ions are needed. After the CRS process, no impurities remains in the nickel patterns, with extra chloride and ammonia ions completely evaporated. The position of XRD signals is compared in order to study the crystal lattice change after CRS as shown in FIG. 57B. It is known that the XRD patterns shift to lower angles after CRS suggesting a grain growth that confirms the sintering process. Also, the peaks become sharper indicating larger crystals after RCS process.

Figures 58A, 58B, 58C, 58D:
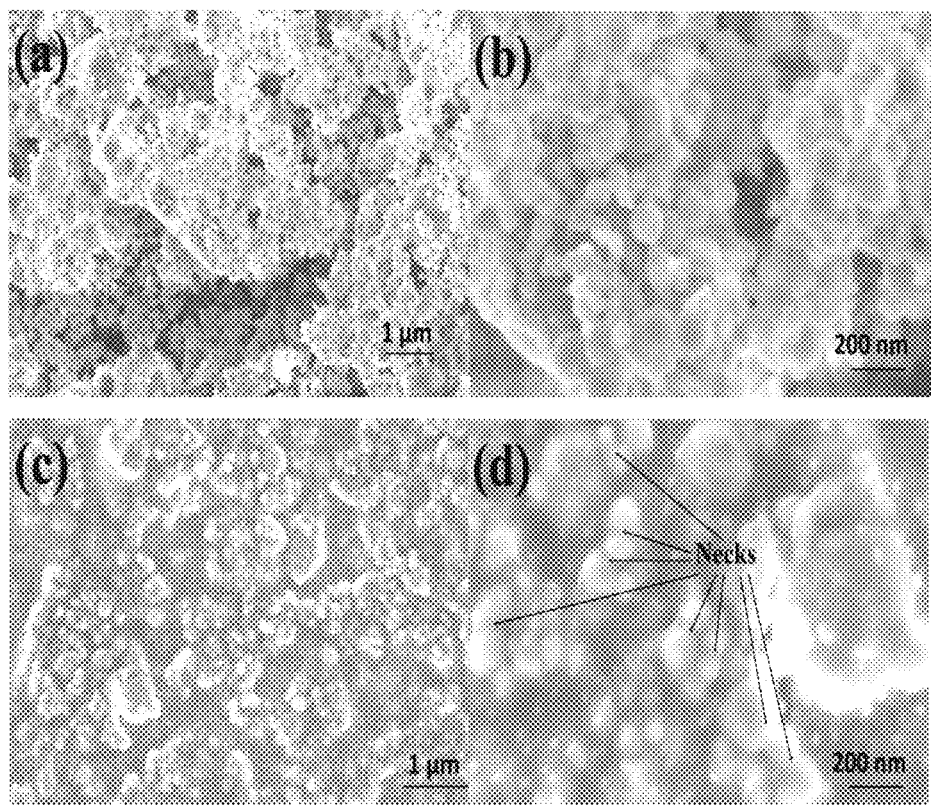
FIGS. 58A-58D illustrate SEM images.

FIGS. 58A-58D shows the surface morphology of nickel powders before and after CRS process. The original particle size of nickel particles is below 100 nm with spherical shape in FIGS. 58A and 58B. Primary particles aggregate together and form secondary micro-sized bundles to reduce the high surface energy. Large particles can cause serious nozzle clogging. In this research, PVP is used to separate nickel nanoparticles with the help of ultra-sonication. After CRS process, the particles are joined together very well. Surfaces become much smoother as shown in FIG. 58C; Neck formation is found among particles which suggest grain growth occurs during sintering in FIG. 58D marked with black arrows. The reduced nickel nucleates and grows on the original nickel particles (etched without oxidation), which acts like bridge to enhance the solid diffusion under certain temperature. However, due to the high melting temperature of nickel bulk, nickel cannot be sintered completely. The porous structure can lower the conductivity of the final products.

Figure 59:
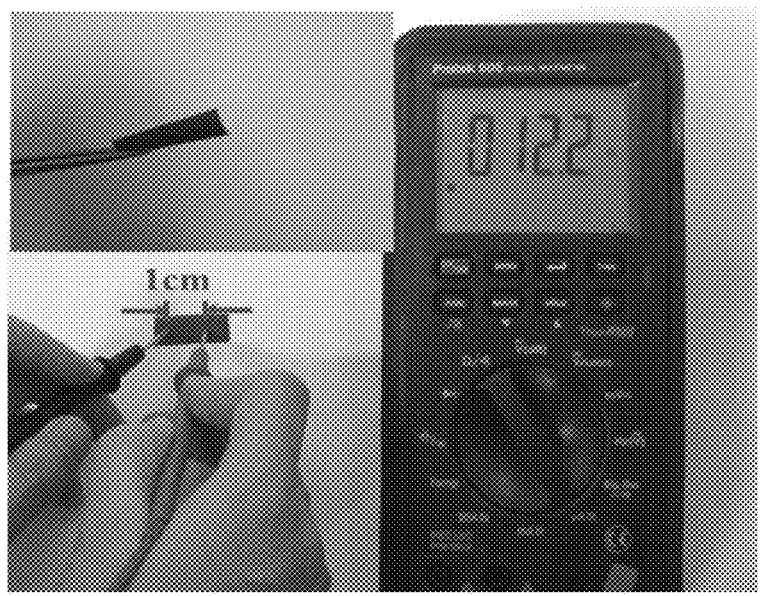
FIG. 59 is a picture of conductive testing of the printed nickel patterns after CRS process, the insert photograph shows the flexibility of patterns on the Kapton® (polyimide-poly (4,4'-oxydiphenylene-pyromellitimide)) substrate.

FIG. 59 displays the resistance of the printed patterns. The thickness is around 20 μm measured by micrometer. The insert graph is the sintered patterns on Kapton®, which shows good mechanical flexibility; this suggests CRS can make conductive nickel patterns without damaging the polymer substrate. The resistance of the printed patterns is still higher than the nickel bulk film, which is caused by the porous structure as discussed before. The resistivity is calculated by the Equation (11):

$$\rho = R_{S/L}$$ Equation 11

In Equation 11: R is the resistance of patterns, S and L are the cross-side area of the pattern and length of the pattern, respectively. The resistivity of the printed pattern is around 500 μΩ·cm which means the conductivity is 1.4% of the nickel bulk. This result is ten times lower than the known multi-printing method previously discussed above for Example 3 because of the more complete sintering using the novel method in Example 3.

Copper Part

Figures 60A, 60B:
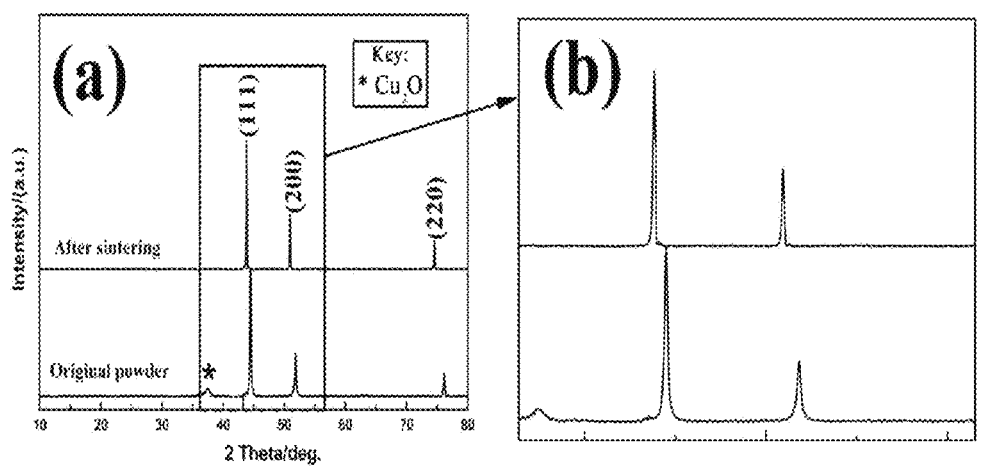
FIGS. 60A-60B illustrate XRD patterns of copper before and after sintering; and details of the top two strongest XRD signals, respectively.

FIG. 60A shows the XRD patterns of copper powder before and after sintering. All of them show at 2θ of 43.6°, 50.8° and 74.4° index as (111), (200) and (220) (JCPDS file No. 04-0783) reflections of the Fm-3m space. Unlike nickel nanoparticles, copper nanoparticles have significant oxidation as shown in FIG. 60A marked by a star. In normal conditions, copper cannot form dense oxidation layers to prevent further oxidation, which means oxidation keeps advancing until no pure metal copper is left. This is even worse for copper nanoparticles due to the high surface area in nano size.

This is the main challenge in copper ink; most of the time, copper nanoparticles or inks are kept in a glovebox to prevent oxidation. However, no oxidation is detected from XRD results after the CRS process indicating that the CRS method can eliminate oxidation effectively: $NH_4Cl$ can etch away and convert oxidation into copper ions. Copper ions are reduced into copper and bridge the original copper particles.

The solid diffusion and neck formation are triggered among copper particles through the copper "bridge" and low temperature sintering is achieved.

Crystal lattice change is compared by the position of XRD signals after CRS as shown in FIG. 60B. Similar with nickel, the XRD patterns shift to lower angles after CRS indicates a grain growth which confirms the sintering process. Also, after RCS process, the peaks become sharper indicates a larger copper crystal lattice because of the particle merge.

Figures 61A, 61B, 61C, 61D:
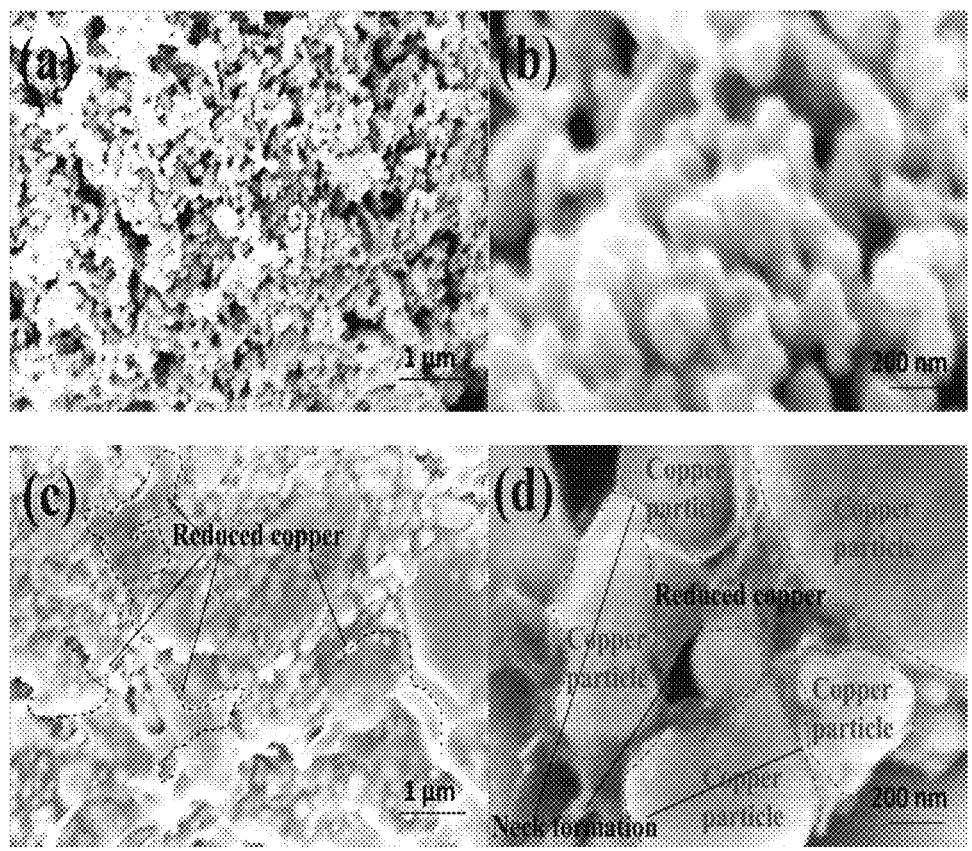
FIGS. 61A-61D illustrate SEM images of copper nano powders in FIGS. 61A-61B; and copper patterns after CRS process with different magnifications in FIGS. 61C-61D, with the neck formation and reduced copper are marked by black arrows and original copper particles are marked by red dash line.

The morphology of copper nanoparticles before and after CRS is studied by SEM displayed in FIGS. 61A-61D. Original copper particle size is around 200 nm with sphere shape as shown in FIG. 61A. The primary copper particles aggregate together due to the high surface energy in FIG. 61B. The stable copper suspension can be achieved by the steric repulsion from the adsorbed PVP. An obvious particle union is discovered in FIG. 61B: original copper particles and reduced copper marked by the black and red, respectively. The copper film is quite different from the nickel film after CRS process: more smooth areas (FIG. 61C) are detected representing the reduced copper. This can be explained by the much more oxidation in copper than nickel. The copper oxidation is converted into copper and sticks on the original copper nanoparticles and functions as a bridge for the solid diffusion which is proven in FIG. 61D.

Figure 62:
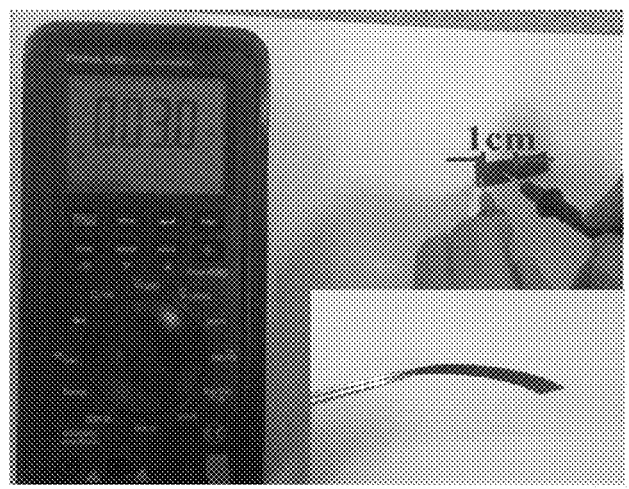
FIG. 62 illustrates conductive testing of the printed copper patterns after CRS process, with the insert showing flexibility of patterns on the Kapton® substrate.

The conductivity testing is performed in FIG. 62. The thickness is around 20 μm measured by micrometer. The sintering temperature of copper is much lower than nickel, so copper films also shows good mechanical flexibility as displayed in the insert graph in FIG. 62. The resistivity of copper film made by CRS is around 125 μΩ·cm, so the conductivity is 1.3% of the copper bulk. Although this result is lower than other researchers' reports, CRS provides a simple, safe and economic method to make conductive copper ink. Copper has more promising market than silver in the fabrication of electronics and circuit boards due to the low cost and acceptable conductivity.

In summary, copper and nickel inks are developed to make conductive films. Usually, nickel cannot be sintered very easily due to the high melting point of the bulk; what is more, nickel nanoparticles are covered by dense and isolated oxidation with poor thermal conductivity. High sintering temperature is required to break the oxidation and initiate nickel particles to sinter. Most prior art requires forming gas to help the sintering. The CRS process is evaluated to make conductive nickel film in vacuum environment at 400° C. without using forming gas. Compared to its formulation for constantan ink, the CRS process is modified a little bit to make nickel ink: external nickel source are added to the suspension in order to provide enough nickel ions to be reduced to pre-connect nickel particles. The composition of sintered nickel film is confirmed by XRD which indicates CRS does not change the composition of nickel or introduce any impurities. The sintering phenomenon is confirmed by SEM: neck formation and particle merge are found. The conductivity of the nickel film is tested by multi-meter and the resistivity is estimated to be 1.4% of the bulk metal. Nickel ink has potential application on the energy storage devices due to its high stability at relative high voltage, which can be used to replace expensive gold and poor performance carbon serious materials.

Experiments in Example 3 on copper inks indicate that copper conductive film can be made at 250° C. by the same CRS process as constantan. The composition and morphology are characterized by XRD and SEM: no impurity is found and copper particles merge together. Copper ink is very useful in the electronical devices and circuit board fabrication due to its high conductivity and low cost.

CRS process is an ideal method to make metallic conductive ink. This method does not require complex sintering machines like photonic, plasma and microwave sintering methods. Also no dangerous forming gas is needed to eliminate or break the oxidation. It has "built in" reducing ability to remove oxidation during the ink fabrication and sintering process.

Conductive metallic films have very wide application on many areas. The possibility of using nickel and silver conductive film to make flexible and rechargeable lithium-ion batteries is possible using the methods described herein and below.

Fabrication of Lithium-Ion Batteries by Printing

Lithium-ion batteries are the most widely used portable energy devices in the last decades. A common fabrication of lithium-ion batteries is tape casting which can achieve roll-to-roll production. The drawback of this method is difficult to fabricate ultra-thin film and shape control of electrodes. Inkjet printing is one of the most promising manufactory methods to make thin films with computer controllable shape as mentioned before. There has never been any successful attempt on fully printed lithium-ion batteries until the current invention. The current invention may be used on other printing methods as well.

Figure 63:
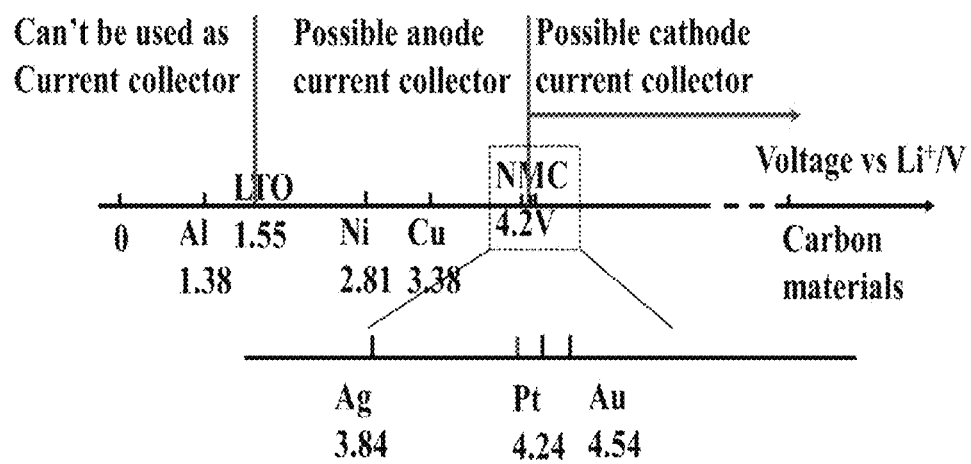
FIG. 63 illustrates a schematic showing the voltage scale for materials versus $Li/Li^+$.

The main barrier preventing a fully printed lithium-ion battery is the current collector. The current collector materials must meet two requirements: (a) it must not facilitate an electrochemical reaction with cathode and anode; (b) it must remain stable at high voltage in the presence of electrolyte. Potential materials which could be used in lithium-ion batteries view are exhibited in FIG. 63. All potentials mentioned in this section refer to the potential versus Li+. Material potentials lower than 1.55 V cannot be used either as cathode or anode due to dissolution in the electrolyte. Potentials between 1.55 V and 4.2 V have possible use in anode current collector. Potential above 4.2 V can be applied for both cathode and anode current collectors. Based on this point, carbon materials should be the ideal current collector material, however, carbon materials suffer great contact resistance after printing which is caused by its high sintering temperature. Moreover, carbon materials have poor adhesion on polymer substrates which is caused by the same reason. From the potential scale, silver is very close to the minimum limitation of cathode current collector. So in this section, silver is used as the comparison current collector. It is known that gold is used for the fabrication of both cathode and anode current collectors for lithium-ion batteries. The main disadvantage of gold current collector is the high cost: it is not an economic material for batteries.

Example 4

Figure 64:
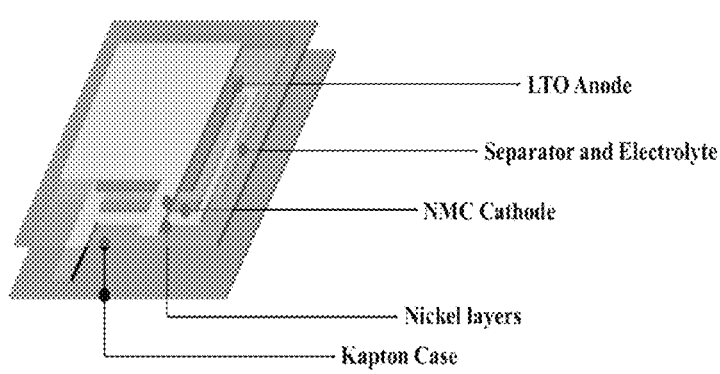
FIG. 64 illustrates a schematic showing the structure of multi-layer flexible electrode made by plastic conductive film.

FIG. 64 displays the structure of multi-layers electrodes for lithium-ion batteries fabricated by conductive silver and nickel current collectors printed onto plastic substrates.

Fabrication of Flexible Lithium Ion Batteries

Figure 65:
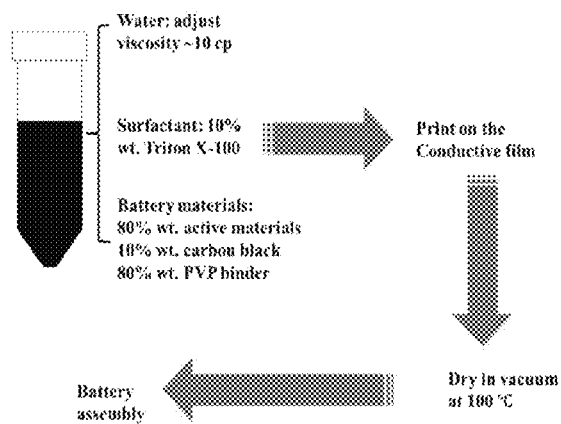
FIG. 65 illustrates a schematic showing a process of fabrication of flexible lithium-ion batteries.

FIG. 65 shows the process of fabrication of flexible lithium-ion batteries. The battery inks (cathode and anode inks) contains: water, Triton X and battery materials. The ratio of Triton X to battery materials is fixed at 1:9 by weight. The battery materials contain 80 wt. % wt. active material (NMC for cathode and LTO for anode), 10 wt. % carbon black as conductive agent and 10 wt. %. PVP as binder. The viscosity is adjusted at 10 cp to meet the requirements of DMP 2800 printer. The inks are first mixed by a rotating mixer overnight and then ultra-sonicated for 30 min, then centrifuged at 5000 rpm to eliminate large particles. The inks are then printed on the conductive film and dried in vacuum at 100° C. to evaporate the solvent. Flexible batteries are assembled in an argon filled glove box in the form of punch cell to make sure the seal. The electrolyte is made of LiPF6 (1 M) in a 1:1 (V/V) mixture of dimethyl carbonate (DMC) and ethylene carbonate (EC) is used as electrolyte. The separator is Celgard2400. The batteries are assembled in nitrogen protective glovebox.

Characterization X-Ray Diffraction (XRD)

XRD measurements were carried out on a Philips PW3040 X-Ray Diffractometer, 2θ ranges from 10° to 80° with CuK_α radiation (λ=15.4 nm) with a step size of 0.02° and a time per step of 15 s. Scanning Electron Microscope (SEM) LEO 1530VP Field Emission SEM instrument was used to observe the surface morphology of raw materials and printed patterns. Electrochemical Testing Punch cells were cycled at a rate of 0.1 C (1 C=150 mAh/g) between 0.5 and 2.5 V at 25° C., using a Battery Analyzer (BST8-MA, MTI Inc.). The cyclic voltammetry (CV) measurements were carried out on CHI832C (CH Instruments, Inc.) at 25° C. The cyclic voltammetry (CV) measurements were carried out on CHI832C (CH Instruments, Inc.) at 25° C. The counter electrode is Li metal and the scanning rate is 1 mV/s.

Example 4—Results

Performance of Battery Inks

Figures 66A, 66B:
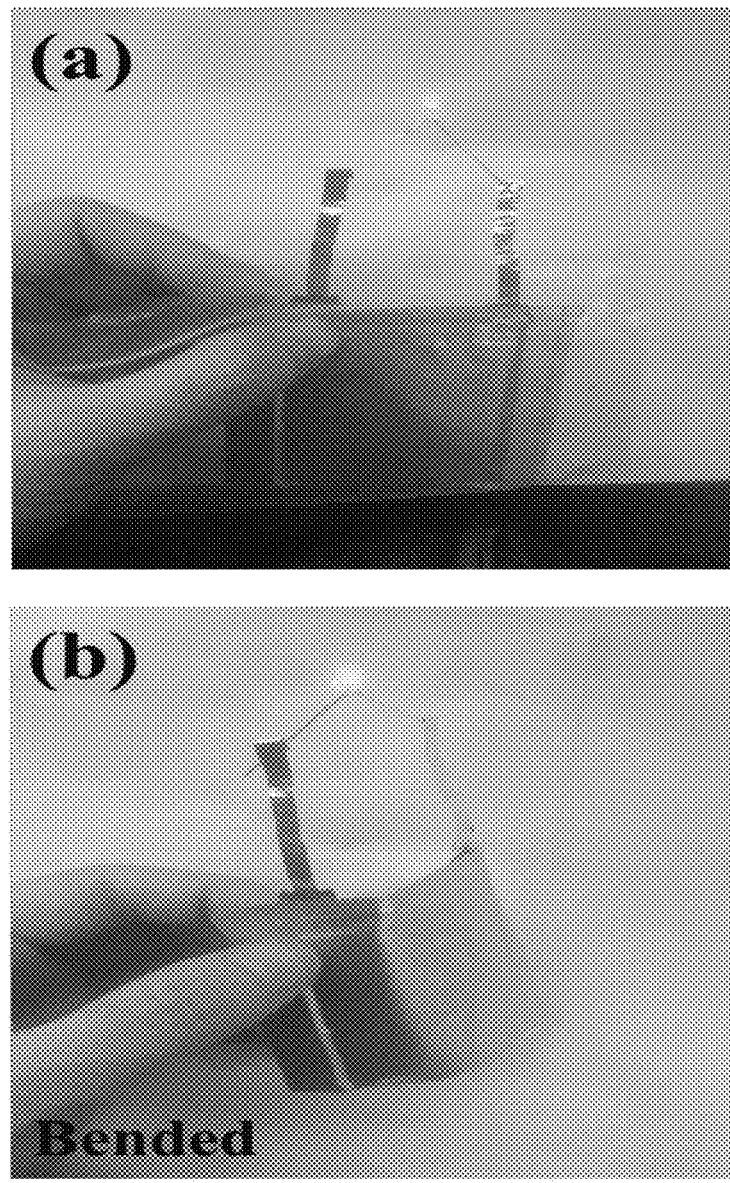
FIGS. 66A-66B are photographs showing flat and bended performance, respectively, of the printed batteries with aluminum and copper current collectors.

In order to characterize the performance of the battery inks, the conventional battery is assembled with traditional aluminum cathode current collector and copper anode current collector. The performance of the battery is shown in FIG. 66A-66B. The working voltage and current strength of the LED are 2.0 V and 20 mA, respectively. The battery can work with flatted and bended shape suggests the stability of the battery inks and inkjet printing process. The water solvent, surfactant, dispersing process and printing process have no significant effect on the composition of NMC and LTO materials. On the other side, PVP is excellent water based binder which provides strong adhesion between battery materials and current collector and prevents battery material peeling off. The flexible battery can be fold to fit into any shapes of flexible electronics in the future. Traditional battery slurry uses chemical toxical organic solvent such as N-Methyl-2-pyrrolidone (NMP) or Dimethylformamide (DMF) as solvent. Environmental friendly water is used in this method to replace those organic solvent.

Silver and Nickel Current Collectors for Flexible Batteries

Figures 67A, 67B, 67C, 67D:
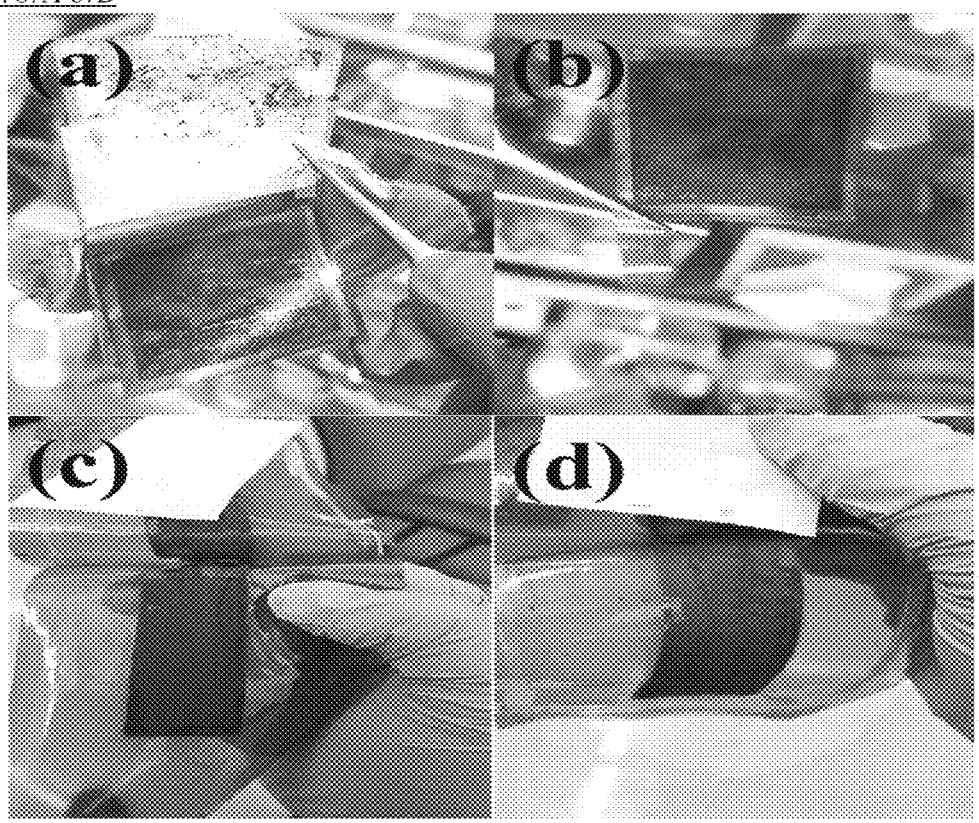
FIGS. 67A-67D are photographs showing flexible batteries made by silver current collector having an anode electrode and cathode electrode as shown in FIGS. 67A-67B, respectively; and images of the flexible batteries made by nickel current collector having an anode electrode and cathode electrode as shown in FIGS. 67C-67D, respectively, where all are disassembled after first cycling.

The lithium-ion batteries with silver current collectors fail at 0.8-1.0 V. The batteries are disassembled to study the mechanism. FIGS. 67A and 67B displays the optical images cathode and anode of flexible batteries with silver current collectors after charging. A serious peeling off is detected from the cathode and anode which is the main reason for the failure of battery. The peeling cathode and anode is caused by different mechanisms: silver can react with lithium ions and to form silver-lithium alloy. It is known of using GITT technology to study the silver in lithium-ion batteries, which indicates silver can form different lithium-silver alloy at vary potential. On this point, silver is a possible anode material for lithium-ion battery. The internal short circuit happens while charging the battery. Another reason of peeling off is caused by silver oxidation in electrolyte above 0.8-1.0 V during battery charging which is shown in Equation (12), the Ag+ dissolved into electrolyte and cause active materials to peel off. Silver ink is not suitable for the fabrication of lithium-ion batteries.

Equation 12

In contrast, FIGS. 67C and 67D displays the images of cathode and anode of flexible battery made by nickel current collector. The battery is disassembled after first charge and recharge. No peeling off (the slight peeling off is caused by battery assembly) is detected suggests nickel is very stable inside the battery during the electrochemical reaction. Nickel does not react with lithium ion to form alloy or get oxidized at high operating voltage.

Performance of Flexible Batteries

The printed nickel ink has potential application on the lithium-ion batteries due to the easy manufactory and sintering process. The resistivity of thin films made by different materials is summarized on Table 5 including the nickel film, all these materials have potential application on the battery current collector (aluminum and silver are not included). From Table 5, gold (other noble metals like platinum is also good current collector for lithium-ion batteries, but no printable platinum conductive ink has been reported yet) is obvious the most outstanding material for the fabrication of printable batteries.

However, gold is expensive which can limit the application of printable batteries. Carbon is an ideal material for the batteries which has been applied on the battery as conductive agent, but carbon suffers high resistance as current collector due to the contact resistance. High inert resistance may affect the energy output of batteries caused by thermal runaway.

It is known that Indium Tin Oxide (ITO) is a new conductive material which already shows excellent stability and conductivity in solar cell. The application of ITO in lithium-ion batteries has not been evaluated, but the market price of ITO is not as cheap as nickel nanoparticles. On the other hand, nickel film has even lower surface resistance than ITO film.

TABLE 5

| Known Properties of Conductive Inks for Batteries | | |
|---|---|---|
| Materials | Types | Surface resistance/ $\Omega$-sq$^{-1}$ |
| Carbon Nanotubes | Inkjet printable | Above 10000( |
| Graphene | Inkjet printable | Around 6000 |
| ITO | Gravure printing | 500~1000 |
| Gold ink | Inkjet printable | 0.02 |
| Nickel thin film | Inkjet printable | Below 50 |

Figures 68A, 68B:
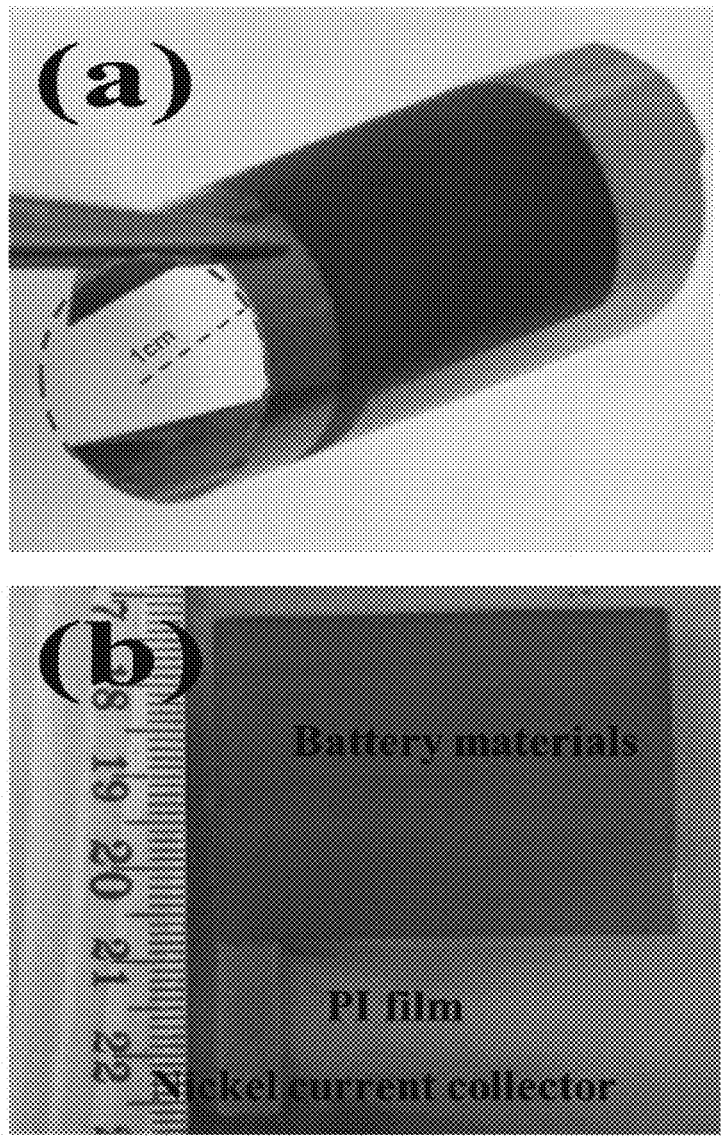
FIGS. 68A-68B illustrates flexibility of printed electrodes with nickel conductive current collectors having the radius of curvature approximately at 1 cm; and structure of flexible electrodes made by inkjet printing.

FIG. 68A-68B demonstrates the structure of printed electrodes for lithium-ion batteries. Basically, the electrodes are fabricated layer by layer (Kapton®-nickel layers-battery materials). In this research, commercial available LTO and NMC nanopowders are used as active materials for lithium-ion batteries due to the high stability in water. The sintered nickel electrode is conductive enough to act as current collectors as discussed before.

The multi-layers electrodes after printing are shown in FIG. 68A which has excellent flexibility bended with 1 cm radius of curvature without any obvious peeling off. The electrodes then assembled into a full cell and cycled from 0~2.5 V. The cycled positive electrode is shown in FIG. 68B which indicates nickel is very stable in LiPF6 electrolyte with high working potential. The corrosion resistance of nickel is better than silver. The outstanding corrosion resistance is contributed to the thin dense oxidation layer on the nickel surface; oxidation has low electronical and thermal conductivities which prevent thermal sintering. However, the oxidation layer is the key prevent nickel bulk from oxidation furtherly at high operation potential without affecting the electronical conductivity significantly. The same positive protection mechanism is also shown on aluminum, but nickel is much more stable than aluminum at low operation potential because nickel does not form alloy structure with lithium like aluminum.

After nickel current collector deposition and thermal sintering, the cathode and anode mixture suspensions are printed on the nickel film. The cathode and anode then dried at 100° C. to evaporate water solvents.

Figures 69A, 69B:
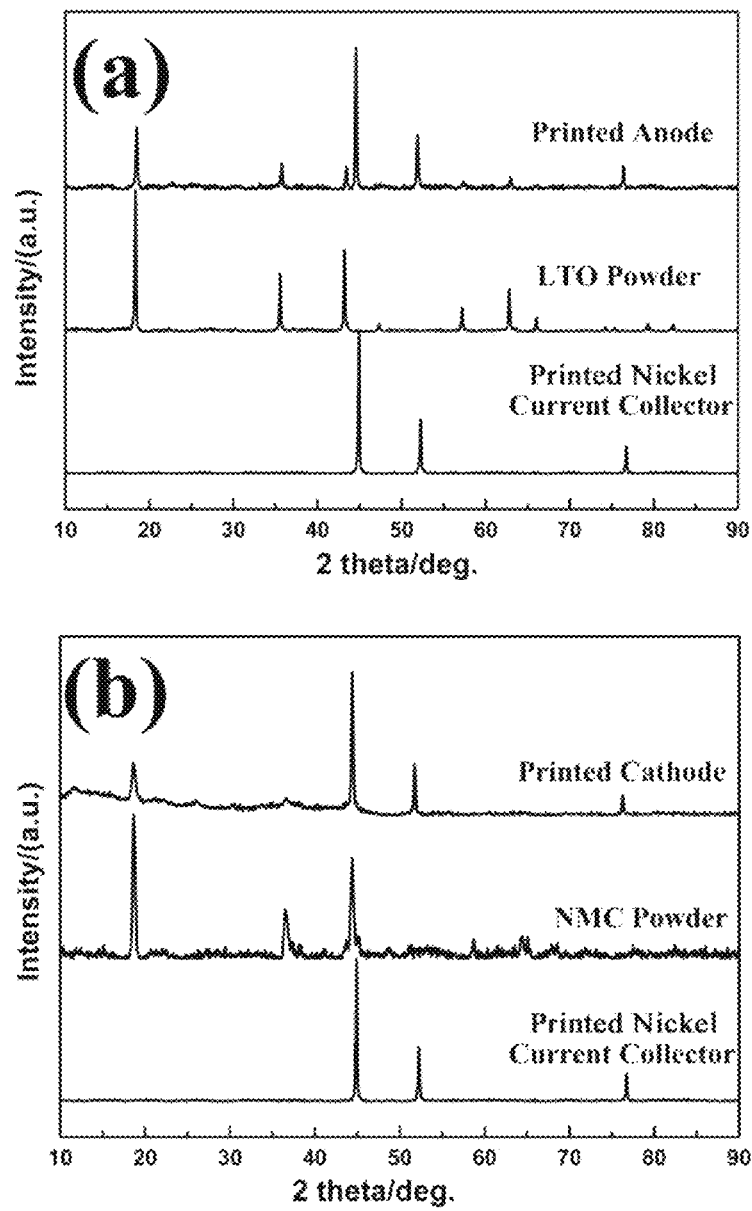
FIGS. 69A-69B are XRD patterns of printed anode and cathode electrodes, respectively.

FIGS. 69A and 69B shows the XRD patterns of printed cathode and anode electrodes. The sintered nickel film is covered by a passivation layers which can protect further oxidation, also it can prevent potential corrosion from the cathode and anode inks which is confirmed by XRD: no obvious impurity is discovered. Nickel current collector has better corrosion resistance than the traditional aluminum and copper materials.

This is crucial when water is used as solvent because aluminum and copper are very sensitive to the pH with the oxygen presents. XRD results also indicate the stability of NMC and LTO water suspension. NMC has better stability than LFP in water: a $Li_3PO_4$ layer of a few nanometers thick was observed and reported at the $LiFePO_4$ grains' surface after immersion in water. $Li_3PO_4$ accompanied by an increase of FeIII percentage in the grains, which can cause loss of active materials. There is no similar phenomenon happens on NMC and LTO materials.

Figure 70:
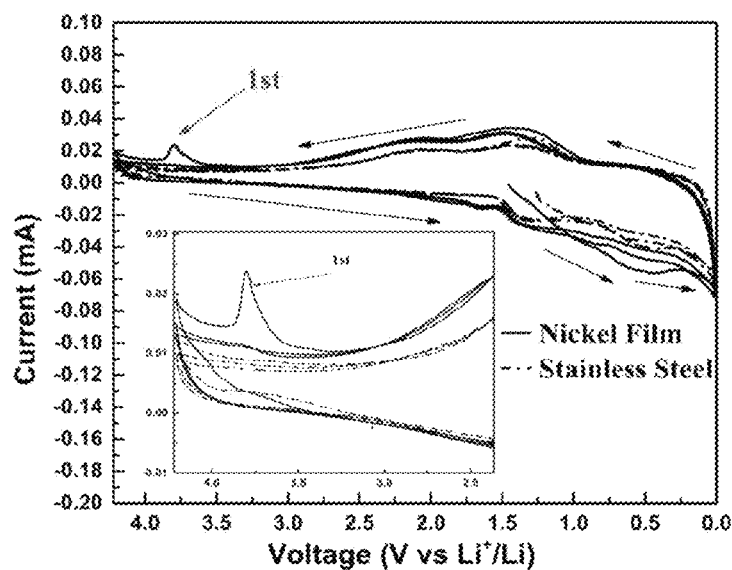
FIG. 70 illustrates current and voltage (CV) characterizations of nickel and stainless steel inside lithium-ion batteries.

The electrochemical cyclic voltammogram (CV) technology is used to test the corrosion resistance of the printed nickel film in the electrolyte (1M LiPF6 in EC/EMC (3:7)) shown in FIG. 70. The stainless steel is used as the comparison because stainless steel is very stable as the current collector for lithium-ion batteries. A small chemical reactive signal is detected at ~3.8 V in the first cycle which represents the anode passivation process of nickel film. Nickel is covered with thin and dense oxidation passivation in air which prevents nickel from further oxidation. This oxidation passivation also protects nickel inside lithium-ion batteries below 3.8 V. The anodic current at a voltage of 3.8 V disappears with CV cycle number, indicating that the tolerance for corrosion is improved by the irreversible anodic reaction which produces more stable passivation layers. The second and the third cycles of nickel are closer to the stainless steel. Other known research points out it could be Ni—P alloy which has superior tolerance against electrolyte even the operating voltage is polarized up to 4.5 V. Pre-Phosphating treatments would benefits the stability of nickel film inside the batteries. CV characterization confirms nickel has potential usage for current collector in lithium-ion batteries.

Figures 71A, 71B:
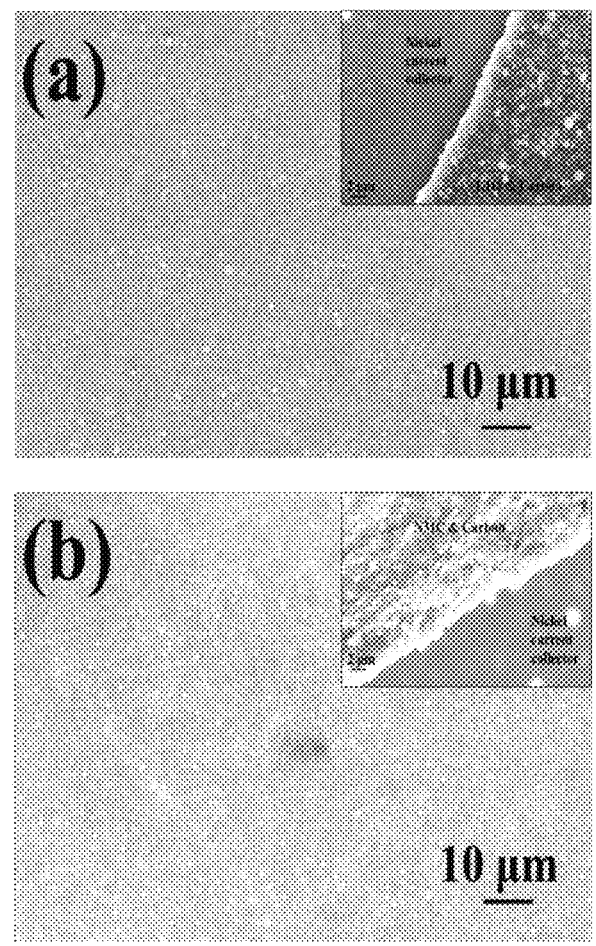
FIGS. 71A-71B illustrates SEM images of printed anode and cathode electrodes, respectively, where the insert photographs are the lay structure at the edge of the printed electrodes.

FIGS. 71A and 71B displays the surface morphology of printed LTO and NMC electrodes. The printed electrodes have smooth and uniform surface with no cracks. This is contributed by the layer by layer process of inkjet printing, which can control the deposition more precisely than tape-casting. The insert shows the thickness of the printed active layers which is around 2 µm. After battery assembly, the whole thickness of the battery is below 150 µm (50 µm for each Kapton® substrate, 10 µm for the nickel conductive layer). Inkjet printing or other printing provide a much easier method to fabricate thin film batteries.

Figure 72:
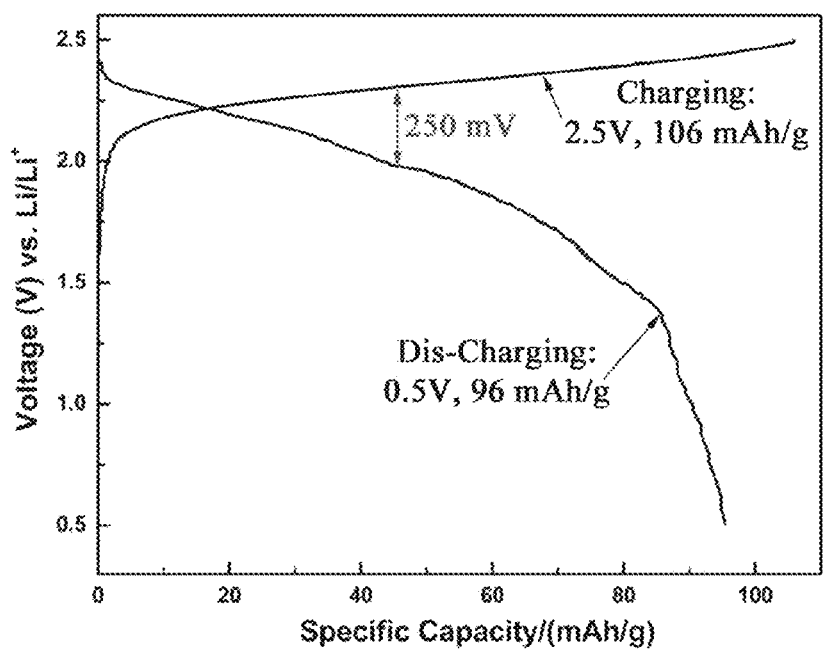
FIG. 72 illustrates first charge/discharge curves of flexible battery tested at 0.1 C current rates between 0.5-2.5 V at 25° C.

FIG. 72 shows first cycling of the flexible batteries. The first charge and discharge capacity of the battery is 106 mAh/g and 96 mAh/g. The capacity is calculated by the cathode. The theoretical specific capacity of the NMC-LTO battery is around 160-170 mAh/g. The relative low capacity of the flexible battery is caused by unequal capacity between the cathode and anode. Usually full cells should have extra anode material to hold the lithium ions from the cathode material. The cut off voltage is set at 0.5-2.5 V, no shown disturbance during charging and discharging curve means the good stability of nickel current collector inside the batteries. The polarization voltage between charging and discharging curve is around 250 mV which is very close to the traditional batteries. This indicates that low conductivity of printed nickel current collector does not have significant influence on the battery performance.

In summary, water based battery inks (cathode and anode) are synthesized, the inks are stable at room temperature and very suitable for inkjet printing and other printing methods. Water is used to replace chemically toxic organic solvent. The ink fabrication process and inkjet have no effect on the composition and performance of the active materials. Conventional batteries with traditional aluminum and copper current collectors are made by inkjet printing. The battery work very well with good mechanical flexibility.

In order to make full printable lithium-ion batteries, two kinds of printed conductive films (silver and nickel) are synthesized and compared as current collector for printed batteries. Nickel shows more stable performance inside the battery during charging and discharging than silver. The silver current collector fails at 0.8 V which are caused by anodic dissolution (cathode part) and formation of silver-lithium alloy (anode part). This example and experiment indicates silver is not suitable for the fabrication of printable lithium-ion batteries. While nickel has outstanding chemical and physical stability during battery fabrication and battery charging and discharging, it has good corrosion resistance to the battery inks and stability at high potential. The stability of nickel is contributed by the passivate nickel oxidation layer which is very similar to the aluminum. Moreover, on nickel and lithium cannot form alloy during charging and discharging. The printed nickel has higher conductivity than the widely used carbon materials and does not affect the battery polarization very much. This example and experiment indicates inkjet printing is a good method to deposit material and fabricate thin film as electrodes for lithium-ion batteries.

The biggest challenge of inkjet printing or digital printing is nozzle clogging which severely affects the final printing resolution and printing cost (cartridge and nozzle consumption). Water based particle free silver ink is a perfect solution to this problem. The resolution of printed conductive silver film is 40 µm which is the limitation of the DMP 2800 inkjet printer. Polymer and organic reductant are used to modify the properties of the silver ink which can uniform and smaller the silver particles which benefits to thermal sintering and conductivity. The conductivity of printed silver is about 50% of the bulk.

Constantan nano particles ink is formulated by the novel Chemical Reducing Sintering (CRS process) disclosed herein etches the oxidation layer and pre-join the constantan nano particles before thermal sintering. The plastic flow or solid diffusion can be triggered through the "bridge" among constantan nano particles which achieve sintering at relative low temperature.

This is the first time constantan film is made by inkjet printing. The CRS process is then modified to make copper and nickel nano inks. The conductivity printed copper and nickel is 1.3% and 1.4% of the copper and nickel bulk. The flexible lithium-ion battery is made by inkjet printing as previously described in this section. Nickel ink is used to fabricate the current collectors inside the battery to replace the carbon or gold current collectors. The printed battery shows a good charge and discharge capacity and stability. Replacement of the polymer separator using printable ceramics ink ($Al_2O_3$) may achieve 100% printable lithium-ion batteries. Other alternatives exist using $Al_2O_3$ paste used as a separator for Li-ion batteries, however, the paste in those cases are brush painted on instead of printing that is available by the current invention.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

What is claimed is:

1. A method of making printable conductive pattern, comprising:
   dispersing flail metallic particles in deionized (DI) water to form a suspension;
   adding an ammonium chloride $NH_4Cl$ solution into the suspension to etch oxidation layers;
   adding a reductant to the suspension after oxidation etching and forming a nanoparticle ink;
   printing a conductive pattern with the ink by printing on a flexible substrate to form a printed substrate;
   drying and sintering the printed substrate without the aid of a forming gas or flammable reducing gas.

2. The method of claim 1, wherein the printable conductive pattern is a current collector for a flexible lithium ion battery and the metallic particles are selected from the group consisting of nickel containing powder, costantan, copper containing powder, silver powder and any combination thereof.

3. The method of claim 1, further including adding poly(vinyl pyrrolidone)(PVP) to the suspension wherein the nickel powder, PVP and DI water are mixed with the weight ratio: 7:1:13.

4. The method of claim 3, wherein the step of adding the reductant includes adding nickel chloride ($NiCl_2.6H_2O$) into the suspension by 5 wt. % of nickel powder.

5. The method of claim 4 further including adding thiourea dioxide at about 0.3 mol/L).

6. The method of claim 5 further including adjusting pH value to about 13 by adding potassium hydroxide; and stirring the ink for about 30 min.

7. The method of claim 1, wherein the $NH_4Cl$ is added into the suspension by weight ratio: $NH_4Cl$:a nickel powder equal to 0.1:1.

8. The method of claim 1, wherein the substrate is a polyimide film, or a poly(4,4'-oxydiphenylene-pyromellitimide).

9. The method of claim 1 further includes printing on a collector from the nanoparticle ink by flexo printing or an inkjet printer on the substrate, and the nanoparticle inks are selected from a group consisting of printable nickel, copper and constantan inks, printable particle free silver ink, and any combination thereof.

10. The method of claim 9, wherein the collector is a conductive nickel current collector that is first dried in a vacuum at about 100° C. and then vacuum sintered at about 350° C. for 1 hour in a tube furnace and cooled to room temperature.

11. The method of claim 9 wherein the collector is a conductive silver current collector that is sintered at about 150° C. for 1 h in air.

12. The method of claim 9, further including:
   fabricating a structure of multi-layers electrodes for lithium ion batteries on the collector, wherein said collector is a silver or a nickel containing current collector or both;
   forming an active material paste by mixing 84 wt % active materials, 6 wt % super-P and 10 wt % PVP binder to form a homogeneous slurry;
   coating the slurry on a conductive film made by the collector and drying the slurry for about 12 hours in a vacuum oven at about 100° C.
   using lithium hexaflurophosphate ($LiPF_6$) (1 M) in a 1:1(v/v) mixture of dimethyl carbonate (DMC) and ethylene carbonate (EC) as an electrolyte.

* * * * *